United States Patent
Inaba

(10) Patent No.: US 7,522,445 B2
(45) Date of Patent: Apr. 21, 2009

(54) SEMICONDUCTOR MEMORY

(75) Inventor: Satoshi Inaba, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 16 days.

(21) Appl. No.: 11/657,130

(22) Filed: Jan. 24, 2007

(65) Prior Publication Data
US 2007/0189060 A1 Aug. 16, 2007

(30) Foreign Application Priority Data
Jan. 25, 2006 (JP) .............................. 2006-016882

(51) Int. Cl.
G11C 11/00 (2006.01)
(52) U.S. Cl. .................... 365/154; 365/189.05; 365/104
(58) Field of Classification Search .................. 365/154, 365/104, 189.05
See application file for complete search history.

(56) References Cited

U.S. PATENT DOCUMENTS

| 6,525,403 | B2 | 2/2003 | Inaba et al. |
| 6,919,601 | B2 | 7/2005 | Inaba |
| 7,112,858 | B2 | 9/2006 | Inaba et al. |
| 7,301,838 | B2 * | 11/2007 | Waller et al. .................. 365/205 |
| 2006/0027870 | A1 | 2/2006 | Inaba |
| 2006/0073647 | A1 | 4/2006 | Inaba |
| 2006/0227595 | A1 * | 10/2006 | Chuang et al. ............... 365/154 |
| 2006/0267112 | A1 | 11/2006 | Inaba et al. |
| 2006/0274569 | A1 * | 12/2006 | Joshi et al. .................. 365/154 |

FOREIGN PATENT DOCUMENTS

JP  2-263473 A  10/1990

OTHER PUBLICATIONS

E.J. Nowak et al., "A Functional FinFET-DGCMOS SRAM Cell," IEDM Tech. Dig., pp. 411-414, Dec. 2002.
Y.X. Liu et al., "Flexible Threshold Voltage FinFETs with Independent Double Gates and an Ideal Rectangular Cross-Section Si-Fin Channel," IEDM Tech. Dig., pp. 986-988, Dec. 2003.
Y.K. Choi et al., "Sub-20nm CMOS FinFET Technologies," IEDM Tech. Dig., pp. 421-424, Dec. 2001.

* cited by examiner

Primary Examiner—Thong Q Le
(74) Attorney, Agent, or Firm—Foley & Lardner LLP

(57) ABSTRACT

A semiconductor memory having a plurality of static random access memory cells, word lines, first and second bit lines orthogonal to the word lines, and threshold voltage control lines parallel to the word lines and each of the static random access memory cell includes the first and the second driver transistors, the first and the second load transistors, and the first and the second transfer transistors configured by Fin field effect transistors, and at least one of the Fin field effect transistors is configured by a separated-gate type double-gate field effect transistor comprising a first gate electrode and a second gate electrode and controlling a voltage for the first gate electrode to form a channel, and controlling a voltage for the second gate electrode to decrease a threshold voltage at the time of writing data.

17 Claims, 40 Drawing Sheets

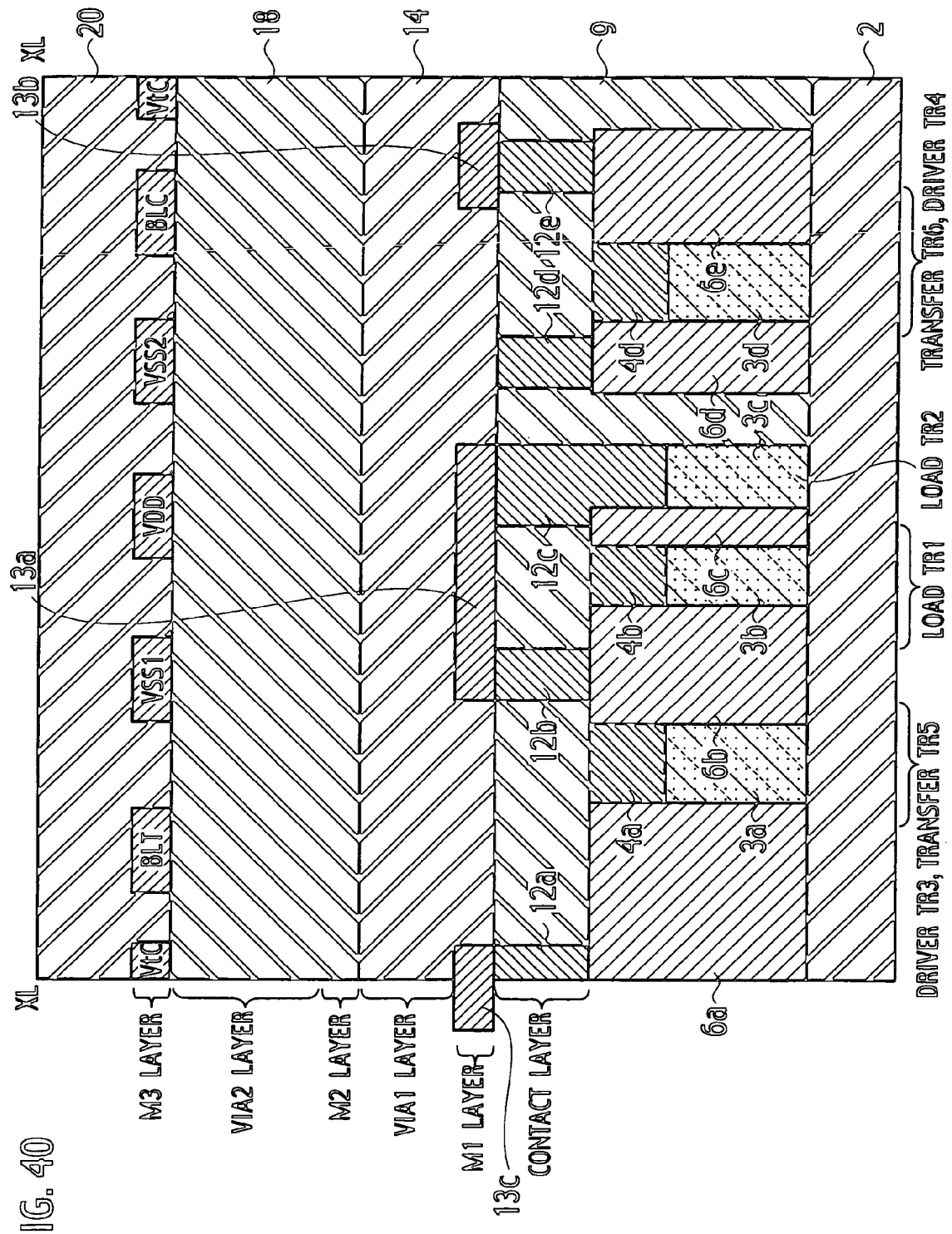

SEMICONDUCTOR MEMORY

CROSS REFERENCE TO RELATED APPLICATIONS AND INCORPORATION BY REFERENCE

This application is based upon and claims the benefit of priority from prior Japanese Patent Application P2006-016882 filed on Jan. 25, 2006; the entire contents of which are incorporated by reference herein.

BACKGROUND OF THE INVENTION

1. Field of the Invention

The present invention relates to a semiconductor memory. In particular, it relates to the semiconductor memory having a plurality of Static Random Access Memory (SRAM) cells configured by Fin Field Effect Transistors (Fin FETs).

2. Description of the Related Art

Recently, as for the semiconductor device such as LSI, high performance has been achieved by the miniaturization of the used device. In the scaling of the device, the gate length is reduced on the basis of a so-called scaling law, and the gate insulator is made thin film, in a Metal-Oxide Semiconductor Field-Effect Transistor (MOSFET) used for a logic circuit in a semiconductor device and a memory unit of Static Random Access Memory (SRAM) etc.

And then, a Fin FET that is Fully Depleted MOSFET of double-gate type is proposed in order to improve the cutoff characteristic that decreases by the short-channel effect occurred by the transistor whose gate length L is less than 30 nm (e.g., see Japanese patent Laid Open Publication No. H02-263473).

The Fin FET is a kind of three dimensional MIS type semiconductor device, and the channel can be formed to the side view of the fin on two surfaces by forming projection fin (Fin) that thinly excises silicon (Si) layer like the strip of paper, and making this fin overpass by the gate electrode. As for this Fin FET, the channel region of the fin FET is completely made depleted. Therefore, when a general-purpose Poly-Silicon layer was used for the gate electrode, it was difficult to set the threshold voltage to the low threshold voltage (for example, 0.2V or less in the absolute value) in which it aimed at the high current drive.

When it tries to configure the circuit of Static Random Access Memory Cell (SRAM Cell) by using such the Fin FET, the threshold voltage of the Fin FET cannot be properly controlled and the channel width cannot be set arbitrarily. Therefore, there was a problem with a difficult setting of the current transfer ratio of each Fin FET to a proper value. As a result, since it was difficult for the SRAM Cell to obtain enough a Static Noise Margin (SNM), the operational biasing point might be unstable, and it might be weak also to soft-error, etc., (e.g., see, E. J. Nowak, et al., "A Functional Fin FET-DGCMOS SRAM Cell", International Electron Devices Meeting (IEDM), Tech. Dig., IEEE, 2002, p. 411-414).

Moreover, the control of the potential of the channel region is performed in order to obtain the low threshold voltage in which it aims at the high current drive by the Fin FET (e.g., see, Y. X. Liu, et al, "Flexible Threshold Voltage Fin FETs with Independent Double-gates and an Ideal Rectangular Cross-Section Si-Fin Channel", International Electron Devices Meeting (IEDM), Tech. Dig., IEEE, 2003, p. 986-989).

The Fin FET in the above paper is called as a back-gate type MOSFET. Since the additional electrode layer for the control of the potential of the channel region was newly needed, the SRAM cell with the layout that embedded the back-gate type Fin FET was not created.

SUMMARY OF THE INVENTION

An aspect of the present invention inheres in a semiconductor memory having a plurality of static random access memory cells, a plurality of word lines, and a plurality of first and second bit lines substantially orthogonal to the word lines. Each of the static random access memory cell includes a first inverter having a first driver transistor and a first load transistor connected in series between a power supply voltage line and a ground line; a second inverter having a second driver transistor and a second load transistor connected in series between the power supply voltage line and a ground line; a first transfer transistor connected in series between a first bit line and an output of the first inverter; and a second transfer transistor connected in series between a second bit line and an output of the second inverter, the output of the first inverter being connected to an input of the second inverter and an input of the first inverter being connected to the output of the second inverter. At least one of the first and the second driver transistors, the first and the second load transistors, and the first and the second transfer transistors is configured by a plurality of Fin field effect transistor, and the Fin field effect transistor is configured by a separated-gate type double-gate field effect transistor comprising a first gate electrode and a second gate electrode, controlling a voltage for the first gate electrode to form a channel, and controlling a voltage for the second gate electrode to decrease a threshold voltage at the time of writing data.

Another aspect of the present invention inheres in a semiconductor memory having a plurality of static random access memory cells, a plurality of word lines, and a plurality of first and second bit lines substantially orthogonal to the word lines. Each of the static random access memory cell includes a first inverter having a first driver transistor and a first load transistor connected in series between a power supply voltage line and a ground line; a second inverter having a second driver transistor and a second load transistor connected in series between the power supply voltage line and a ground line; a first transfer transistor connected in series between a first bit line and an output of the first inverter; and a second transfer transistor connected in series between a second bit line and an output of the second inverter, the output of the first inverter being connected to an input of the second inverter and an input of the first inverter being connected to the output of the second inverter. The first and the second driver transistors, the first and the second load transistors, and the first and the second transfer transistors are configured by a plurality of Fin field effect transistors, and both the first transfer transistor and the second transfer transistor are configured by a separated-gate type double-gate field effect transistor comprising a first gate electrode and a second gate electrode, controlling a voltage for the first gate electrode to form a channel, and controlling a voltage for the second gate electrode to decrease a threshold voltage at the time of writing data.

Another aspect of the present invention inheres in a semiconductor memory having a plurality of static random access memory cells, a plurality of word lines, and a plurality of first and second bit lines substantially orthogonal to the word lines. Each of the static random access memory cell includes a first inverter having a first driver transistor and a first load transistor connected in series between a power supply voltage line and a ground line; a second inverter having a second driver transistor and a second load transistor connected in series between the power supply voltage line and a ground line; a first transfer transistor connected in series between a first bit line and an output of the first inverter; and a second transfer transistor connected in series between a second bit line and an output of the second inverter, the output of the first inverter being connected to an input of the second inverter and an input of the first inverter being connected to the output of the second inverter. The first and the second driver transistors, the first and the second load transistors, and the first and the second transfer transistors are configured by a plurality of Fin field effect transistors, and both the first driver transistor and the second driver transistor are configured by a separated-gate type double-gate field effect transistor comprising a first gate electrode and a second gate electrode, controlling a voltage for the first gate electrode to form a channel, and controlling a voltage for the second gate electrode to decrease a threshold voltage at the time of writing data.

BRIEF DESCRIPTION OF THE DRAWINGS

FIG. 40 is a cross-sectional view taken in the line XL-XL of FIG. 39.

DETAILED DESCRIPTION OF THE INVENTION

Referencing the drawings, the first to the third embodiment according to the present invention are explained forthwith. The same or similar symbols are applied to the same or similar parts throughout the appended drawings. However, it should be noted that the drawings are merely schematics and that the relationship between thickness and planar dimension, and the ratio of respective layer thicknesses and the like differ from those of the actual invention. Accordingly, specific thicknesses and dimensions should be determined while considering the following description. Furthermore, needless to say that parts with differing dimensions and/or differing ratios among the drawings may be included.

In addition, the first to the third embodiments given forthwith illustrate devices and methods for embodying the technical idea of the present invention, and that technical idea of the present invention is not limited to the following materials, shapes, structures, arrangements or the like. The technical idea of the present invention may be modified into various modifications within the scope of the appended claims.

According to the semiconductor memory of the embodiments of the present invention, the semiconductor memory including the SRAM Cell having a performance of enough amount of SNM can be obtained, while the back-gate type Fin FETs are used for the transistors providing with the SRAM Cell.

First Embodiment

Figure 1:
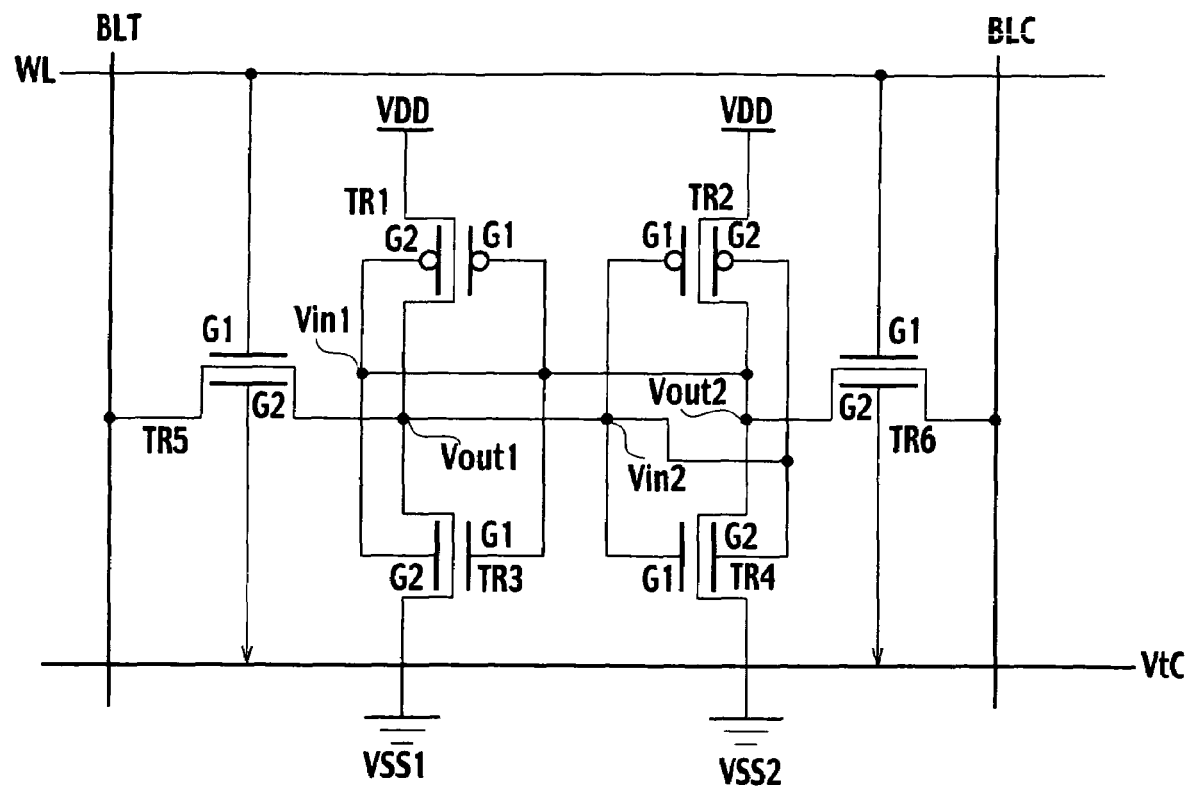
FIG. 1 is a circuit diagram showing a semiconductor memory according to a first embodiment of the present invention.

A semiconductor memory according to the first embodiment of the present invention includes a static random access memory (SRAM) Cell as shown in FIG. 1. The SRAM Cell includes six transistors TR1 to TR6.

The transfer transistor TR5 is connected with a bit line BLT, is an n-channel FET, and is called 'transfer transistor' or 'path-gate transistor'.

Moreover, the transfer transistor TR5 is a double-gate FET configured by a Fin FET, and has a gate electrode G1 in one side of the sidewall surface that the Fin opposes and a gate electrode G2 in the other sidewall surface. In addition, two gate electrodes G1 and G2 are described to show that the transistors TR1 to TR6 including the transfer transistor TR5 are the double-gate FETs, as shown in FIG. 1.

The transfer transistor TR5 is separated-gate type FET, the gate electrode G1 is connected with a word line WL, and the gate electrode G2 is connected with a threshold voltage control line VtC. The drain of the transfer transistor TR5 is connected with the bit line BLT, and the source of the transfer transistor TR5 is connected with a node Vout1.

The transfer transistor TR6 is configured by a n-channel FET, the drain of which is connected with a bit line BLC, and called 'transfer transistor' or 'path-gate transistor'. Moreover, the transfer transistor TR6 is a double-gate FET configured by a Fin FET, and has a gate electrode G1 in one side of the sidewall surface that the Fin opposes and a gate electrode G2 in the other sidewall surface.

The transfer transistor TR6 is configured by separated-gate type FET, the gate electrode G1 is connected with a word line WL, and the gate electrode G2 is connected with a threshold voltage control line VtC. The drain of the transfer transistor TR6 is connected with the bit line BLC, and the source of the transfer transistor TR5 is connected with a node Vout2.

The driver transistor TR3 is configured by a n-channel FET, and called 'driver transistor' or 'pull-down transistor'. Moreover, the driver transistor TR3 is a double-gate FET configured by a Fin FET, and has a gate electrode G1 in one side of the sidewall surface that the Fin opposes and a gate electrode G2 in the other sidewall surface. The gate electrode G1 and the gate electrode G2 of the driver transistor TR3 are connected mutually and together, and two gate electrodes G1 and G2 of the driver transistor TR3 are connected with a node Vin1. The drain of the driver transistor TR3 is connected with the node Vout1, and the source of the driver transistor TR3 is connected with a ground line VSS1 at the ground level.

The driver transistor TR4 is configured by n-channel FET, and called driver transistor or pull-down transistor. Moreover, the driver transistor TR4 is double-gate FET configured by Fin FET, and has a gate electrode G1 in one side of the side surface that the Fin opposes and a gate electrode G2 in the other side surface.

The gate electrode G1 and the gate electrode G2 of the driver transistor TR4 are connected mutually and together, and two gate electrodes G1 and G2 of the driver transistor TR4 are connected with a node Vin2. The drain of the driver transistor TR4 is connected with the node Vout2, and the source of the driver transistor TR4 is connected with a ground line VSS2 at the ground level.

The load transistor TR1 is configured by p-channel FET, and called load transistor or pull-up transistor.

Moreover, the load transistor TR1 is double-gate FET configured by Fin FET, and has a gate electrode G1 in one side of the side surface that the Fin opposes and a gate electrode G2 in the other side surface. The gate electrode G1 and the gate electrode G2 of the load transistor TR1 are connected mutually and together, and two gate electrodes G1 and G2 of the load transistor TR1 are connected with the node Vin1. The drain of the load transistor TR1 is connected with a power supply voltage VDD, and the source of the load transistor TR1 is connected with the node Vout1.

The load transistor TR2 is configured by p-channel FET, and called load transistor or pull-up transistor.

Moreover, the load transistor TR2 is double-gate FET configured by Fin FET, and has a gate electrode G1 in one side of the side surface that the Fin opposes and a gate electrode G2 in the other side surface.

The Gate electrode G1 and the gate electrode G2 of the load transistor TR2 are connected mutually and together, and two gate electrodes G1 and G2 of the load transistor TR2 are connected with the node Vin2. The drain of the load transistor TR2 is connected with a power supply voltage VDD, and the source of the load transistor TR1 is connected with the node Vout2.

The stability of the SRAM Cell is determined by the beta ratio of the current drive of a driver transistor to the current drive of a transfer transistor. The stability factor of the SRAM Cell can be increased by increasing the value of the beta ratio to determine the value of the current drive of the driver transistor being in large or more than the value of the current drive of the transfer transistor. In order to determine the value of beta ratio of the current drive in large and to improve the stability of the SRAM Cell, the channel width of the driver transistor can be performed by setting in large and controlling the value of the threshold voltage Vt at a proper value, in the case of the FETs other than the Fin FETs.

However, in the six transistors/cell type SRAM Cell as shown in FIG. 1, the difficulty occurs to improve the stability of the SRAM Cell by trying to configure each transistor by the Fin FET as mentioned below.

(1) It is difficult to adjust the value of the current drive of the n-channel Fin FETs which configure the driver transistor TR3 and TR4 and the transfer transistors TR5 and TR6 by adjusting the value of the channel width, while the value of the current drive of the conventional n-channel FETs can be adjusted by optimizing the channel width of the FETS.

The channel width of the Fin FETs is determined by the height of the silicon projection or protrusion that is called Fin. Therefore, it is substantially difficult to change the height of the Fin with each of the Fin FETs. If it tries to change the height of the Fin with each of the Fin FETs, it is necessary to perform processing of lithography and Reactive Ion Etching (RIE), etc, by different processing steps in each of the Fin FETs. Therefore, it is considered that the efficiency of the fabrication processing is very bad.

(2) A method for adjusting the value of the gate length of each of the Fin FETs can be considered in order to adjust the value of the current drive in each of the Fin FETs. However, it is difficult to obtain the enough value of beta ratio of the current drive for the method of adjusting the value of the gate length of each of the Fin FETs. Moreover, since there is a plurality of Fin FETs with different gate length in the SRAM Cell, the Critical Dimension (CD) control of the lithography processing becomes difficult. Moreover, since the size of the fine line pattern that exceeds the limitation of the lithography by light etc, is formed, if the gate length of the Fin FETs in the SRAM Cell is not a single gate length, it is difficult for performing the sidewall transfer process for the gate electrode G1 and G2 of the Fin FETs.

(3) Furthermore, in the Fin FETs, even if the metal gate electrode made of the conductor with a work function near the mid gap energy level of the Fin semiconductor can be used, the span of adjustable range of the threshold voltage of the Fin FETs is a comparatively small. Therefore, it is difficult to obtain a high level of the threshold voltage Vt, for instance, +0.3V or more enough necessary for cut-off of the conducting current of the Fin FETs.

Therefore, it proposes using the back-gate type, so-called the separated-gate type Fin FETs, as show in FIG. 1, as a method for configuring the SRAM Cell by using the Fin FETs in the first embodiment.

In FIG. 1, the threshold voltage control line (Vt Control line) VtC is connected with the gate electrodes G2 that are the back-gate of the transfer transistors TR5 and TR6, respectively. The threshold voltage control line VtC controls the value of the threshold voltage of the transfer transistors TR5 and TR6 by applying the value of negative voltage on the gate electrodes G2 comparing to the value of the ground power supply voltages VSS1 and VSS2.

According to such the threshold voltage control, the transfer transistors TR5 and TR6 are designed to have the value of low threshold voltage in order to achieve the large amount of current conducting through the transfer transistors TR5 and TR6, at the time of writing/reading mode when the applied voltage for the word line WL is at the high level.

On the other hand, the transfer transistors TR5 and TR6 can be designed to have the value of comparatively high threshold voltage in order to reduce the amount of leakage current conducting through the transfer transistors TR5 and TR6, at the time of except writing/reading mode when the applied voltage for the word wine WL becomes at low level and data D is stored at the memory cell.

The semiconductor memory according to the first embodiment includes the SRAM Cell, and the SRAM Cell is configured by a plurality of Fin FETs (TR1 through TR6). Each at least one of the Fin FETs (TR5 and/or TR6) includes the first gate electrode G1 and the second gate electrode G2, respectively. The applied voltage for the first gate electrode G1 of the Fin FET (TR5 and/or TR6) is controlled, and then the channel is formed in the Fin FET (TR5 and/or TR6). The applied voltage for the second gate electrode G2 of the Fin FET (TR5 and/or TR6) is controlled, and then the applied voltage for the channel is controlled in the Fin FET (TR5 and/or TR6). As a result, the value of threshold voltage of the Fin FET (TR5 and/or TR6) can be reduced at the time of writing data mode.

Therefore, the transfer transistors TR5 and TR6 are configured by the double-gate Fin FETs having the separated-gate type structure. Different voltages are applied to the first gate electrode G1 and the second gate electrode G2, respectively, in the transfer transistors TR5 and TR6. The operational mode of the double-gate type transistor and the operational mode of the back-gate type transistor can be achieved by applying the different voltage to the first gate electrode G1 and the second gate electrode G2 in the transfer transistors TR5 and TR6.

And then, it is possible to obtain the Fin FETs (TR5 and TR6) with the proper threshold voltage and also it is possible to adjust the current drive of the Fin FETs, by configuring the SRAM Cell using the back-gate type Fin MOSFETs (TR5 and TR6) having the separated-gate structure.

The first channel region is formed with the first gate electrode G1 of the transfer transistors TR5 and TR6, on the other hand, the applied voltage of the first channel region can be controlled by the voltage applied at the second gate electrode G2 of the transfer transistors TR5 and TR6. The second channel region is formed with the second gate electrode G2 of the transfer transistors TR5 and TR6. The current drive of the transfer transistors TR5 and TR6 can be increased with configuring the second channel region in addition to the first channel region. The cut-off characteristic of the transfer transistors TR5 and TR6 can be also improved with configuring the second channel region in addition to the first channel region. It is also possible to improve the SNM by reducing the value of the threshold voltage at the time of writing mode and by increasing the value of the threshold voltage during at the time of data storing mode, by using the back-gate type Fin MOSFETs (TR5 and TR6) in the SRAM Cell.

Thus, the beta ratio of the current drive of the driver transistor to the current drive of the transfer transistor can be changed by the series of time variation.

Figure 2:
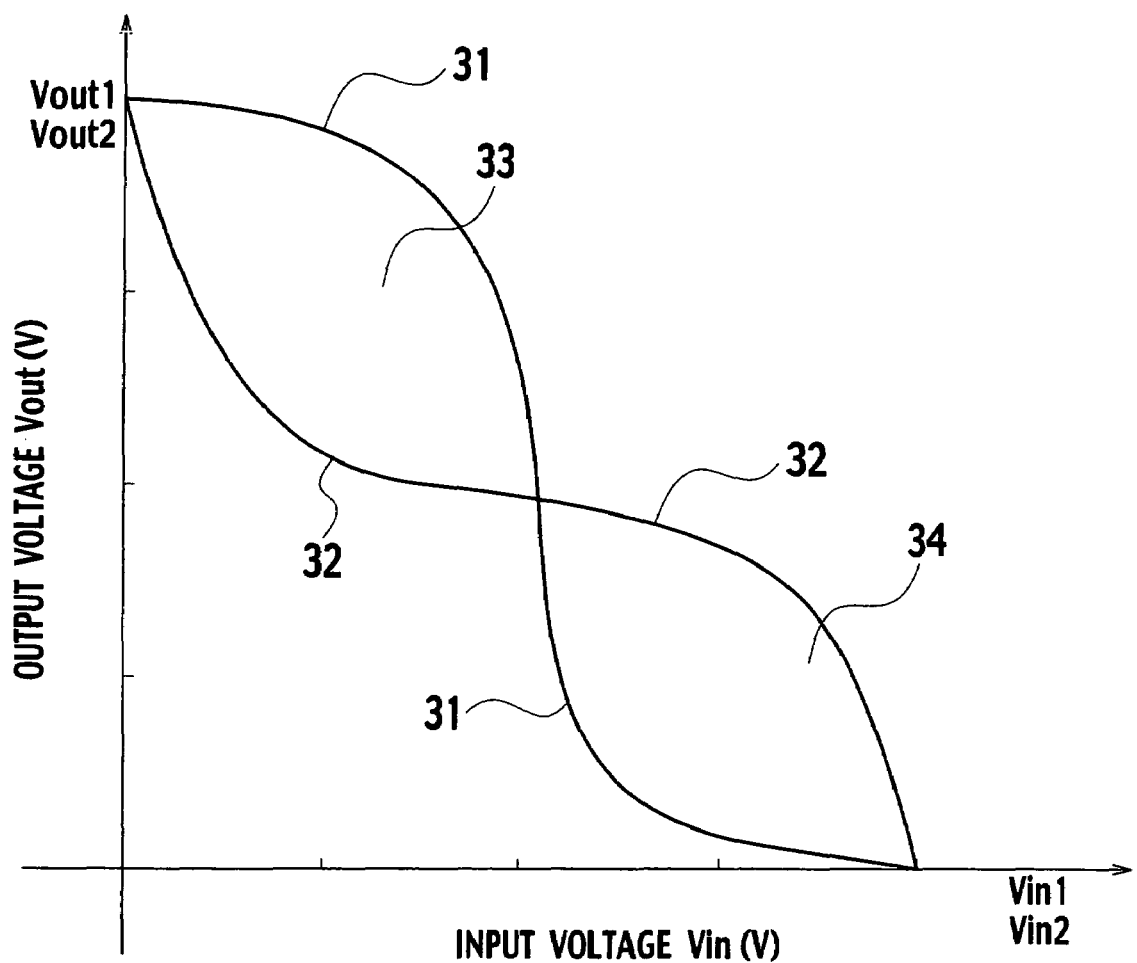
FIG. 2 is an input-output characteristic of an inverter of the semiconductor memory according to the first embodiment of the present invention.

As a result, the SNM can be increased as shown in FIG. 2. That is, if the electrical current is conducting with the transfer transistor TR6, the input voltage Vin1 rises steep like being high output voltage Vout1 in input-output characteristics 31 of the input voltage Vin1 and the output voltage Vout1 of the first inverter that configures a flip-flop F/F of the SRAM Cell. Therefore, since it becomes direction where the curve 31 in the upper part of loop 33 of upper left of the butterfly curve obtains more margins, the SNM can be increased.

If the electrical current is conducting with the transfer transistor TR5, the input-output characteristics 32 of the input voltage Vin2 and the output voltage Vout2 of the second inverter that configures the flip-flop F/F of the SRAM Cell becomes the horizontal steep. Therefore, the SNM can be increased since it becomes direction where the curve 32 in the upper part of loop 34 of lower right of the butterfly curve obtains more margins.

Figure 3:
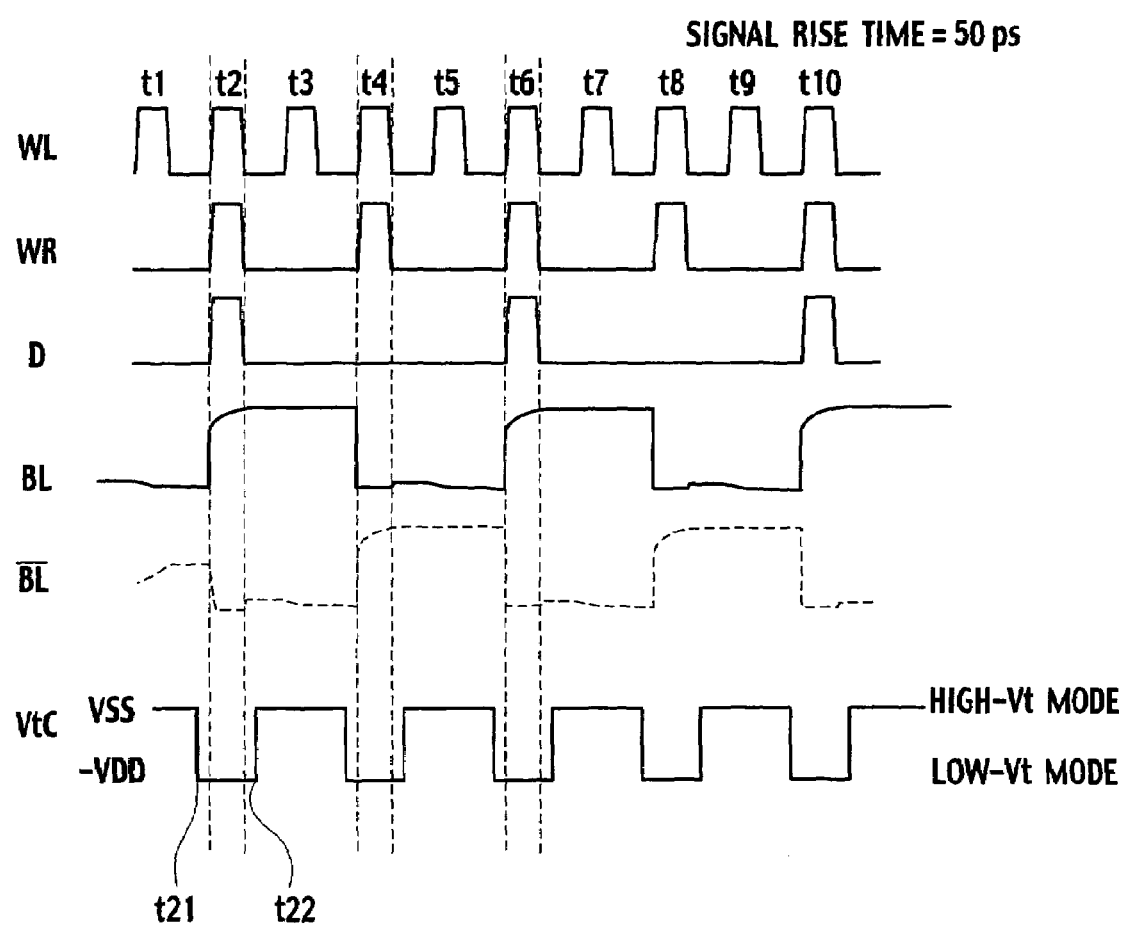
FIG. 3 is a timing chart of a signal line of the semiconductor memory according to the first embodiment of the present invention.

As shown in FIG. 3, the signal voltage applied to the threshold voltage control line VtC changes synchronizing with the write enable signal WR of the SRAM Cell. The second gate electrodes G2 of the transfer transistors TR5 and TR6 are connected with the threshold voltage control line VtC. Therefore, the applied voltage for the second gate electrodes G2 of the transfer transistors TR5 and TR6 change synchronizing with the write enable signal WR of the SRAM Cell, and the value of the threshold voltage of transfer transistors TR5 and TR6 becomes lower synchronizing with the write enable signal WR.

The device characteristic of the transfer transistors TR5 and TR6 can be changed by changing the applied signal voltage to threshold voltage control line VtC synchronizing with the write enable signal WR.

The signal voltage applied to the threshold voltage control line VtC precedes the timing of writing/reading mode of the memory cell and is applied at the time t21, and the threshold voltage Vt of the transfer transistors TR5 and TR6 is set at the time t21 earlier than the writing/reading time.

More specifically, as shown in FIG. 3, the signal voltage of the threshold voltage control line VtC is input with the margin and rises and falls at the time t21 before the time when write enable signal WR is turned on, and the transfer transistors TR5 and TR6 of the low threshold voltage are turned on in the low-threshold (low-Vt) mode and the data D is written in the SRAM Cell.

The signal voltage of the threshold voltage control line VtC is designed to begin the rise with the margin at the time t22 after the start time of turning-off when the write enable signal WR is turned off. When the signal voltage of the threshold voltage control line VtC rises, the high-threshold (high-Vt) mode is set to the SRAM Cell, and the transfer transistors TR5 and TR6 having a high threshold voltage are turned off and the written data D is stored in the SRAM Cell.

In addition, if the time t22 when the signal voltage of the threshold voltage control line VtC rises is delayed to a large extent from the timing when the write enable signal WR is turned off, the transfer transistors TR5 and TR6 are set to have a low threshold voltage even when the transfer transistors TR5 and TR6 should be turned off. Therefore, it is preferable that the signal voltage of the threshold voltage control line VtC rises as early as possible from the timing when the write enable signal WR is turned off. On the other hand, threshold voltage Vt can be set to a low value when the signal voltage of the threshold voltage control line VtC should rise earlier than the timing of falling of the write enable signal WR at the time of the rise of the signal voltage of the threshold voltage control line VtC.

In the timing of the rise of the signal voltage of the threshold voltage control line VtC, the trade-off like the above-mentioned exists. Therefore, the timing of the rise of the signal voltage of the threshold voltage control line VtC can be set to optimal timing.

As mentioned above, the applied voltage for the second gate electrodes G2 of the transfer transistors TR5 and TR6 that synchronize with the write enable signal WR changes at a time earlier than a time of the rise of the write enable signal WR. At the time, the transfer transistors TR5 and TR6 operate in low threshold (low-Vt) mode. And also, the transfer transistors TR5 and TR6 are in the low threshold (low-Vt) mode while having changed until a time later than a time of the falling of the write enable signal WR.

The signal voltage of the threshold voltage control line VtC rises later than the falling of the write enable signal WR. As a result, the threshold voltage Vt is held in the low state value, and the cut-off characteristic of the transfer transistors TR5 and TR6 can be improved after time passes to some degree.

Figure 4:
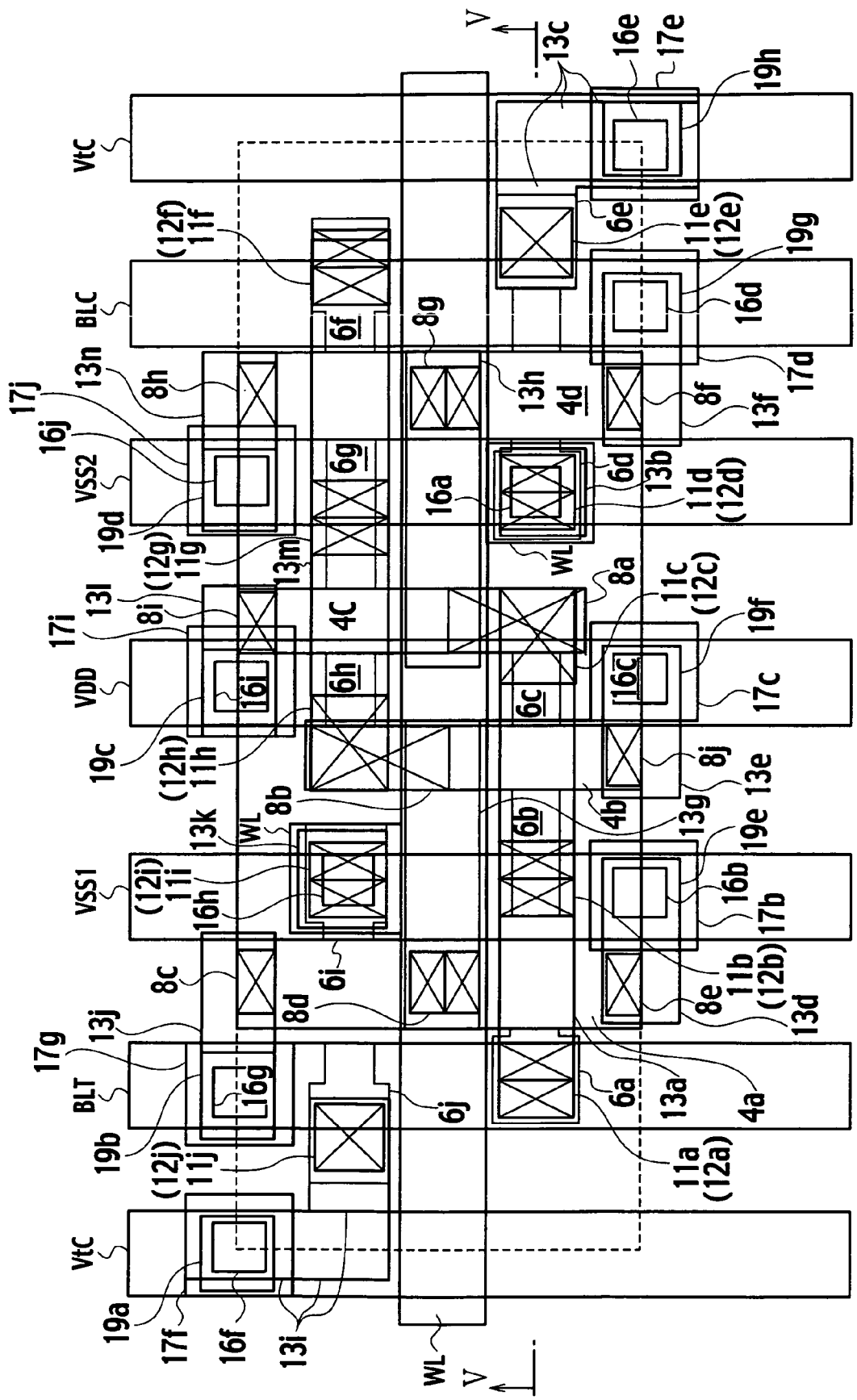
FIG. 4 is a plan view of the semiconductor memory according to the first embodiment of the present invention.
Figure 5:
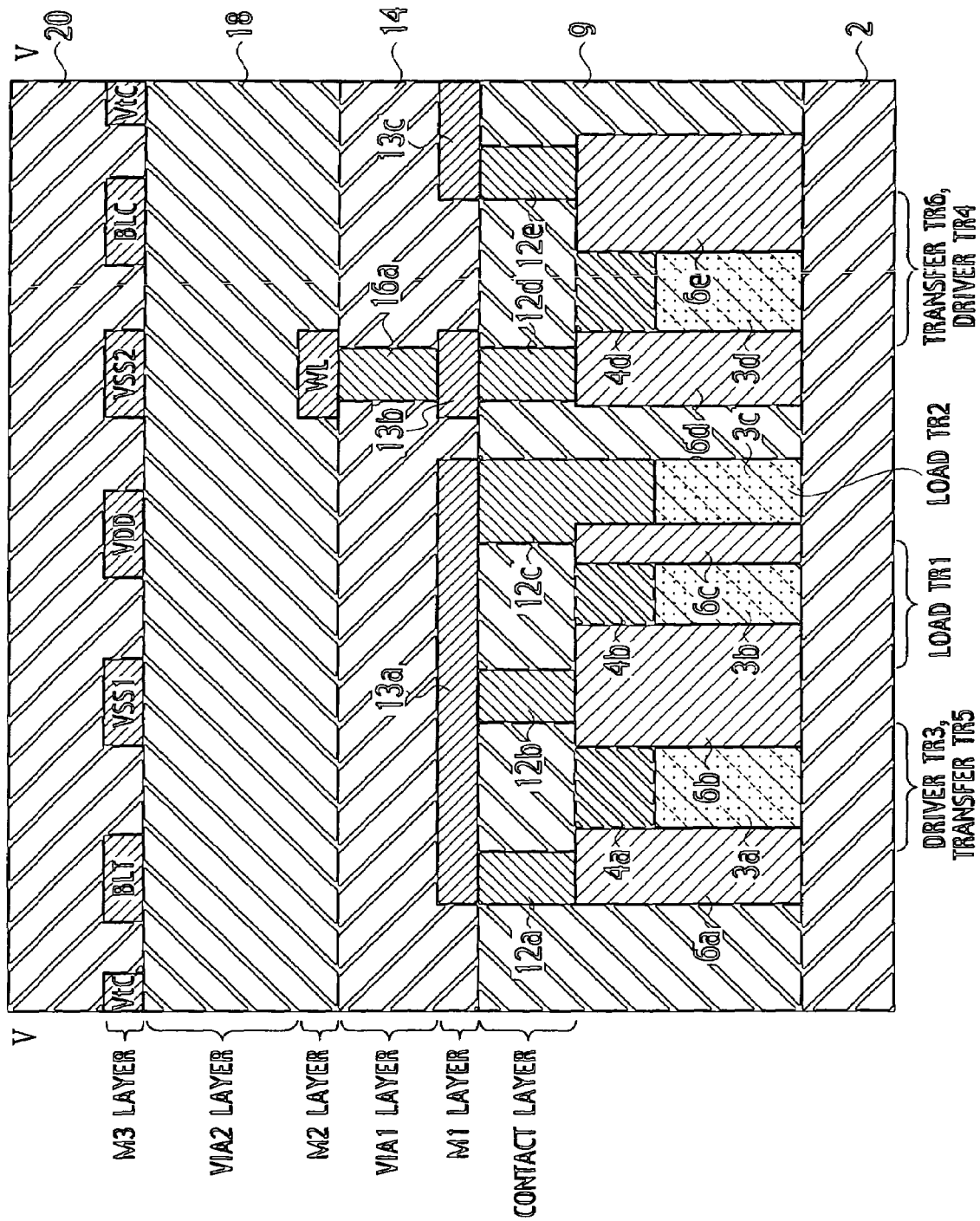
FIG. 5 is a cross-sectional view taken in the line V-V of FIG. 4.

As shown in FIG. 4 and FIG. 5, in the semiconductor memory according to the first embodiment, silicon (Si) Fins 3a to 3d are provided on a silicon oxide layer 2. The silicon Fin 3a is used for the active area of the driver transistor TR3 and the active area of the transfer transistor TR5. The silicon Fin 3b is used for the active area of the load transistor TR1. The silicon Fin 3c is used for the active area of the load transistor TR2. The silicon Fin 3d is used for the active area of the driver transistor TR4 and the active area of the transfer transistor TR6.

Cap layers 4a to 4d are provided on the silicon Fins 3a to 3d, respectively.

Gate electrodes 6a to 6j are provided on the silicon oxide layer 2. The silicon Fin 3a and the cap layer 4a have two side surfaces mutually opposed. The gate electrodes 6a and 6j configured by Poly-Silicon (poly-Si) contact to one side surface of the silicon Fin 3a and the cap layer 4a. The gate electrode 6a functions as the gate electrode G2 of the driver transistor TR3 shown in FIG. 1. The gate electrode 6j functions as the gate electrode G2 of the transfer transistor TR5. The gate electrodes 6b and 6i configured by the Poly-Silicon contact to the other side surface of the silicon Fin 3a and the cap layer 4a. The gate electrode 6b functions as the gate electrode G1 of the driver transistor TR3 of FIG. 1 and the gate electrode G1 of the load transistor TR1. The gate electrode 6i functions as the gate electrode G1 of the transfer transistor TR5.

As the above-mentioned, the driver transistor TR3 is configured by the Fin FET of which the Fin is silicon Fin 3a, and is double-gate FET whose gate electrodes are two gate electrodes 6a and 6b. The transfer transistor TR5 is configured by the Fin FET of which the Fin is silicon Fin 3a, and is double-gate FET whose gate electrodes are two gate electrodes 6i and 6j.

The silicon Fin 3b and the cap layer 4b have two side surfaces mutually opposed. The gate electrode 6b is contacted to one side surface of the silicon Fin 3b and the cap layer 4b. The gate electrodes 6c and 6h configured by the Poly-Silicon contact to the other side surface of the silicon Fin 3b and the cap layer 4b. The gate electrode 6c functions as the gate electrode G2 of the load transistor TR1 shown in FIG. 1. The gate electrode 6h functions as the gate electrode G2 of the load transistor TR2. The load transistor TR1 is configured by the Fin FET of which the Fin is silicon Fin 3b, and is double-gate FET whose gate electrodes are two gate electrodes 6b and 6c.

The silicon Fin 3c and the cap layer 4c have two side surfaces mutually opposed. The gate electrodes 6c and 6h configured by the Poly-Silicon contact to one side surface of the silicon Fin 3c and the cap layer 4c. The gate electrode 6g configured by the Poly-Silicon contacts to the other side surface of the silicon Fin 3c and the cap layer 4c. The gate electrode 6g functions as the gate electrode G1 of the load transistor TR2 of FIG. 1 and the gate electrode G1 of the driver transistor TR4. The load transistor TR2 is configured by the Fin FET of which the Fin is silicon Fin 3c, and is double-gate FET whose gate electrodes are two gate electrodes 6g and 6h.

The silicon Fin 3d and the cap layer 4d have two side surfaces mutually opposed. The gate electrodes 6d and 6g is configured by Poly-Silicon contact to one side surface of the silicon Fin 3d and the cap layer 4d. The gate electrode 6d functions as the gate electrode G1 of the transfer transistor TR6 shown in FIG. 1. The gate electrodes 6e and 6f configured by the Poly-Silicon contact to the other side surface of the silicon Fin 3d and the cap layer 4d. The gate electrode 6e functions as the gate electrode G2 of the transfer transistor TR6 shown in FIG. 1. The gate electrode 6f functions as the gate electrode G2 of the driver transistor TR4. The driver transistor TR4 is configured by the Fin FET of which the Fin is silicon Fin 3d, and is double-gate FET whose gate electrodes are two gate electrodes 6f and 6g. The transfer transistor TR6 is configured by the Fin FET of which the Fin is silicon Fin 3d, and is double-gate FET whose gate electrodes are two gate electrodes 6d and 6e.

An interlayer insulator 9 is configured by the silicon oxide film, and provided on the silicon oxide layer 2, the cap layers 4a to 4d and the gate electrodes 6a to 6j. The interlayer insulator 9 contacts to the silicon Fins 3a to 3d, the cap layers 4a to 4d, and the side surfaces of the gate electrodes 6a to 6j. The surface of the interlayer insulator 9 is planarized.

Contact plugs 8a to 8j are provided on each silicon Fin 3a to 3d at each position of the corresponding contact holes 8a to 8j so as to pass through the interlayer insulator 9.

Contact plugs 12a to 12j are provided on each corresponding gate electrode 6a to 6j at each position of the corresponding contact holes 11a to 11j so as to pass through the interlayer insulator 9.

M1 electrode layers 13a to 13n are provided on the interlayer insulator 9, the contact plugs 8a to 8j, and the contact plugs 12a to 12j. The M1 electrode layer 13a connects the gate electrodes 6a to 6c. As a result, the gate electrodes G1 and G2 of the driver transistor TR3 are connected with the gate electrodes G1 and G2 of the load transistor TR1.

The M1 electrode layer 13m connects the gate electrodes 6f to 6h. As a result, the gate electrodes G1 and G2 of the load transistor TR2 are connected with the gate electrodes G1 and G2 of the driver transistor TR4. On the other hand, neither gate electrodes 6i nor 6j are connected by the M1 electrode layers. As a result, the gate electrodes G1 and G2 of the transfer transistor TR5 are not commonly connected, and the transfer transistor TR5 is separated-gate type double-gate FET. Similarly, since neither gate electrodes 6d nor 6e are connected, neither the gate electrodes G1 nor G2 of the transfer transistor TR6 are commonly connected. Therefore, the transfer transistor TR6 is separated-gate type double-gate FET.

An interlayer insulator 14 is configured by the silicon oxide film, and provided on the interlayer insulator 9 and the M1 electrode layers 13a to 13n. The interlayer insulator 14 is contacted to the side surface of the M1 electrode layers 13a to 13n. The surface of the interlayer insulator 14 is planarized.

VIA1 plugs 16a to 16j are provided on each corresponding M1 electrode layer 13a to 13n at each position of the corresponding VIA1 hole 15a so as to pass through the interlayer insulator 14.

A word line WL and M2 electrode layers 17b to 17g, 17i and 17j are provided on the interlayer insulator 14 and the VIA1 plugs 16a to 16j. The word line WL is connected with the gate electrode 6d through the VIA1 plug 16a, the M1 electrode layer 13b, and the contact plug 12d. As a result, the gate electrode G1 of the transfer transistor TR6 is connected with the word line WL. Moreover, the word line WL is connected with the gate electrode 6i through the VIA1 plug 16h, the M1 electrode layer 13k, and the contact plug 12i. As a result, the gate electrode G1 of the transfer transistor TR5 is connected with the word line WL.

An interlayer insulator 18 is configured by the silicon oxide film, and provided on the interlayer insulator 14, the word line WL, and the M2 electrode layers 17b to 17g, side surface of the word line WL and M2 electrode layers 17b to and 17g, 17i and 17j. The surface of the interlayer insulator 18 is planarized.

VIA2 plugs 19a to 19h are provided on each corresponding word line WL and M2 electrode layers 17b to 17g, 17i and 17j at each position of the corresponding VIA2 holes so as to pass through the interlayer insulator 18.

A threshold voltage control line VtC, bit lines BLT and BLC, ground lines VSS1 and VSS2 at the ground level, and a power supply voltage VDD are provided on the interlayer insulator 18 and the VIA2 plugs 19a to 19h. The threshold voltage control line VtC is connected with the gate electrode 6j through the VIA2 plug 19a, the M2 electrode layer 17f, the VIA1 plug 16f, the M1 electrode layer 13i, and the contact plug 12j. As a result, the gate electrode G2 of the transfer transistor TR5 is connected with the threshold voltage control line VtC. Moreover, the threshold voltage control line VtC is connected with the gate electrode 6e through the VIA2 plug 19h, the M2 electrode layer 17e, the VIA1 plug 16e, the M1 electrode layer 13c, and the contact plug 12e. As a result, the gate electrode G2 of the transfer transistor TR6 is connected with the threshold voltage control lines VtC.

The bit line BLT is connected with the active area 3a through the VIA2 plug 19b, the M2 electrode layer 17g, the VIA1 plug 16g, the M1 electrode layer 13j, and the contact plugs 8c. As a result, the drain of the transistor TR5 is connected with the bit line BLT.

The bit line BLC is connected with the active area 3d through the VIA2 plug 19g, the M2 electrode layer 17d, the VIA1 plug 16d, the M1 electrode layer 13f, and the contact plugs 8f. As a result, the drain of the transfer transistor TR6 is connected with the bit line BLC.

The ground line VSS1 for the ground level is connected with the active area 3a through the VIA2 plug 19e, the M2 electrode layer 17b, the VIA1 plug 16b, the M1 electrode layer 13d, and the electric contact plug 8e. As a result, the source of the driver transistor TR3 is connected with the ground line VSS1 for the ground level.

The ground line VSS2 for the ground level is connected with the active area 3d through the VIA2 plug 19d, the M2 electrode layer 17j, the VIA1 plug 16j, the M1 electrode layer 13n, and the electric contact plug 8h. As a result, the source of the driver transistor TR4 is connected with the ground line VSS2 for the ground level.

The power supply voltage VDD is connected with the active area 3b through the VIA2 plug 19f, the M2 electrode layer 17c, the VIA1 plug 16c, the M1 electrode layer 13e, and the contact plug 8j. As a result, the drain of the load transistor TR1 is connected with the power supply voltage VDD. Moreover, the power supply voltage VDD is connected with the active area 3c through the VIA2 plug 19c, the M2 electrode layer 17i, the VIA1 plug 16i, the M1 electrode layer 13l, and the contact plug 8i. As a result, the drain of the transistor TR2 is connected with the power voltage VDD.

A passivation layer 20 is configured by the silicon oxide film, and provided on the interlayer insulator 18, the threshold voltage control lines VtC, the bit lines BLT and BLC, the ground lines VSS1 and VSS2, and the power supply voltage VDD. The passivation layer 20 contacts to the side surface of the threshold control lines VtC, the bit lines BLT and BLC, the ground lines VSS1 and VSS2 at the ground level, and the power supply voltage VDD. The surface of the passivation layer 20 is planarized.

In the SRAM Cell, all of the transistors TR1 to TR6 have the first gate electrode G1 and the second gate electrode G2. As for the transistors TR1 to TR4, the first gate electrode G1 and the second gate electrode G2 are connected through the M1 electrode layer. As for the transfer transistors TR5 and TR6, the electrode layer is provided for a different applied voltage to be given to the first gate electrode G1 and the second gate electrode G2. In the SRAM Cell, the transfer transistors TR5 and TR6 that has back-gate type, so-called separated-gate type structure, and the transistors TR1 to TR4 that has common-gate type structure are embedded.

Moreover, until the fabrication processing of the gate electrodes G1 and G2, the SRAM Cell can be configured with the double-gate type Fin FETs of the same structure. As a result, a plurality of gate electrodes of the same structure and a plurality of Fins of the same structure are only formed during the course of the processing of a plurality of Fin FETs. Therefore, enough process margins can be allowed for the lithography processing.

If the structures of the gate electrode and the Fin of the Fin FETS are various or the Fin FETs more than two varieties exist, the fabrication processing becomes complex. Moreover, the number of control parameters in the fabrication processing increases, and then the process margins become small and the fabrication processing steps become difficult.

In the SRAM Cell, the threshold voltage control line VtC that provides the voltage to the second gate electrode G2 is located orthogonal to the word line WL. The SRAM Cell according to the first embodiment can be configured while following the layout of the conventional type since the threshold voltage control line VtC intersects with the word line WL. If the threshold voltage control line VtC is located in parallel to the word line WL, it is necessary to increase the number of metal layers or it is necessary to bend the word line WL. Therefore, it is disadvantageous in the processing yield of the semiconductor memory.

In the SRAM Cell, the threshold voltage control line VtC that provides the voltage to the second gate electrode G2 of the transfer transistors TR5 and TR6 is shared with an adjacent cell. That is, the semiconductor memory has a plurality of adjacent SRAM Cells mutually sharing the threshold voltage control line VtC.

The threshold voltage control line VtC that provides the voltage applied to the second gate electrode G2 of the transfer transistor TR5/TR6 of a certain SRAM Cell is shared with the threshold voltage control line VtC that provides the voltage applied to the second gate electrode G2 of the transfer transistor TR5/TR6 of an adjacent SRAM Cell in the direction elongating with the word line WL.

The minimization of the area can be achieved by sharing the threshold voltage control line VtC with an adjacent SRAM Cell. Although the VSS line was shared in the conventional type, two VSS lines are provided in the cell in the layout of the first embodiment.

(Fabrication Method)

Next, the fabrication method for the semiconductor memory according to the first embodiment of the present invention will be explained.

Figure 6:
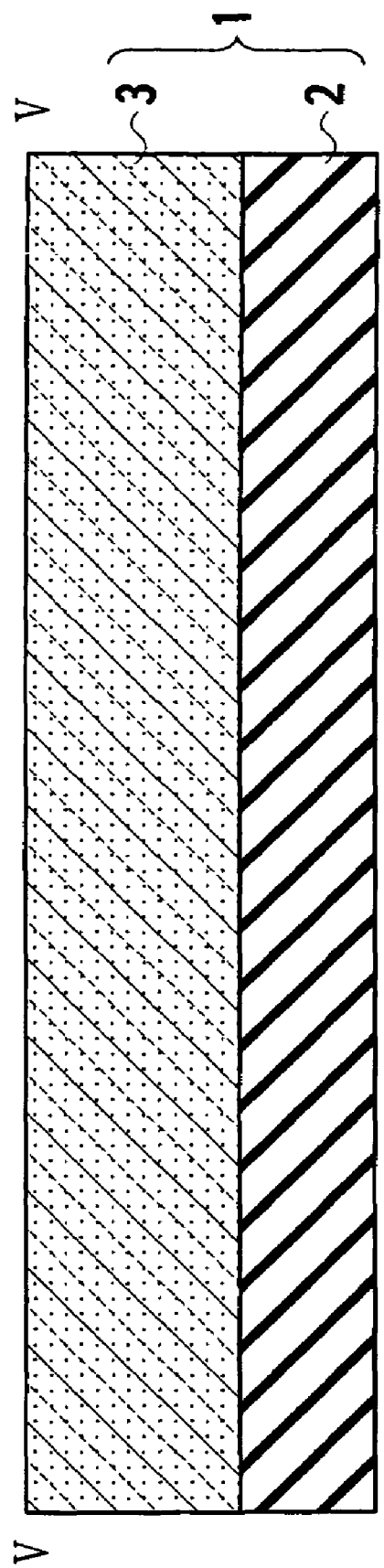
FIG. 6 is a cross-sectional view taken in the line V-V of FIG. 4 in the fabrication process of the semiconductor memory (No. 1) according to the first embodiment of the present invention.

As shown in FIG. 6, the SOI substrate 1 of which the silicon (Si) layer 3 is provided on the silicon oxide ($SiO_2$) layer 2 is prepared.

Figure 7:
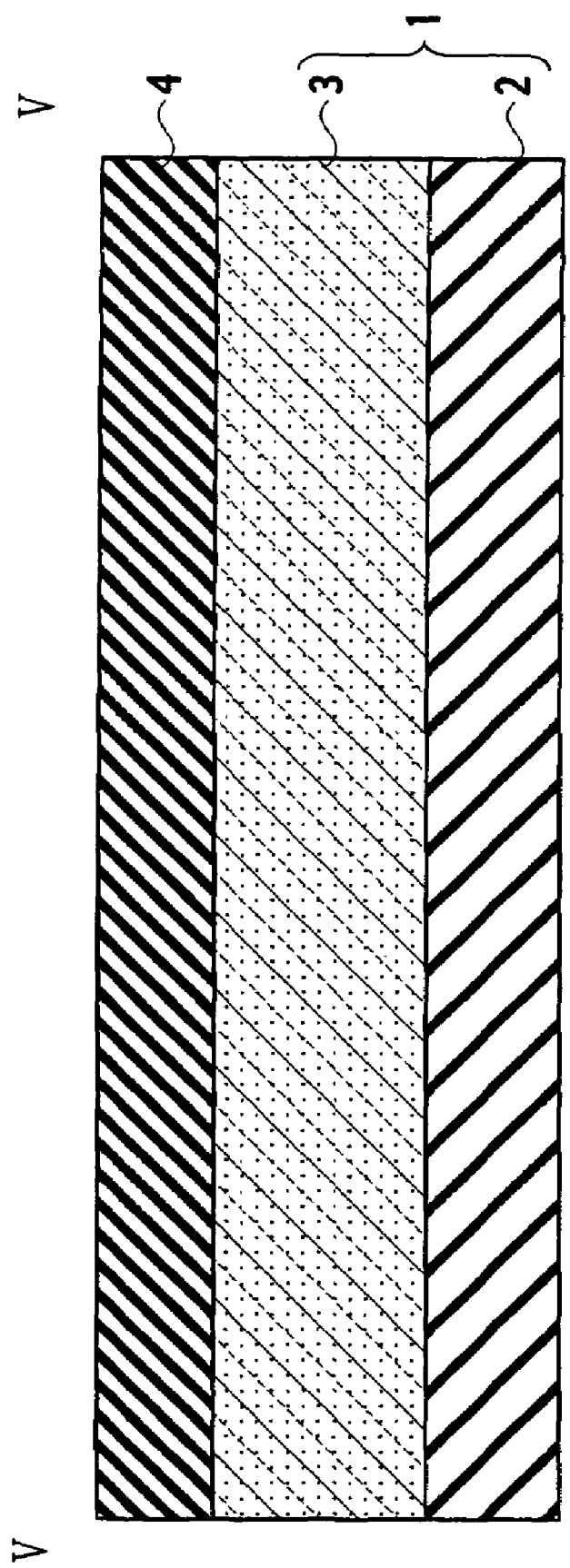
FIG. 7 is a cross-sectional view taken in the line V-V of FIG. 4 in the fabrication process of the semiconductor memory (No. 2) according to the first embodiment of the present invention.

Next, as shown in FIG. 7, the cap layer 4 configured by silicon nitride ($Si_3N_4$) etc. is deposited on the semiconductor (silicon) layer 3 by using the Chemical Vapor Deposition (CVD) method.

Figure 8:
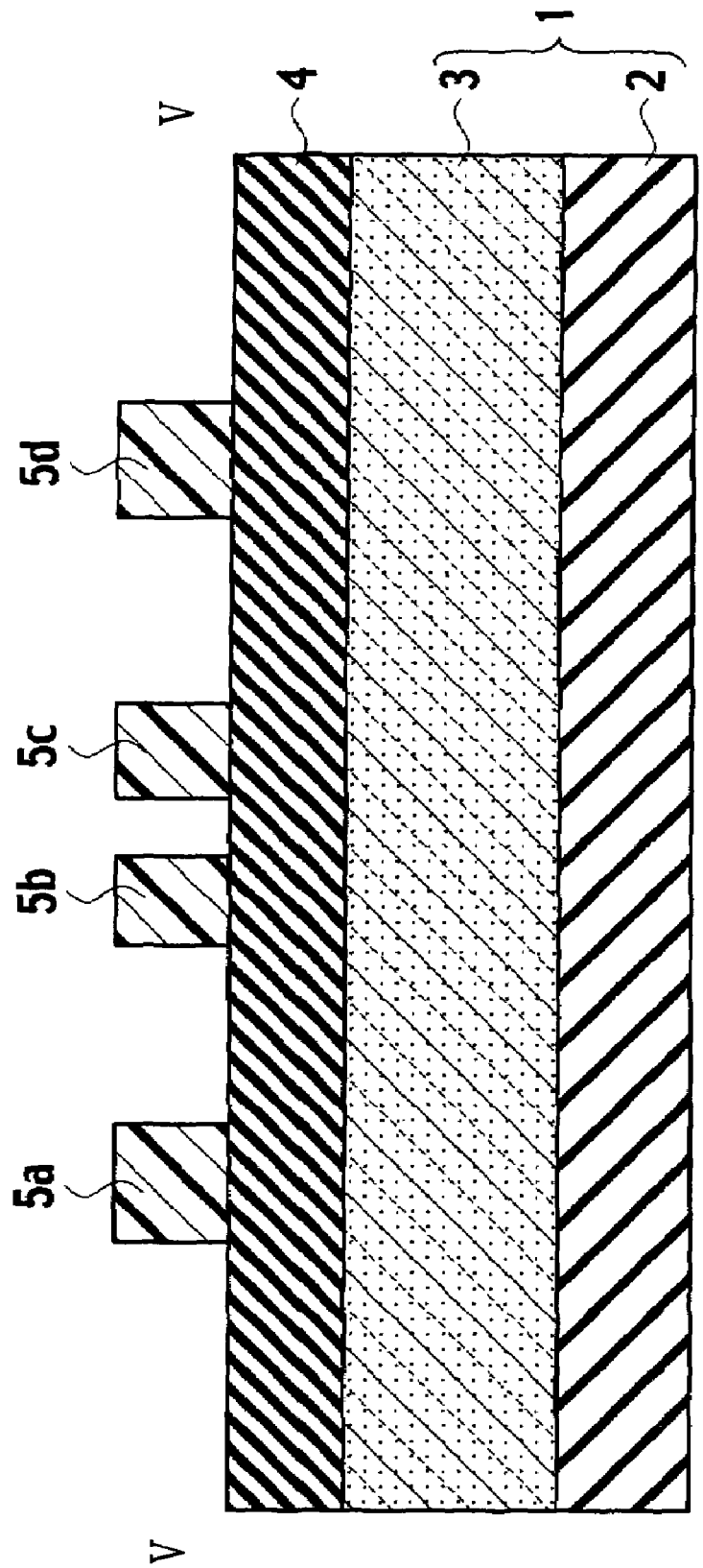
FIG. 8 is a cross-sectional view taken in the line V-V of FIG. 4 in the fabrication process of the semiconductor memory (No. 3) according to the first embodiment of the present invention.

As shown in FIG. 8, the resist film is formed on the cap layer 4, the resist film is patterned by the lithography processing, and the patterned resist films 5a to 5d are formed. The resist films 5a to 5d are patterned according to the pattern of the silicon Fins described later.

Figure 9:
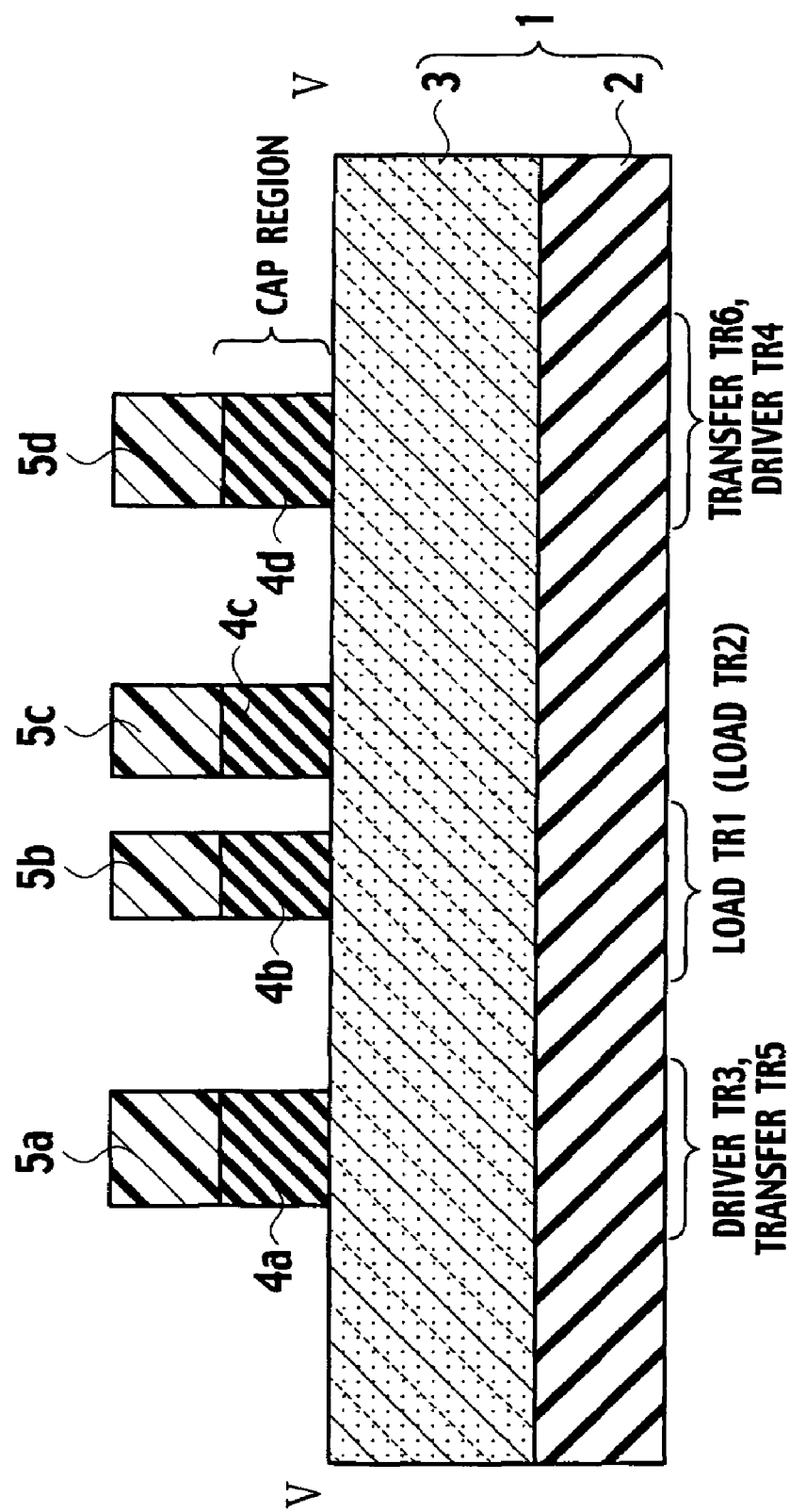
FIG. 9 is a cross-sectional view taken in the line V-V of FIG. 4 in the fabrication process of the semiconductor memory (No. 4) according to the first embodiment of the present invention.

As shown in FIG. 9, the cap layer 4 is etched by the Reactive Ion Etching (RIE) method, by using the resist films 5a to 5d as a mask and the silicon layer 3 as a stopper. As a result, cap layer 4 is patterned according to the pattern of the silicon Fin described later. And then, the patterned cap layers 4a to 4d are formed.

Figure 10:
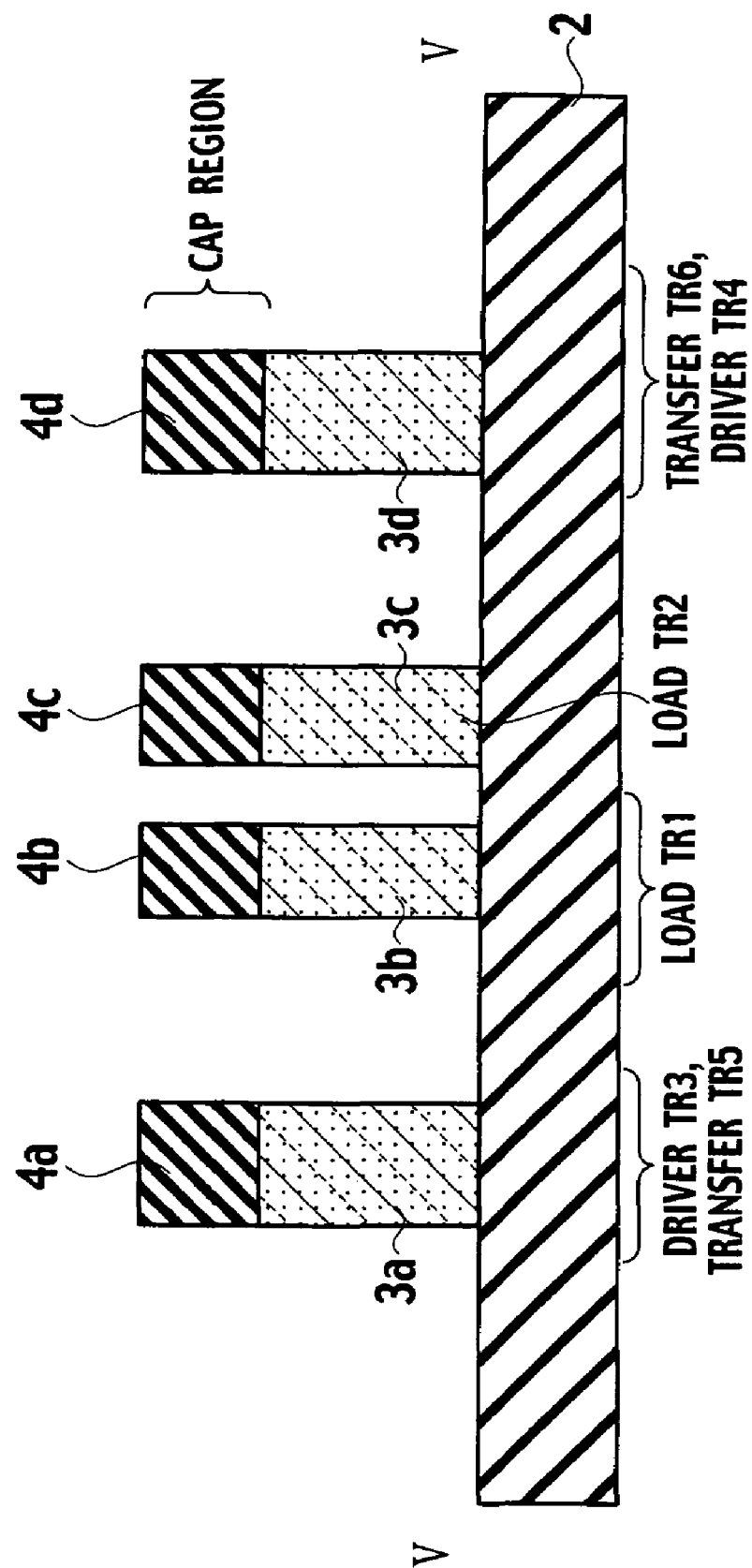
FIG. 10 is a cross-sectional view taken in the line V-V of FIG. 4 in the fabrication process of the semiconductor memory (No. 5) according to the first embodiment of the present invention.

As shown in FIG. 10, the resist films 5a to 5d are removed. And then, the silicon layer 3 is etched by the RIE method, by using the cap layers 4a to 4d as a mask and the silicon oxide layer 2 as a stopper. As a result, the silicon Fins 3a to 3d configured by the silicon layer 3 are formed. The silicon Fin 3a is used for the active area of the driver transistor TR3 and the transfer transistor TR5, the silicon Fin 3b is used for the active area of the load transistor TR1, the silicon Fin 3c is used for the active area of the load transistor TR2, and the silicon Fin 3d is used for the active area of the driver transistor TR4 and the transfer transistor TR6. Therefore, the silicon Fins 3a to 3d are doped if necessary. And then, the gate insulator is formed with the oxidation of the exposed surface of the silicon Fins 3a to 3d.

Figure 11:
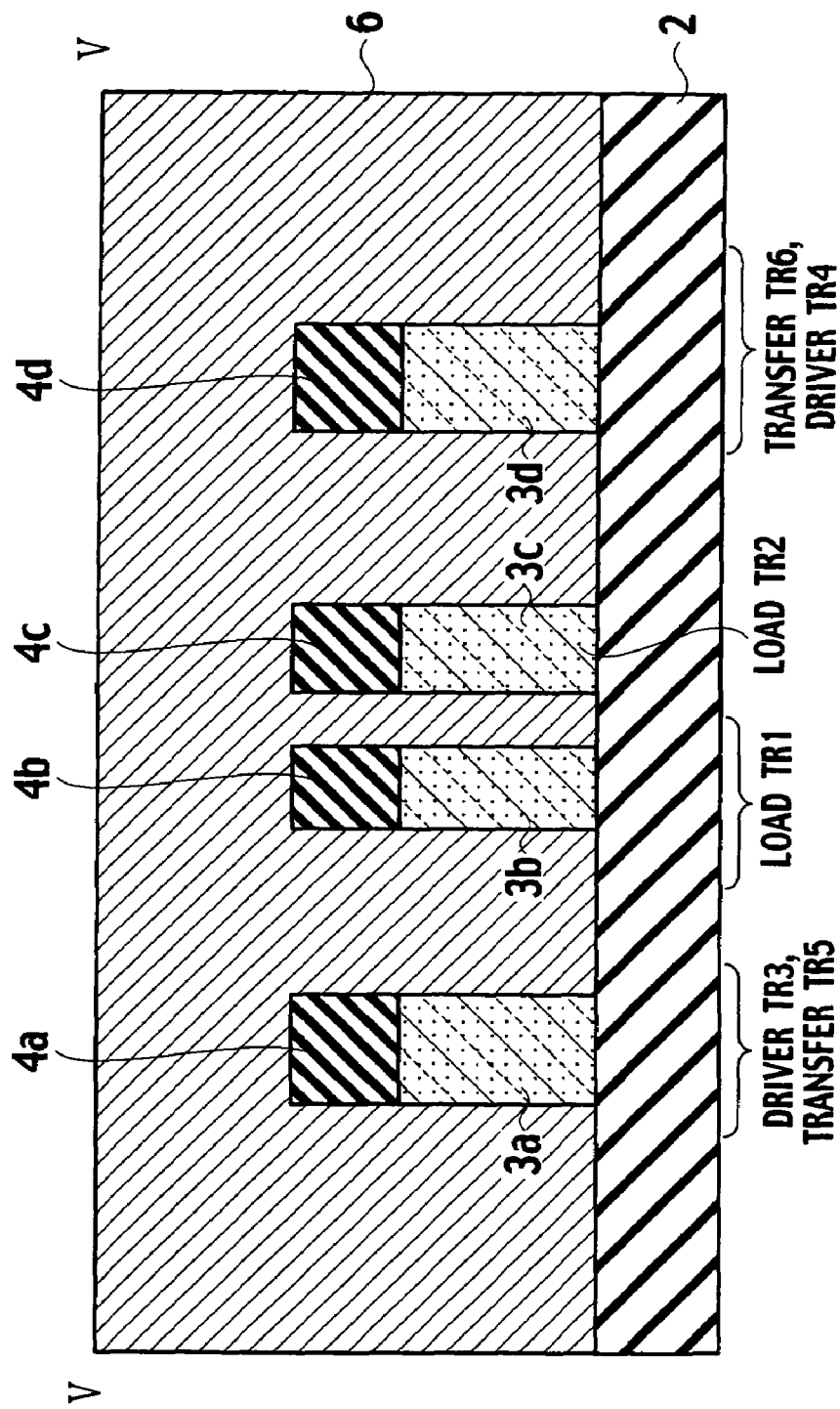
FIG. 11 is a cross-sectional view taken in the line V-V of FIG. 4 in the fabrication process of the semiconductor memory (No. 6) according to the first embodiment of the present invention.

As shown in FIG. 11, the conducting film 6 configured by Poly-Silicon (Poly-Si) is deposited on the silicon oxide layer 2 by the CVD method. The conducting film 6 is also deposited in surroundings of the silicon Fins 3a to 3d as contacting to the side surface of the silicon Fins 3a to 3d. The silicon Fins 3a to 3d and cap layers 4a to 4d are embedded by the conducting film 6.

Figure 12:
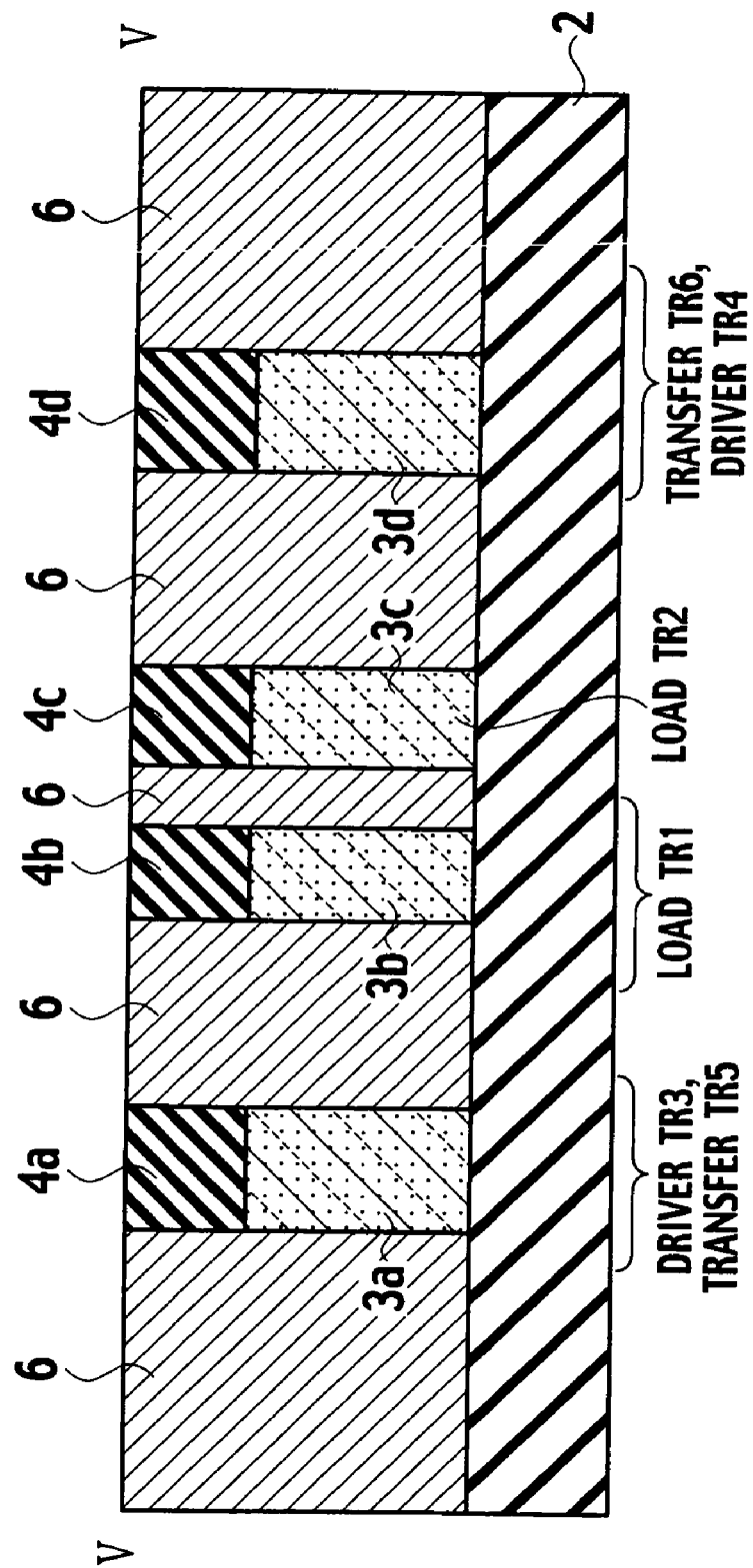
FIG. 12 is a cross-sectional view taken in the line V-V of FIG. 4 in the fabrication process of the semiconductor memory (No. 7) according to the first embodiment of the present

As shown in FIG. 12, polishing of the conducting film 6 is performed by the Chemical Mechanical Polishing (CMP) method, by using the cap layers 4a to 4d as a stopper.

Figure 13:
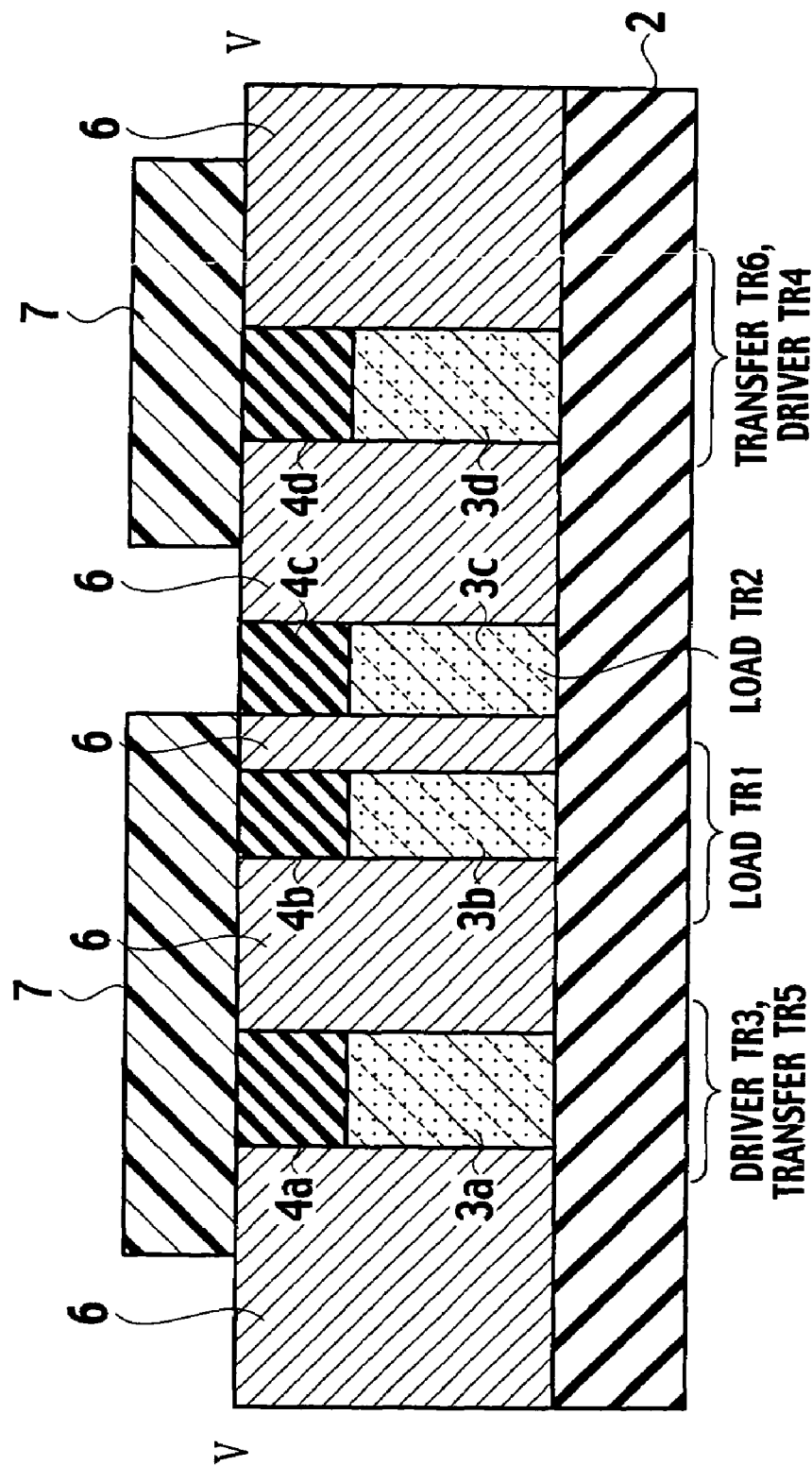
FIG. 13 is a cross-sectional view taken in the line V-V of FIG. 4 in the fabrication process of the semiconductor memory (No. 8) according to the first embodiment of the present invention.

As shown in FIG. 13, the resist film 7 is formed on the conducting film 6 and the cap layers 4a to 4d, and the resist film 7 is patterned by the lithography processing. The resist film 7 is patterned according to the pattern of the gate electrode described later and the pattern of the contact hole on the silicon Fin. The pattern of the gate electrode is provided to both sides of the cap layers 4a to 4d that the cap layers 4a to 4d are stepped over. As a result, the gate electrodes of the double-gate type can be provided for each both sides of the silicon Fins 3a to 3d.

Figure 14:
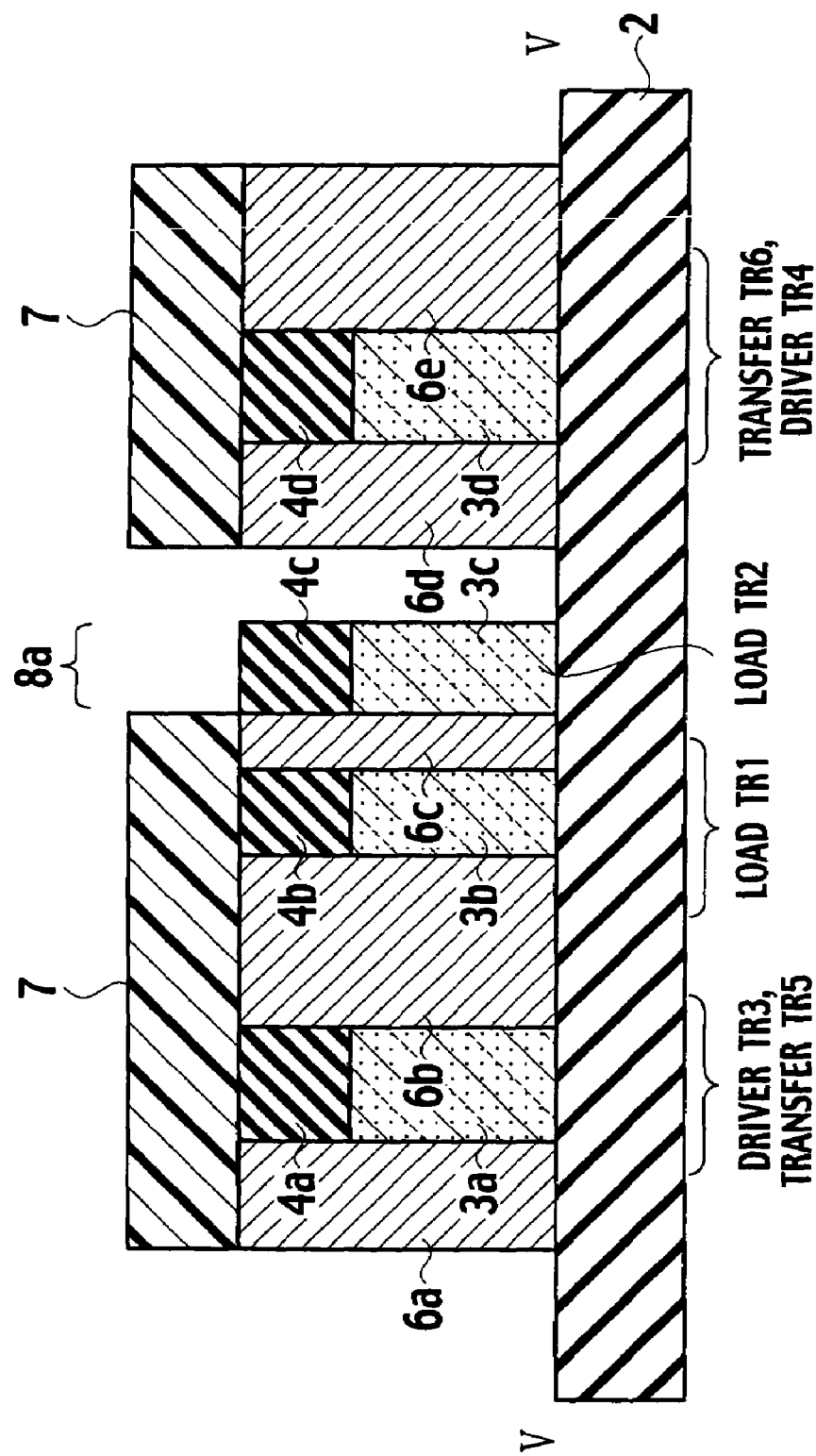
FIG. 14 is a cross-sectional view taken in the line V-V of FIG. 4 in the fabrication process of the semiconductor memory (No. 9) according to the first embodiment of the present invention.

As shown in FIG. 14, the conducting film 6 is etched by the RIE technology, by using the cap layers 4a to 4d and the silicon oxide layer 2 as a mask and the resist film 7 as a stopper. As a result, the gate electrodes 6a to 6j configured by the Poly-Silicon are formed. Until the fabrication process of the gate electrode, all transistors TR1 to TR6 in the SRAM Cell can be configured with back-gate type Fin FETs. It is not conducted with each gate electrodes G1 and G2 of all transistors TR1 to TR6.

Thus, until the fabrication process of the gate electrode, all of the transistors TR1 to TR6 can be configured with the back-gate type Fin FETs of the same structure. Therefore, a plurality of gate electrodes of the same structure and a plurality of Fins of the same structure are only formed during the course of the processing of a plurality of Fin FETs. Therefore, enough process margins can be allowed for the lithography processing. If the structures of the gate electrode and the Fin of the Fin FETS are various or the Fin FETs more than two varieties exist, the fabrication processing becomes complex. Moreover, the number of control parameters in the fabrication processing increases, and then the process margins become small and the fabrication processing steps become difficult.

Figure 15:
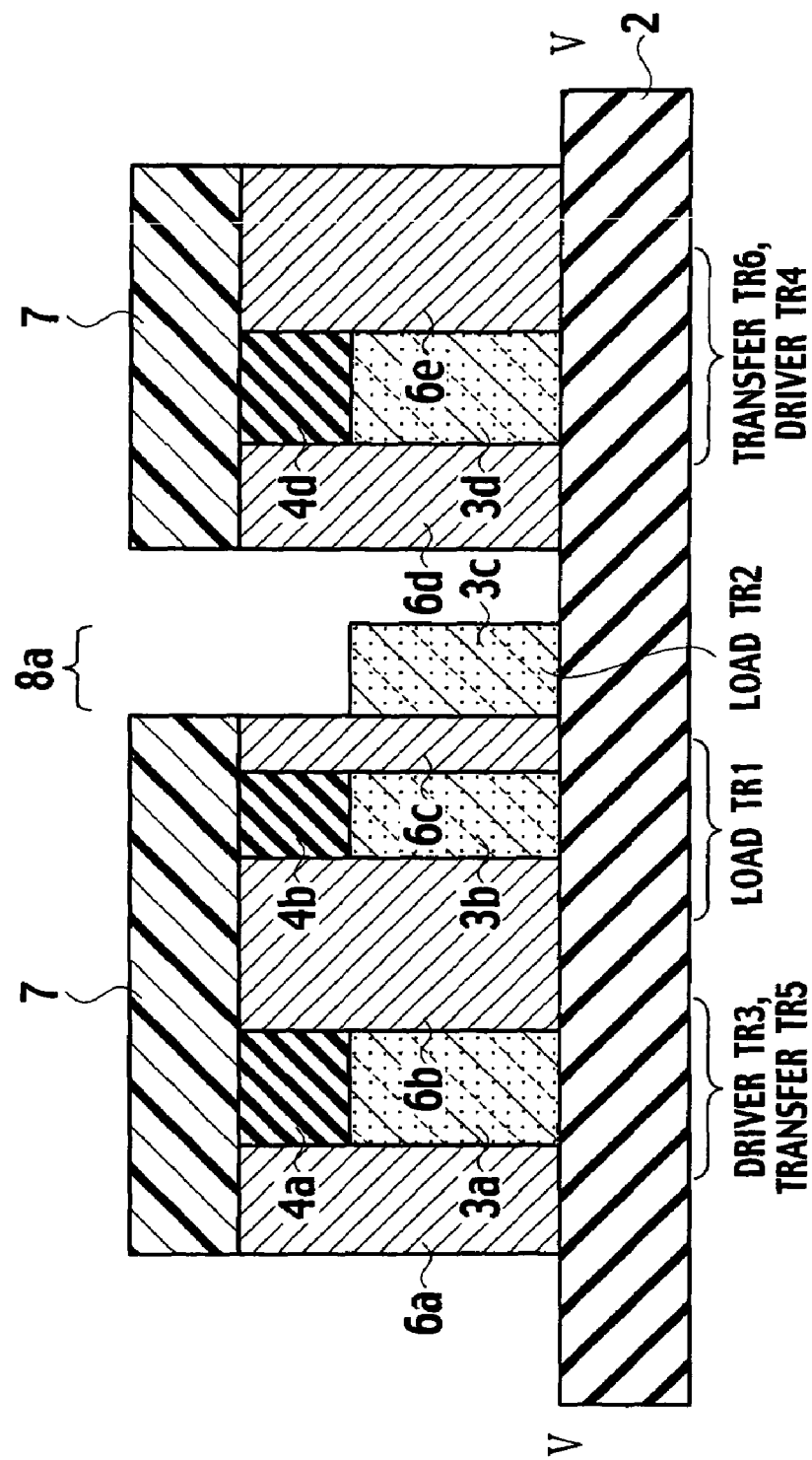
FIG. 15 is a cross-sectional view taken in the line V-V of FIG. 4 in the fabrication process of the semiconductor memory (No. 10) according to the first embodiment of the present invention.

As shown in FIG. 15, the cap layers 4a to 4d are etched by the RIE technology, by using the silicon Fin 3a to 3d and the silicon oxide layer 2 as a mask and the resist film 7 as a stopper. As a result, since the cap material is removed in the area that will become contact holes in the following processing, the silicon layer 3 is exposed.

Figure 16:
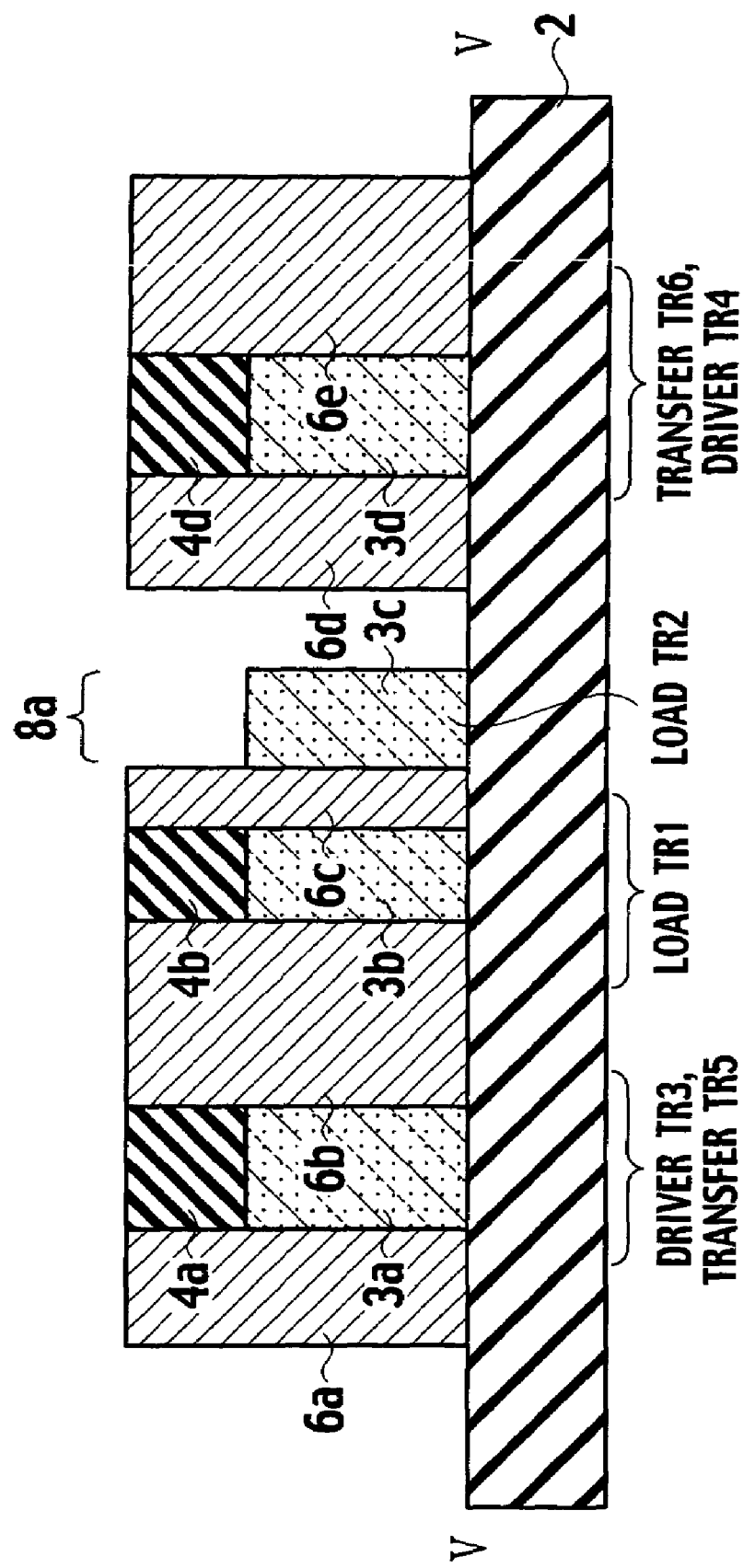
FIG. 16 is a cross-sectional view taken in the line V-V of FIG. 4 in the fabrication process of the semiconductor memory (No. 11) according to the first embodiment of the present invention.

As shown in FIG. 16, the resist film 7 is removed.

Figure 17:
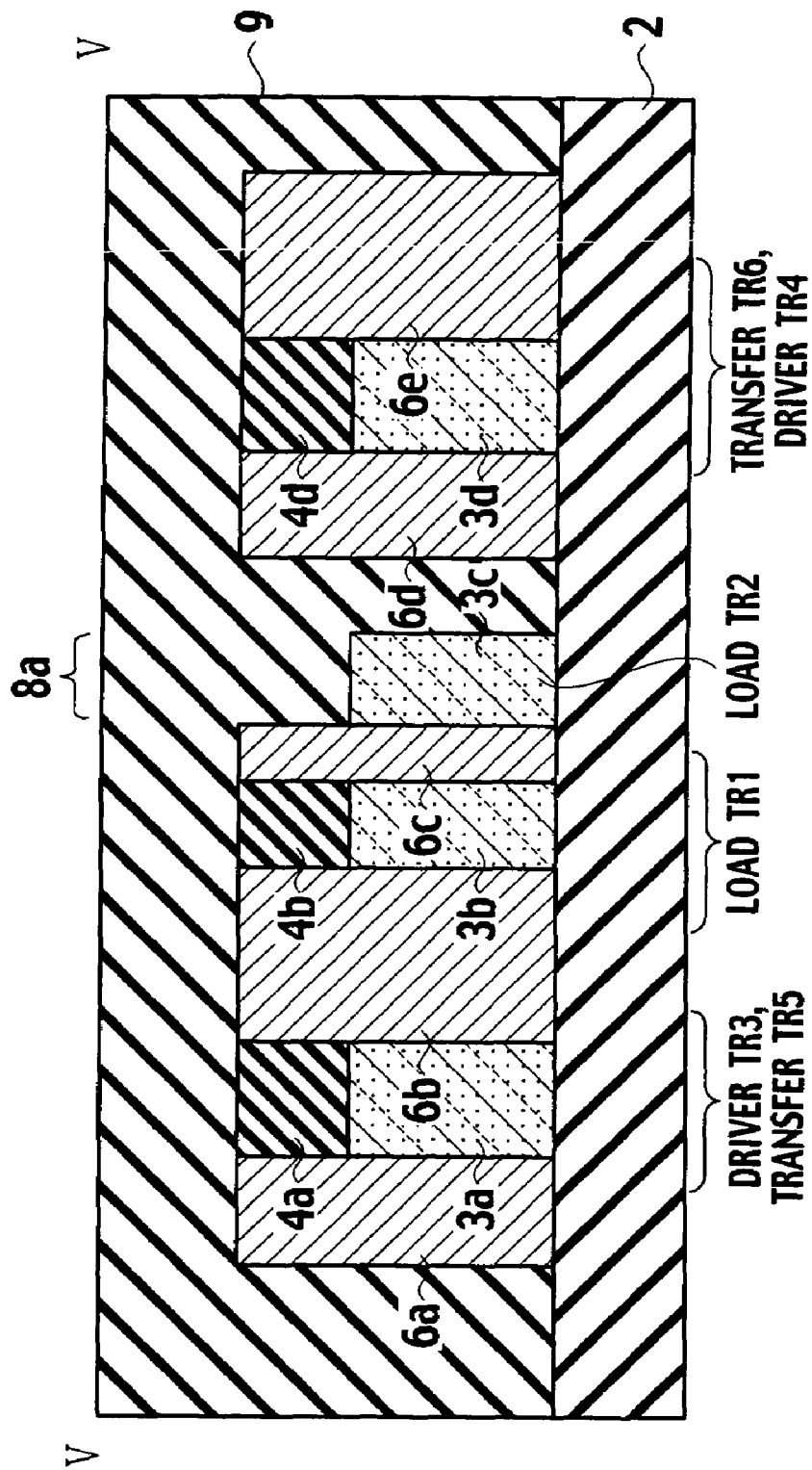
FIG. 17 is a cross-sectional view taken in the line V-V of FIG. 4 in the fabrication process of the semiconductor memory (No. 12) according to the first embodiment of the present invention.

As shown in FIG. 17, the silicon oxide film used for the interlayer insulator 9 is deposited on the silicon oxide layer 2, the gate electrodes 6a to 6j, and the cap layers 4a to 4d by the CVD method. The surface of the interlayer insulator 9 is planarized by the CMP method.

Figure 18:
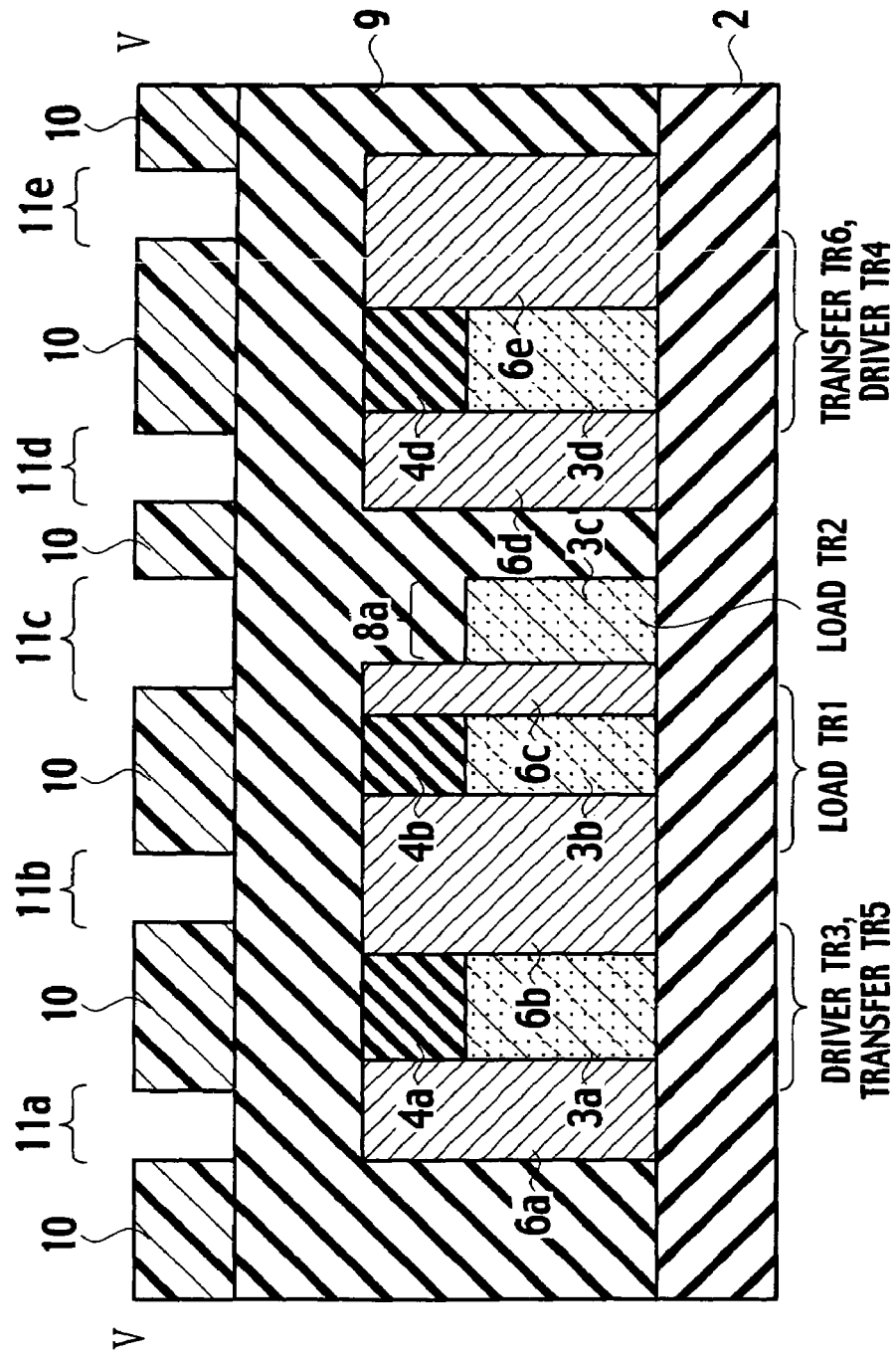
FIG. 18 is a cross-sectional view taken in the line V-V of FIG. 4 in the fabrication process of the semiconductor memory (No. 13) according to the first embodiment of the present invention.

As shown in FIG. 18, the resist film 10 is formed on the silicon oxide film of the interlayer insulator 9, and the resist film 10 patterned by the lithography method. The resist film 10 is patterned according to the pattern of the contact holes 8a to 8j and 11a to 11j described later.

Figure 19:
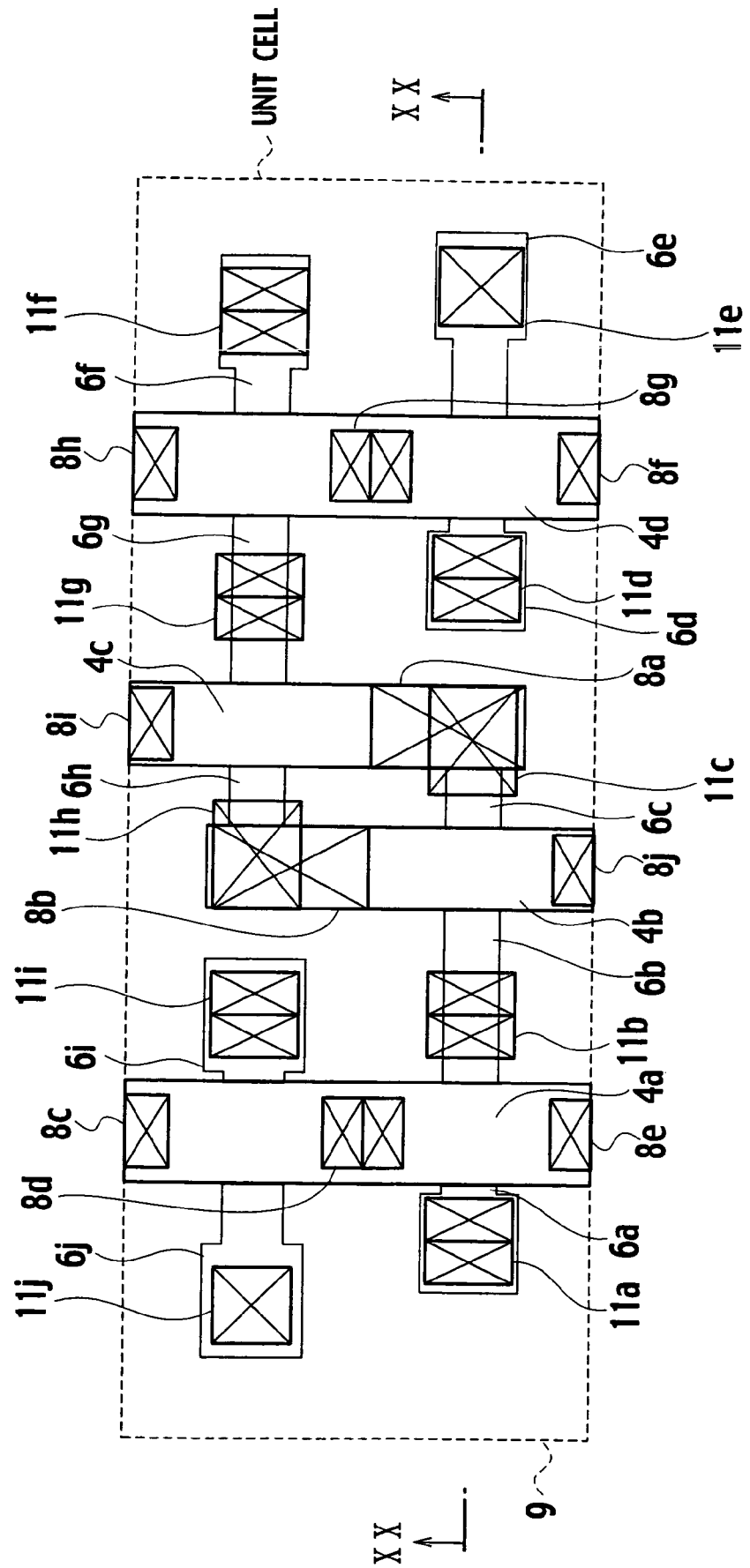
FIG. 19 is a plan view pattern in the fabrication process of the semiconductor memory (No. 1) according to the first embodiment of the present invention.
Figure 20:
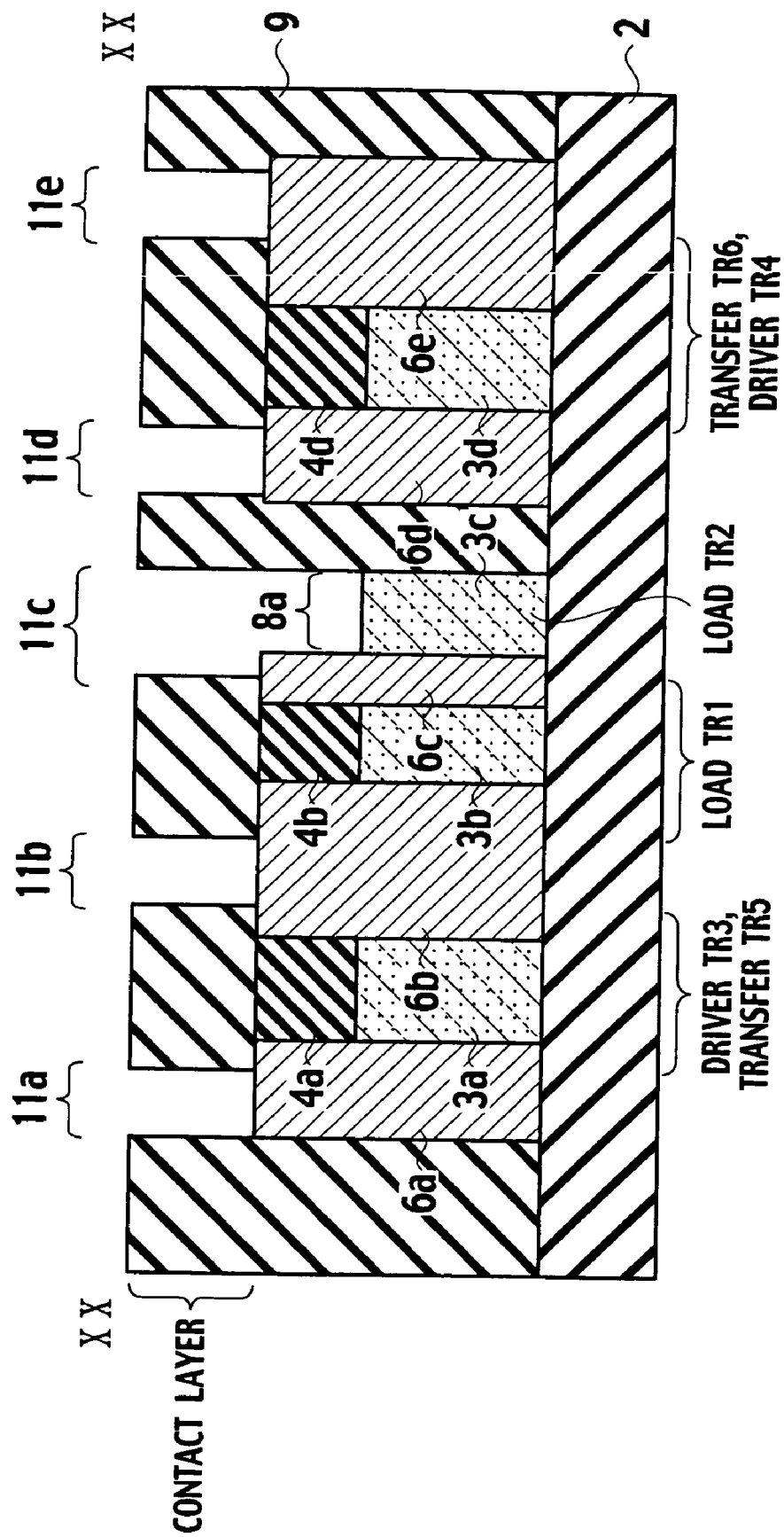
FIG. 20 is a cross-sectional view taken in the line XX-XX of FIG. 19 in the fabrication process of the semiconductor memory (No. 1) according to the first embodiment of the present invention.

As shown in FIG. 19 and FIG. 20, the area of the contact holes 8a to 8j and 11a to 11j of the silicon oxide film of the interlayer insulator 9 is etched by the RIE technology, by using the resist film 10 and the cap layers 4a to 4d as a mask and the silicon Fins 3a to 3d and the gate electrodes 6a to 6j as a stopper. As a result, the contact holes 8a to 8j and 11a to 11j are formed.

Figure 21:
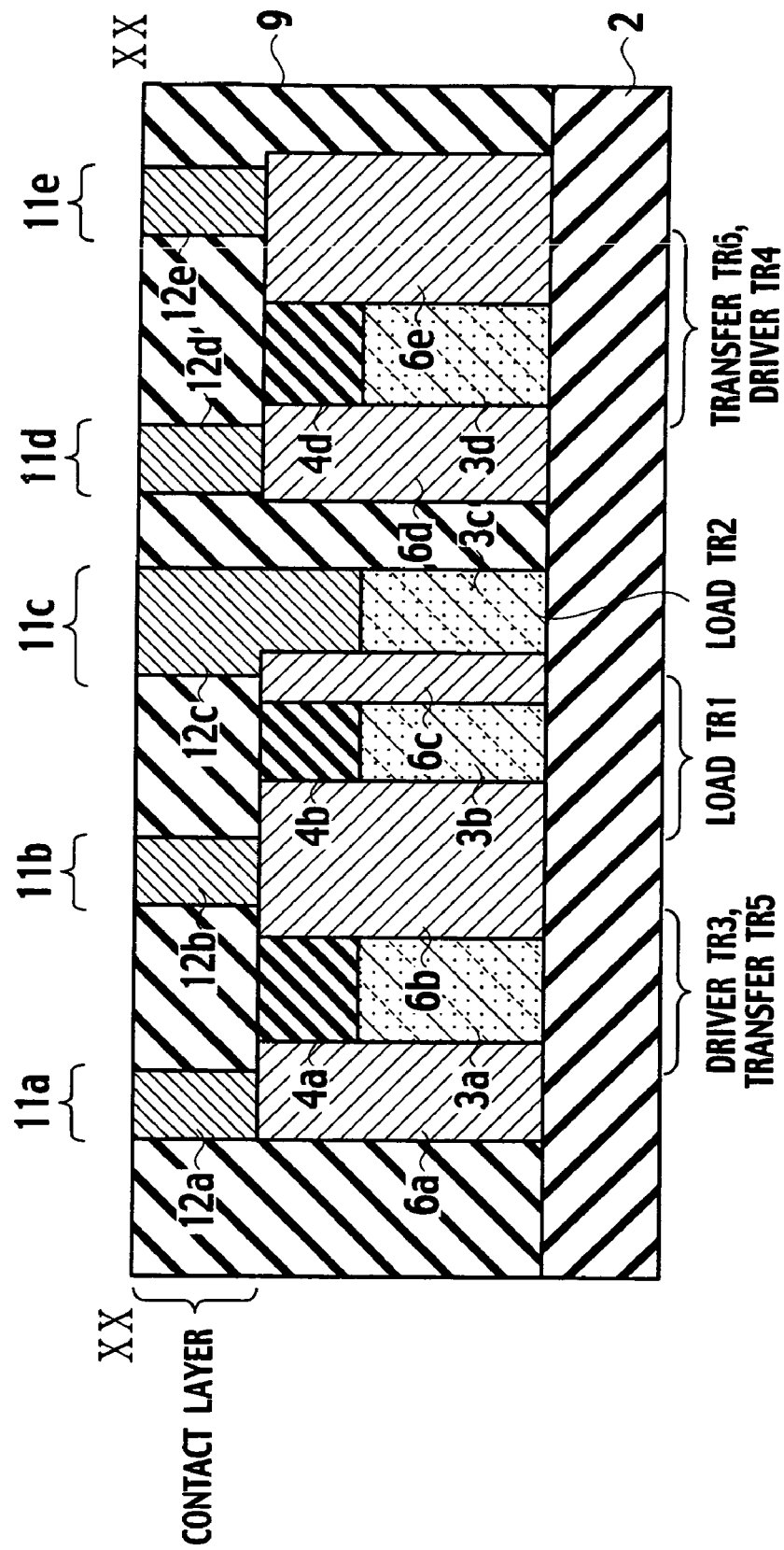
FIG. 21 is a cross-sectional view taken in the line XX-XX of FIG. 19 in the fabrication process of the semiconductor memory (No. 2) according to the first embodiment of the present invention.

As shown in FIG. 21, the conducting film used for the contact plug is deposited by the CVD method, and the conducting film is embedded in the contact holes 8a to 8j and 11a to 11j. The conducting film that is deposited outside of the contact holes 8a to 8j and 11a to 11j is polished by the CMP method, by using the silicon oxide film of the interlayer insulator 9 as a stopper. As a result, the contact plugs 8a to 8j and 12a to 12j are formed.

Figure 22:
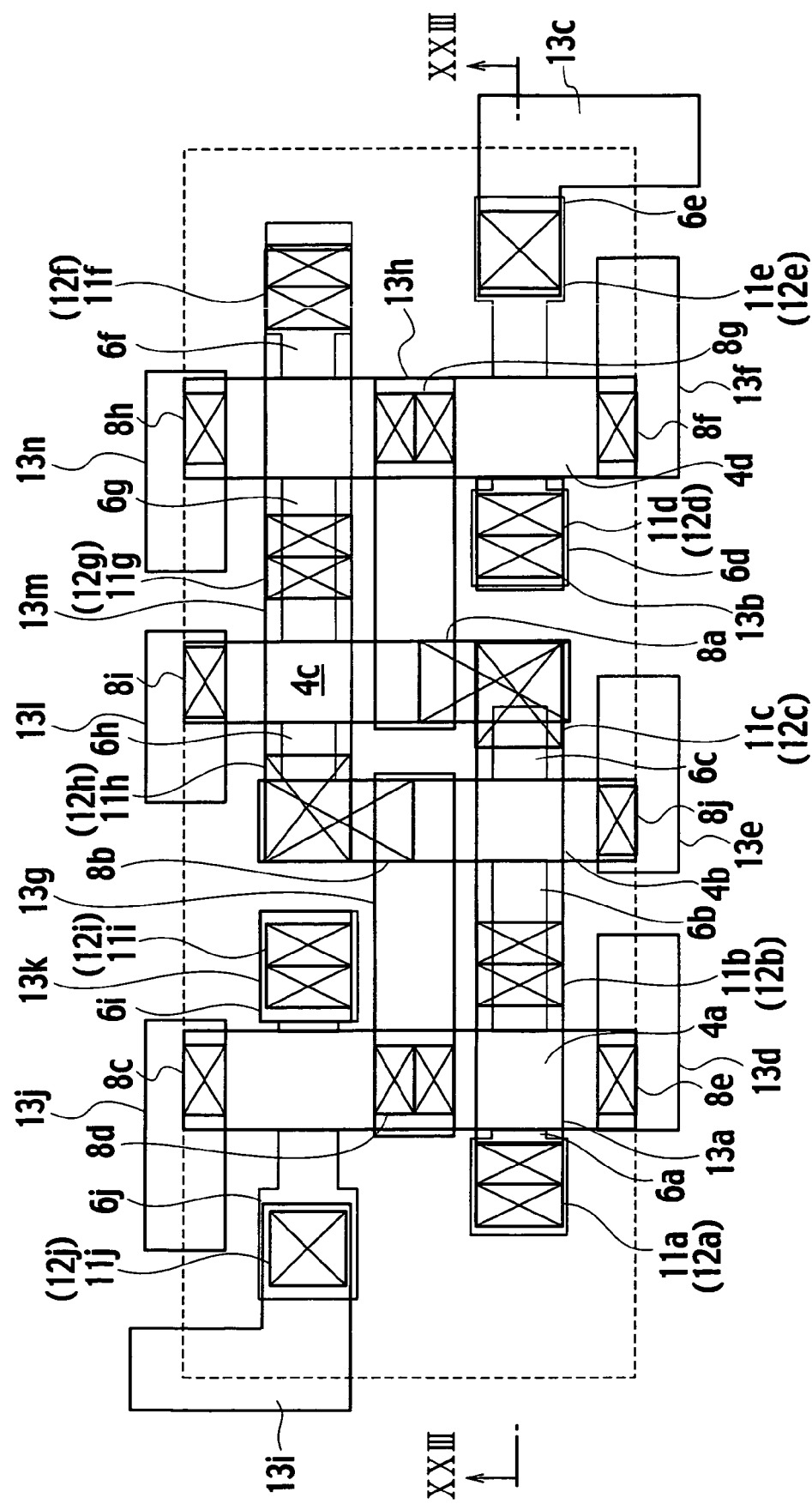
FIG. 22 is a plan view pattern in the fabrication process of the semiconductor memory (No. 2) according to the first embodiment of the present invention.
Figure 23:
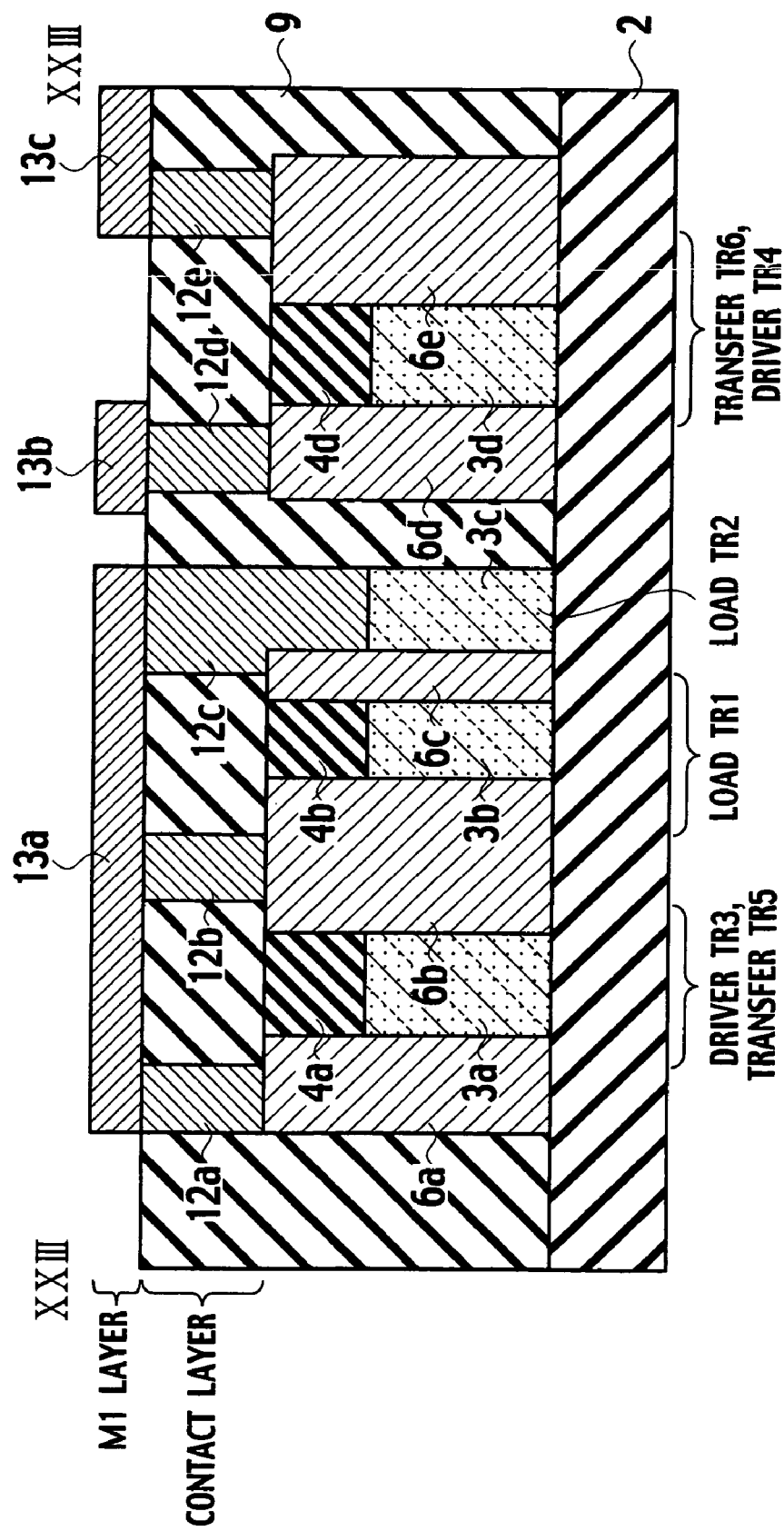
FIG. 23 is a cross-sectional view taken in the line XXIII-XXIII of FIG. 22 in the fabrication process of the semiconductor memory (No. 1) according to the first embodiment of the present invention.

As shown in FIG. 22 and FIG. 23, the conducting film used for the M1 electrode layer is deposited on the interlayer insulator 9 by the sputtering technique etc. The resist film is formed on the conducting film, and the resist film is patterned by the lithography method. The resist film is patterned according to the pattern of the M1 electrode layers 13a to 13n described later. The conducting film is etched by the RIE technology, by using the resist film as a mask and the interlayer insulator 9 as a stopper.

As a result, the M1 electrode layers 13a to 13n are formed. And then, the transistors TR1 to TR4 used as the usual (narrowly-defined) double-gate MOSFET can be used by connecting both electrodes of the first gate electrode G1 that is the top gate and the second gate electrode G2 that is the back gate, at the M1 electrode layers 13a and 13m applying the same voltage.

As for the transfer transistors TR5 and TR6 used as the back-gate type MOSFET, the gate electrode G1 is coupled to the word line WL, and the gate electrode G2 is coupled to the threshold voltage control line VtC, by the separated M1 electrode layer. Thus, the back-gate type Fin FET and the usual double-gate Fin FET is fabricated to be divided in one SRAM Cell. That is, all transistors TR1 to TR6 are firstly formed as the back-gate type Fin FET, and then the double-gate Fin FET can be configured by connecting the gate electrodes G1 and G2 by the M1 electrode layer if necessary. In one SRAM Cell, the back-gate type Fin FET and the double-gate Fin FET are consolidated to form the SRAM Cell.

Figure 24:
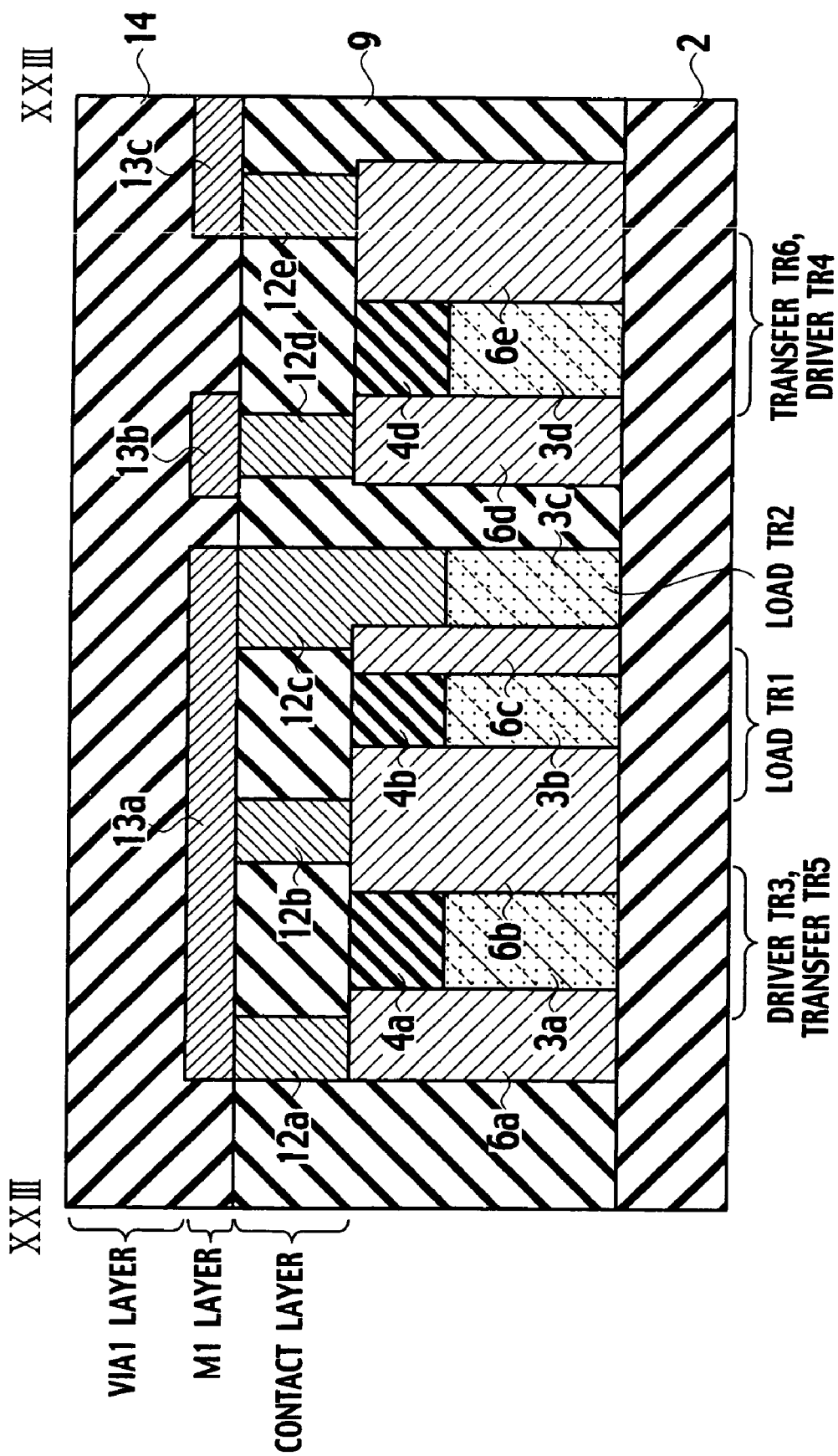
FIG. 24 is a cross-sectional view taken in the line XXIII-XXIII of FIG. 22 in the fabrication process of the semiconductor memory (No. 2) according to the first embodiment of the present invention.

As shown in FIG. 24, the silicon oxide film used for the interlayer insulator 14 is deposited on the interlayer insulator 9 and the M1 electrode layers 13a to 13n by the CVD method. The surface of the interlayer insulator 14 is planarized by the CMP method.

Figure 25:
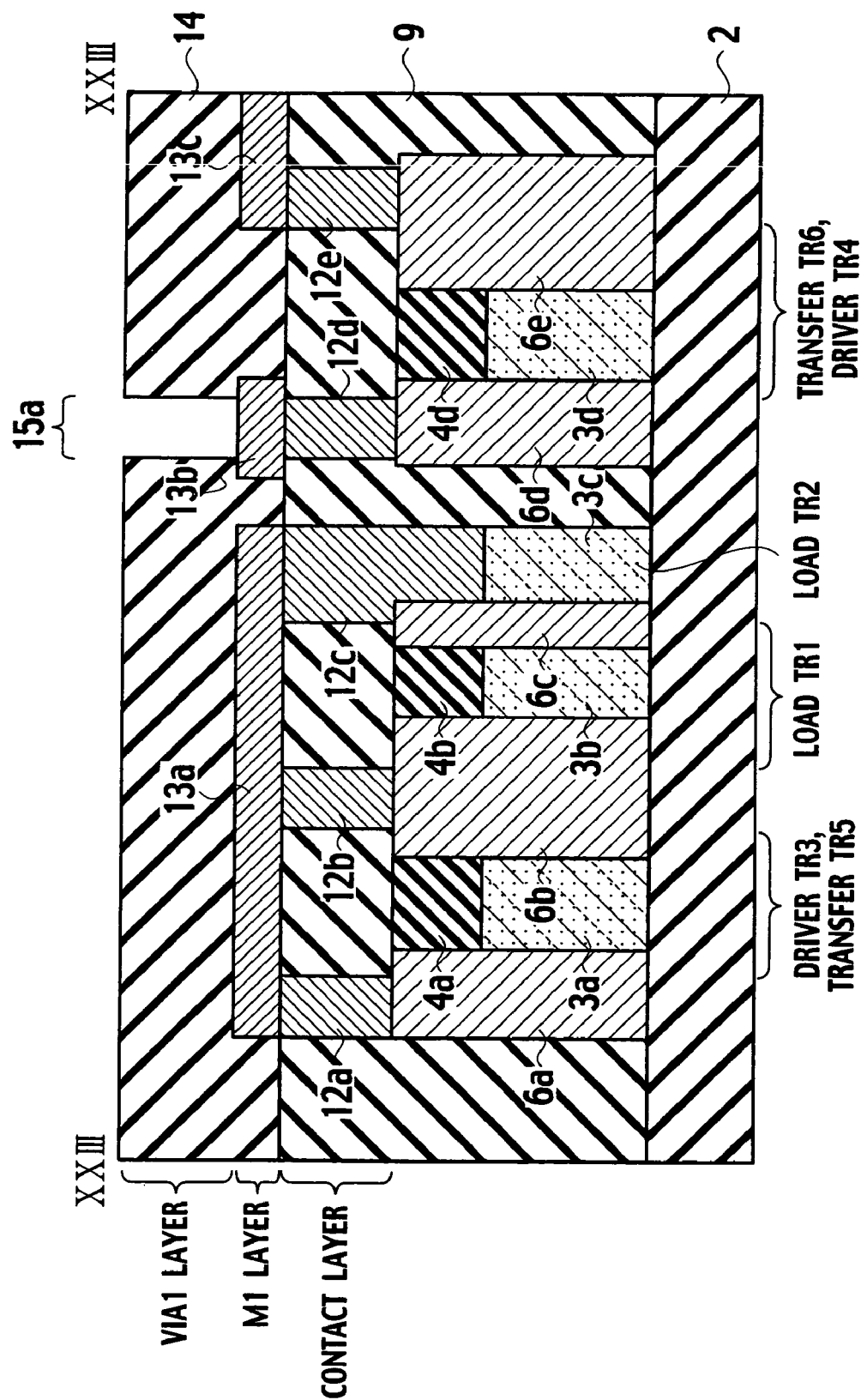
FIG. 25 is a cross-sectional view taken in the line XXIII-XXIII of FIG. 22 in the fabrication process of the semiconductor memory (No. 3) according to the first embodiment of the present invention.

As shown in FIG. 25, the resist film is formed on the interlayer insulator 14, and the resist film is patterned by the lithography method. The resist film is patterned according to the pattern of the VIA1 hole 15a. The area of the VIA1 plugs 16a to 16j of the interlayer insulator 14 are etched by the RIE technology, by using the resist film as a mask and the M1 electrode layers 13a to 13n as a stopper. As a result, the VIA1 hole 15a is formed.

Figure 26:
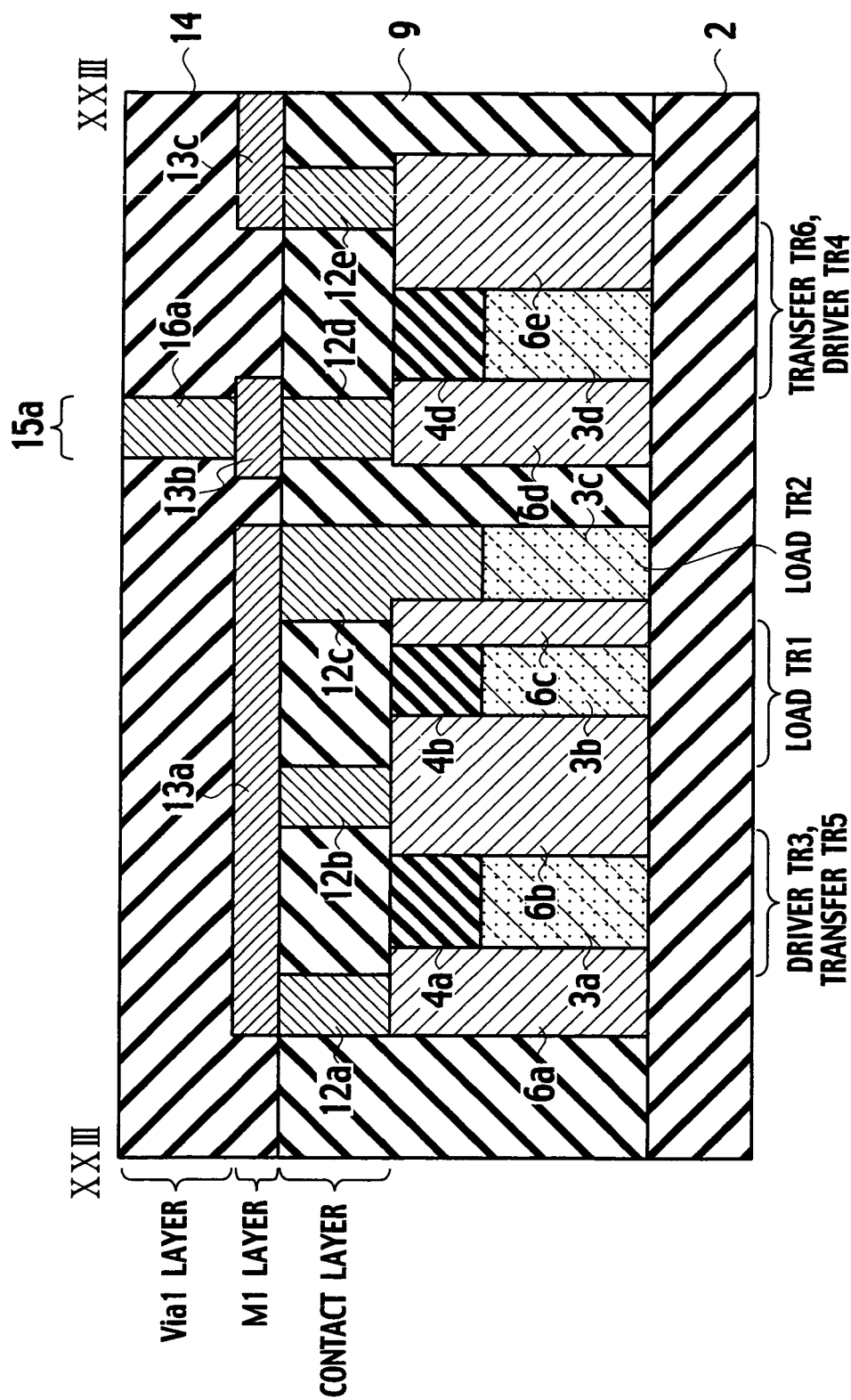
FIG. 26 is a cross-sectional view taken in the line XXIII-XXIII of FIG. 22 in the fabrication process of the semiconductor memory (No. 4) according to the first embodiment of the present invention.

As shown in FIG. 26, the conducting film used for the VIA1 plugs 16a to 16j is deposited by the CVD method, and the conducting film is embedded in the VIA1 hole 15a. The conducting film that is deposited outside of the VIA1 hole 15a is polished by the CMP method, by using the interlayer insulator 14 as a stopper. As a result, the VIA1 plugs 16a to 16j are formed.

Figure 27:
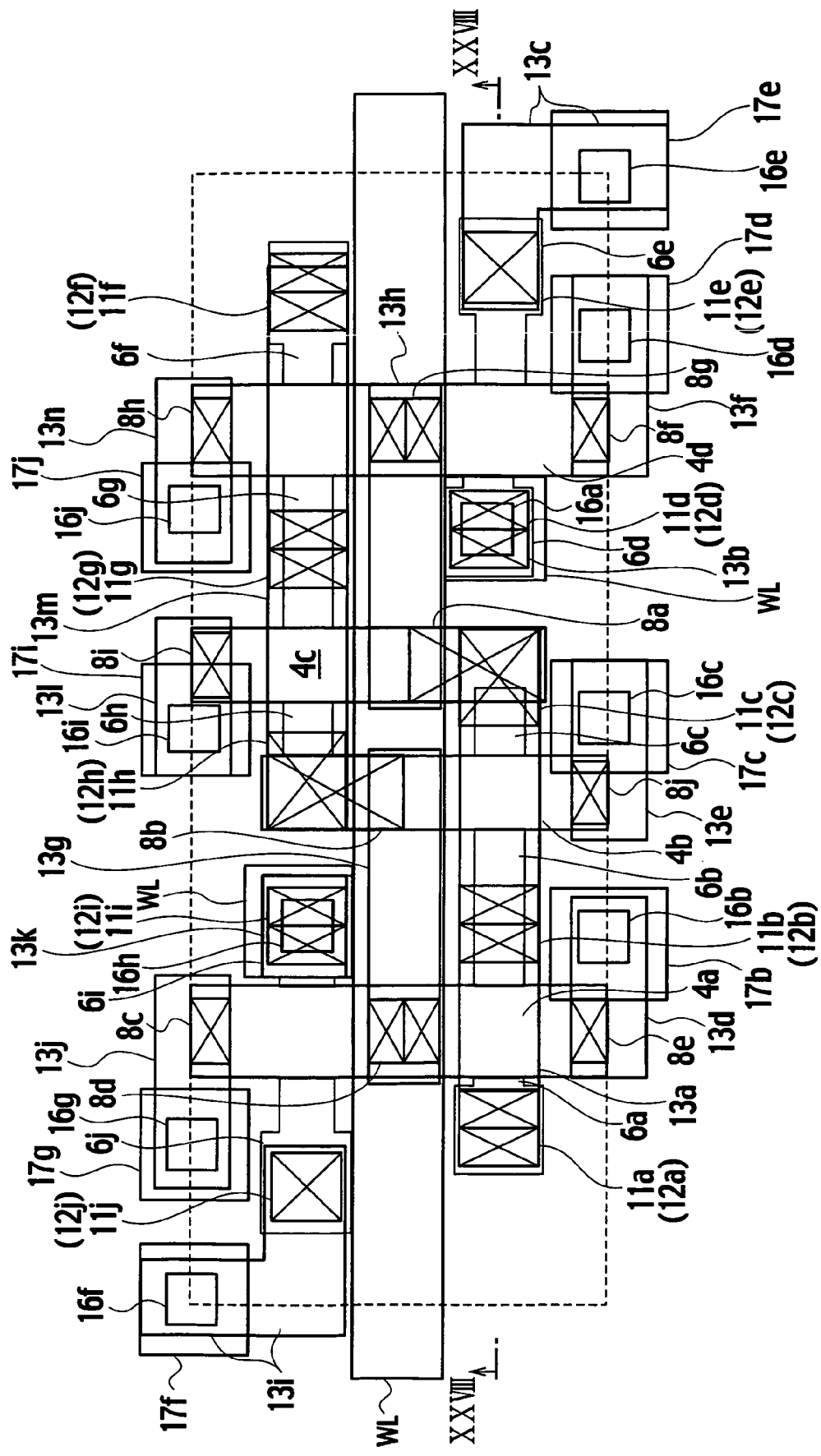
FIG. 27 is a plan view pattern in the fabrication process of the semiconductor memory (No. 3) according to the first embodiment of the present invention.
Figure 28:
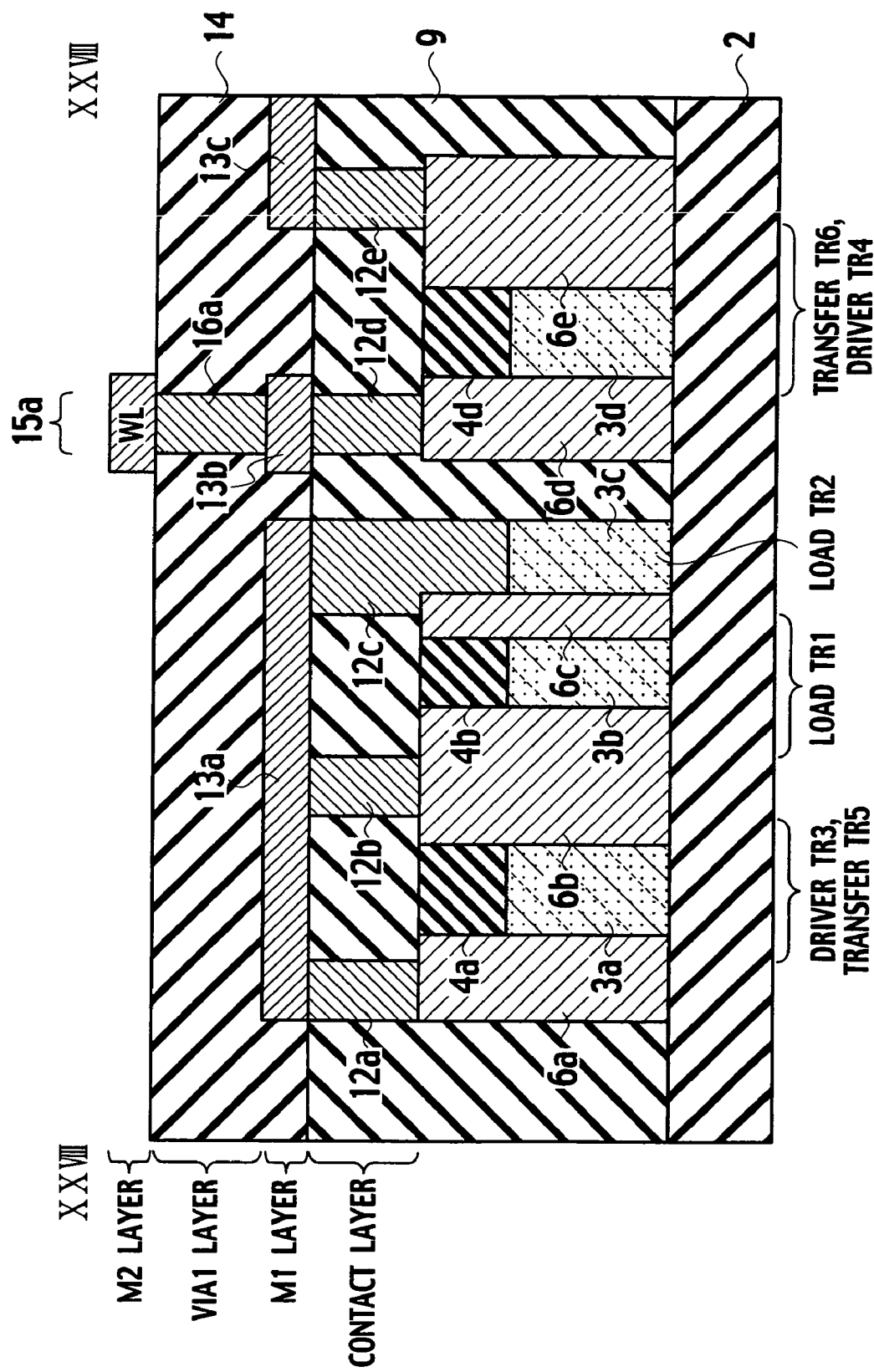
FIG. 28 is a cross-sectional view taken in the line XXVIII-XXVIII of FIG. 27 in the fabrication process of the semiconductor memory (No. 1) according to the first embodiment of the present invention.

As shown in FIG. 27 and FIG. 28, the conducting film used for the word line WL and the M2 electrode layer is deposited on the interlayer insulator 14 by the sputtering technique. The resist film is formed on the conducting film, and the resist film is patterned by the lithography method. The resist film is patterned according to the pattern of the word line WL and the M2 electrode layers 17b to 17g, 17l and 17j. The conducting film is etched through the RIE technology with the resist film as a mask and the interlayer insulator 14 as a stopper. As a result, the pattern of the word line WL and the M2 electrode layers 17b to 17g, 17i and 17j are formed.

Figure 29:
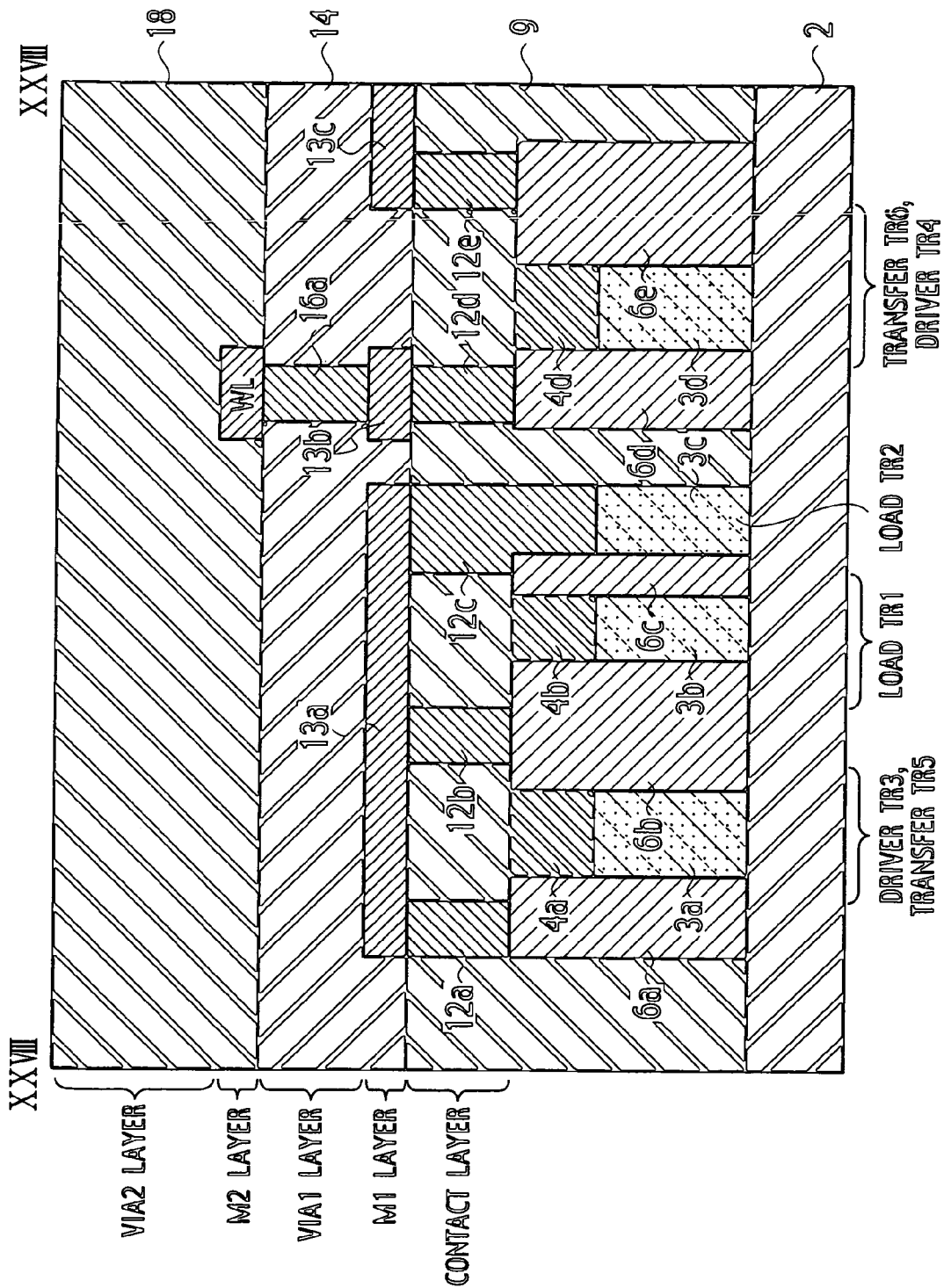
FIG. 29 is a cross-sectional view taken in the line XXVIII-XXVIII of FIG. 27 in the fabrication process of the semiconductor memory (No. 2) according to the first embodiment of the present invention.

As shown in FIG. 29, the silicon oxide film used for the interlayer insulator 18 is deposited on the interlayer insulator 14, the word line WL, and the M2 electrode layers 17b to 17g, 17i and 17j by the CVD method. The surface of the interlayer insulator 18 is planarized by the CMP method. The resist film is formed on the interlayer insulator 18, and the resist film is patterned by the lithography method. The resist film is patterned according to the pattern of the VIA2 plugs 19a to 19h. The area of the VIA2 plugs 19a to 19h of the interlayer insulator 18 is etched by the RIE technology, by using the resist film as a mask and the word line WL and the M2 electrode layers 17b to 17g, 17i and 17j as a stopper. As a result, the VIA2 hole is formed. The conducting film used for the VIA2 plugs 19a to 19h is deposited by the CVD method, and the conducting film is embedded in the VIA2 hole. The conducting film that is deposited outside of the VIA2 hole is polished by the CMP, by using the interlayer insulator 18 as a stopper. As a result, the VIA2 plugs 19a to 19h are formed.

Figure 30:
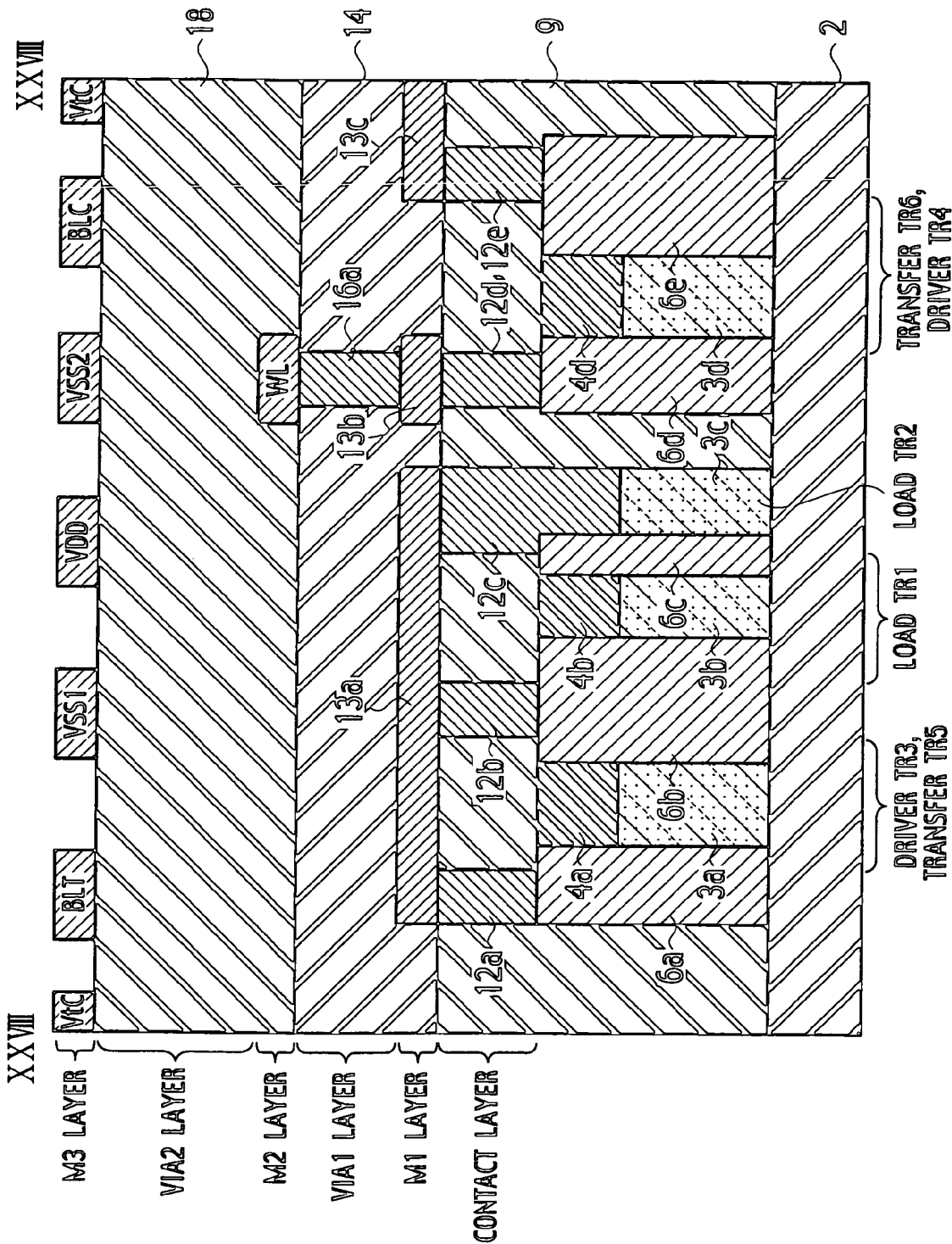
FIG. 30 is a cross-sectional view taken in the line XXVIII-XXVIII of FIG. 27 in the fabrication process of the semiconductor memory (No. 3) according to the first embodiment of the present invention.

As shown in FIG. 30, the conducting film used for the threshold voltage control line VtC, the bit lines BLT and BLC, the ground lines VSS1 and VSS2 for the ground level, and the power supply voltage VDD is deposited on the silicon oxide film of the interlayer insulator 18 by the sputtering technique. The resist film is formed on the conducting film, and the resist film is patterned by the lithography method. The resist film is patterned according to the pattern of the threshold voltage control line VtC, the bit lines BLT and BLC, the ground lines VSS1 and VSS2 for the ground level, and the power supply voltage VDD. The conducting film is etched by the RTE technology, by using the resist film as mask and the interlayer insulator 18 as a stopper. As a result, the threshold voltage control line VtC, the bit lines BLT and BLC, the power supply electrical potentials VSS1 and VSS2 for the ground level, and the power supply electrical potential VDD are formed. And then, the threshold voltage control line VtC is formed orthogonal to the word line WL. And then, compared with the conventional type, the area of the added part of the SRAM Cell can be minimized by sharing the threshold voltage control line VtC with the adjacent SRAM Cell in the direction elongating with the word line WL.

As shown in FIG. 4 and FIG. 5, the silicon oxide film and the silicon-nitride film used for the passivation layer 20 are deposited on the interlayer insulator 18, the threshold voltage control line VtC, the bit lines BLT and BLC, the ground lines VSS1 and VSS2 for the ground level, and the power supply voltage VDD by the CVD method. The fabrication method of the semiconductor memory of the first embodiment is completed by the above-mentioned step.

Although the electrode wiring explained above is fabricated by patterning the conducting film by the etching method, it is needless to say, a damascene method can be applied for the fabrication of the electrode wiring. In the damascene method, the interlayer insulator is previously etched to form a trench, and the metal layer is deposited to fill over the trench. And then, the surface of the metal layer is planarized by the CMP method. As a result, the metal electrode wiring is formed.

Second Embodiment

Figure 31:
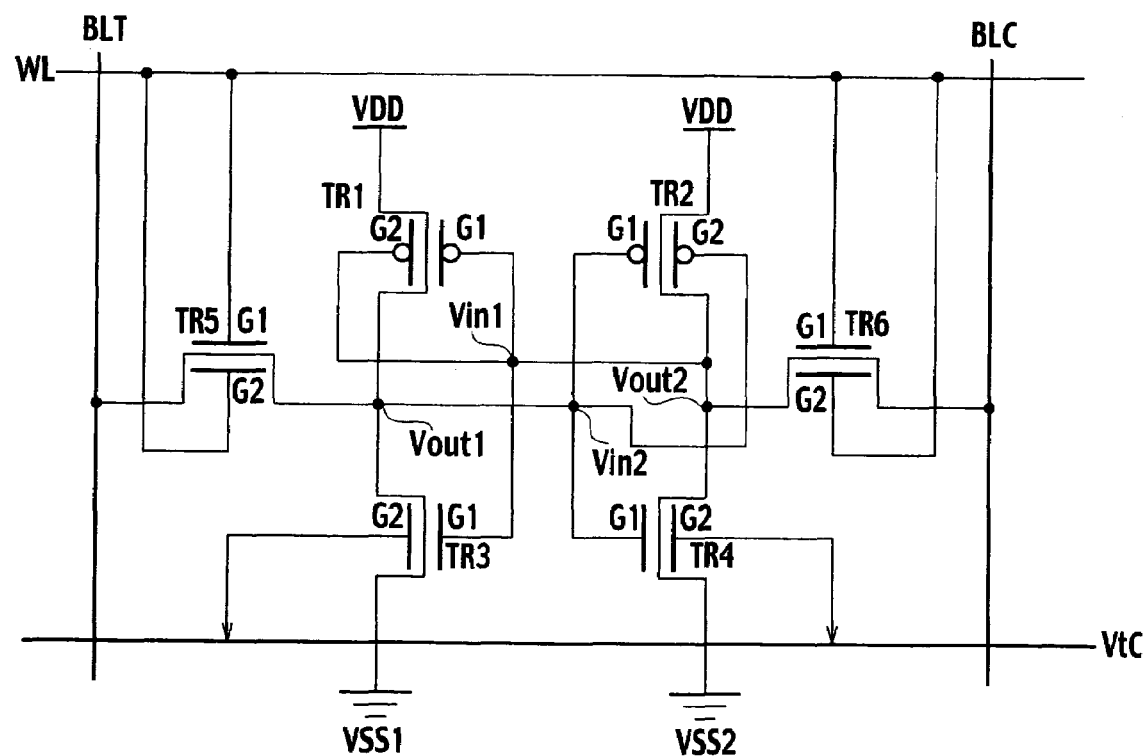
FIG. 31 is a circuit diagram of a semiconductor memory according to a second embodiment of the present invention.

A semiconductor memory according to the second embodiment of the present invention includes a SRAM Cell as shown in FIG. 31. The SRAM Cell includes six transistors TR1 to TR6 similar to the SRAM Cell shown in FIG. 1 of the first embodiment. However, in the second embodiment, the connecting destination of the gate electrode G2 of the transistor TR3 to TR6 is different from the first embodiment. In the second embodiment, the gate electrode G2 of the driver transistor TR3 is connected with the threshold voltage control line VtC. The gate electrode G2 of the driver transistor TR4 is also connected with the threshold voltage control line VtC. The gate electrode G2 of the transfer transistor TR5 is connected with the word line WL with the gate electrode G1 of the transfer transistor TR5. The gate electrode G2 of the transfer transistor TR6 is connected with the word line WL with the gate electrode G1 of the transfer transistor TR6.

In the semiconductor memory according to the second embodiment, it also proposes to use the back-gate type, so-called the separated-gate type Fin FETs (TR3, TR4) of the double-gate, as shown in FIG. 31 as a method of configuring the SRAM Cell by using the Fin FET. In FIG. 31, the threshold voltage control line VtC is connected with the gate electrode G2 that is the back-gate of the driver transistor TR3 and is connected with the gate electrode G2 that is the back-gate of the driver transistor TR4. The gate electrodes G1 and G2 of the load transistor TR1, and the gate electrodes G1 and G2 of the load transistor TR2 connect with the gate electrode G1 that is a top gate of the driver transistor TR3, and the gate electrode G1 that is a top gate of the driver transistor TR4, respectively. Thus, a different voltage is applied in the gate electrodes G1 and G2 of the driver transistor TR3. A different voltage is also applied in the gate electrodes G1 and G2 of the driver transistor TR4.

Figure 32:
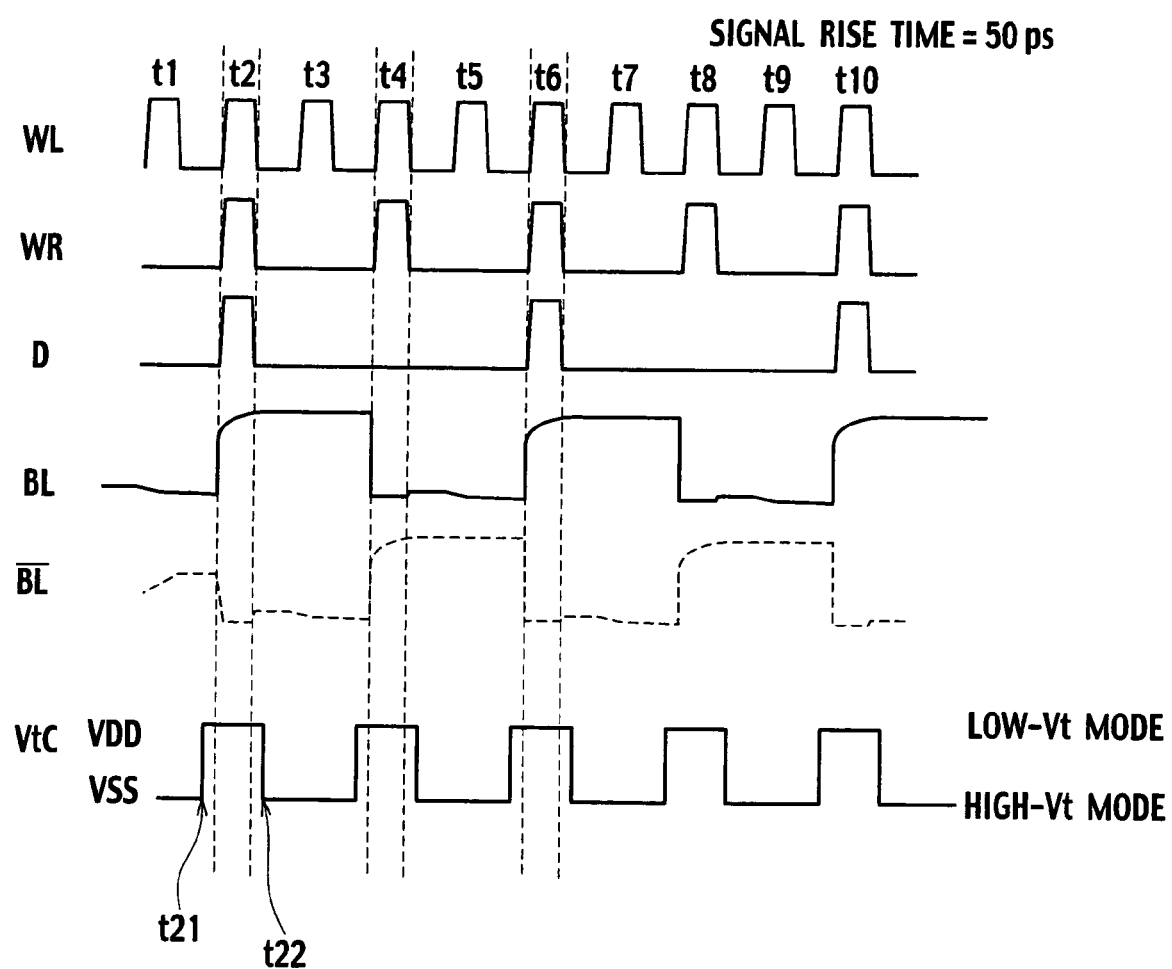
FIG. 32 is a timing chart of a signal line of the semiconductor memory according to the second embodiment of the present invention.

As shown in FIG. 32, the signal voltage applied to the threshold voltage control line VtC changes synchronizing with the write enable signal WR of the SRAM Cell. The second gate electrodes G2 of the driver transistor TR3 and the driver transistor TR4 are connected with the threshold voltage control line VtC. Therefore, the applied voltage for the second gate electrodes G2 of the driver transistor TR3 and the driver transistor TR4 changes synchronizing with the write enable signal WR of the SRAM Cell, and the value of the threshold voltage of the driver transistors TR3 and TR4 becomes low synchronizing with write enable signal WR.

The device characteristic of the driver transistor TR3 and the driver transistor TR4 can be changed at the time of writing mode and at the time of data storing mode, by changing the applied signal voltage to threshold voltage WR.

The back-gate type MOSFET is used for driver transistor TR3 and driver transistor TR4. The voltage for about half the value of the power supply voltage VDD is applied to the threshold voltage control line VtC, and the voltage for about half the value of the power supply voltage VDD is applied to the gate electrode G2 of the driver transistor TR3 and the driver transistor TR4, as the low threshold voltage (low-Vt) mode at the time of writing the SRAM Cell. As a result, the value of the threshold voltage relating to the gate electrode G1 of the driver transistor TR3 and the driver transistor TR4 can be reduced, and a large amount of current can be conducting through the driver transistor TR3 and the driver transistor TR4.

Furthermore, the more large voltage for about the value of the power supply voltage VDD is applied to the threshold voltage control line VtC, and the voltage for about the value of the power supply voltage VDD is applied to the gate electrode G2 of the driver transistor TR3 and the driver transistor TR4, as the low threshold voltage (low-Vt) mode at the time of writing the SRAM Cell. It is possible to conduct the larger amount of current through the driver transistor TR3 and the driver transistor TR4 by realizing the both sides channel that the channel is generated on both sides of the gate electrode G1 side and the gate electrode G2 side.

On the other hand, the voltage for about ground lines voltage control line VtC, as the high threshold voltage (high-Vt) mode at the time of storing data in the SRAM Cell. Therefore, the value of threshold voltage relating to the gate electrode G1 of the driver transistor TR3 and the driver transistor TR4 can be increased, the value of the leakage current can be reduced, and the SNM can be improved.

In addition, it is necessary to set the value of the voltage for the threshold voltage control line VtC to the 'High side' in large or more than the value of the potential voltage applied to the word line WL, in the low threshold voltage (low-Vt) mode. As a result, the value of the threshold voltage of the driver transistor TR3 and the driver transistor TR4 can be decreased, and the value of the current drive of the driver transistor TR3 and the driver transistor TR4 can be increased more than the value of the current drive of the transfer transistor TR5 and the transfer transistor TR6.

Thus, the beta ratio of the current drive of the driver transistor to the current drive of the transfer transistor can be changed by the series of time variation.

As a result, the SNM can be increased as shown in FIG. 2. That is, if the electrical current is conducting with the driver transistor TR3, it becomes vertical steep in input-output characteristics 31 of the input voltage Vin1 and the output voltage Vout1 of the first inverter that configures a flip-flop F/F in the SRAM Cell. Therefore, the SNM can be increased, since the curve 31 under loop 34 of lower right of the butterfly curve becomes a convex more below and it obtains the more operating margins.

When the electric current is conducting with the driver transistor TR4, the value of the output voltage Vout2 decreases steep in the input-output characteristics 32 of the input voltage Vin2 and the output voltage Vout2 of the second inverter that configures the flip-flop F/F. Therefore, the SNM can be increased since curve 32 under loop 33 of upper left of the butterfly curve becomes a convex more below and it obtains the more operating margins.

As well as the first embodiment of the present invention, the signal voltage applied to the threshold voltage control line VtC precedes the timing of writing/reading the memory cell, and the threshold voltage Vt of the driver transistors TR3 and TR4 is set at earlier time at the timing of writing/reading the memory cell.

Figure 33:
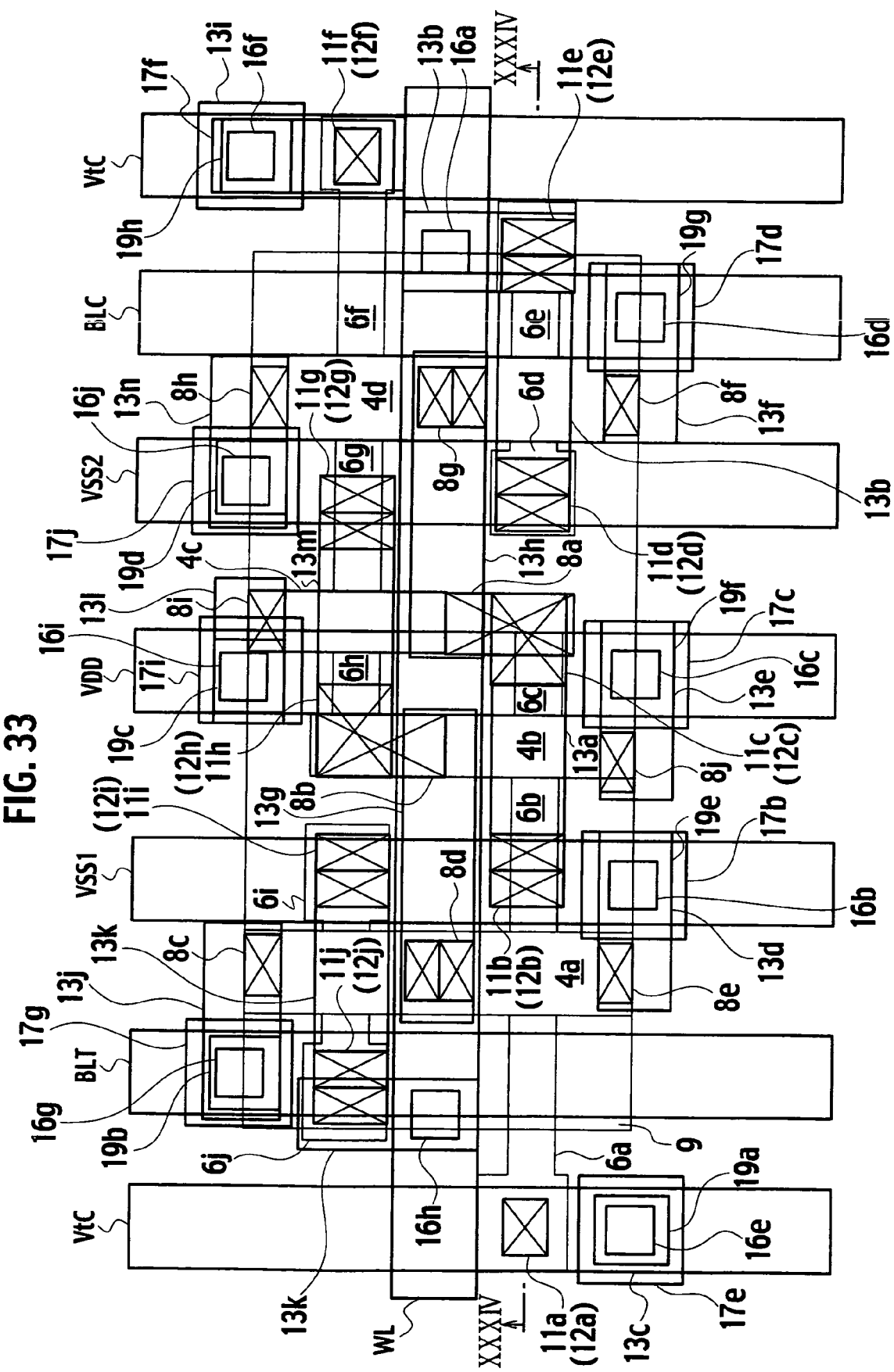
FIG. 33 is a plan view pattern of the semiconductor memory according to the second embodiment of the present invention.
Figure 34:
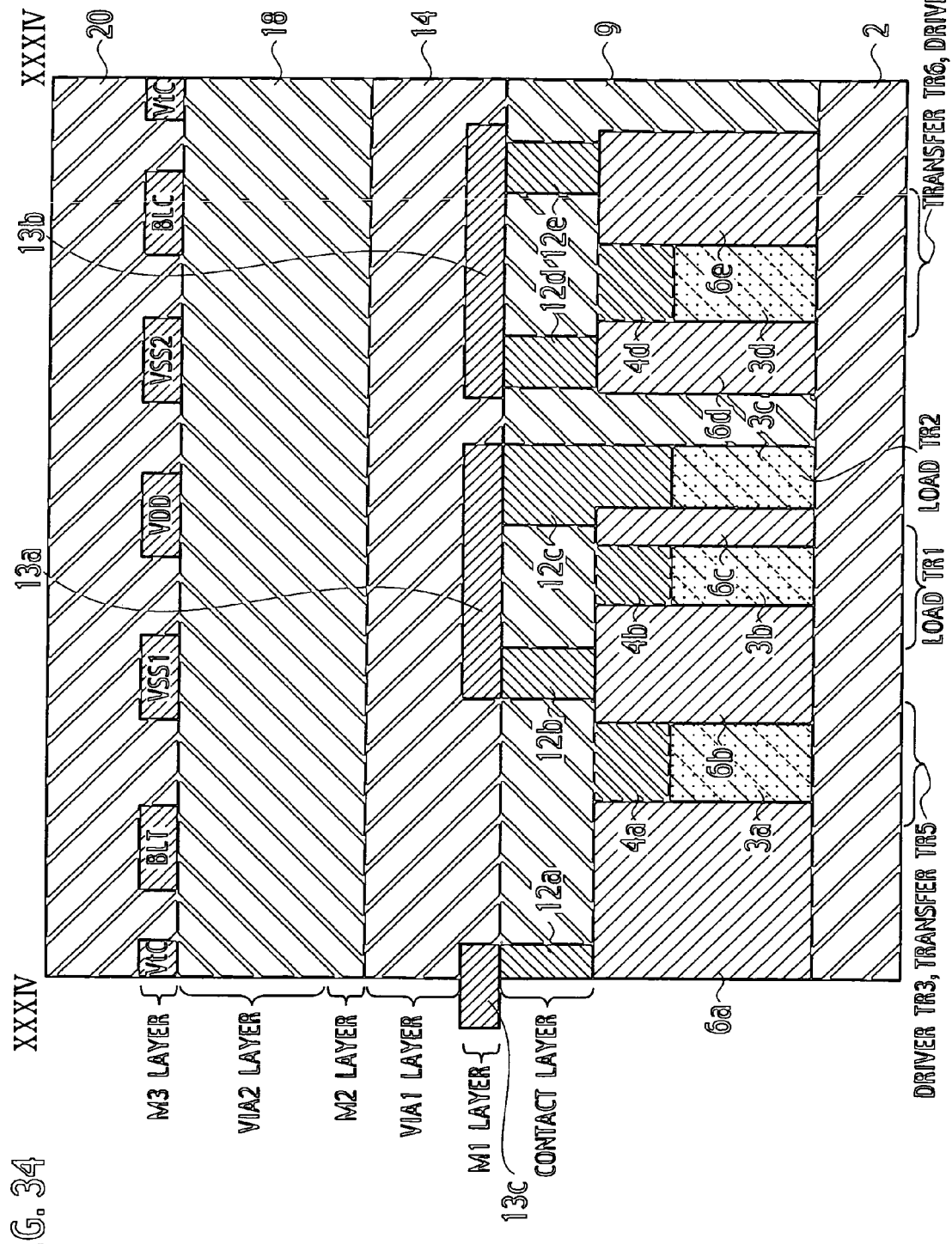
FIG. 34 is a cross-sectional view taken in the line XXXIV-XXXIV of FIG. 33.

As shown in FIG. 33 and FIG. 34, in the semiconductor memory according to the second embodiment of the present invention, silicon Fins 3a to 3d are provided on a silicon oxide layer 2. It may be similarly to the first embodiment of the present invention for the silicon Fins 3a to 3d.

The silicon Fin 3a is used for the active area of the driver transistor TR3 and the active area of the transfer transistor TR5. The silicon Fin 3b is used for the active area of the load transistor TR1. The silicon Fin 3c is used for the active area of the load transistor TR2. The silicon TR4 and the active area of the transfer transistor TR6.

The cap layers 4a to 4d are provided on the silicon Fins 3a to 3d, respectively. It may be similarly to the first embodiment of the present invention for the cap layers 4a to 4d.

The gate electrodes 6a to 6j are provided on the silicon oxide layer 2. The structure of the gate electrodes 6a and 6f is different from the structure of the gate electrodes 6a and 6f of the first embodiment of the present invention, and the gate electrodes 6a and 6f are provided under the threshold voltage control line VtC. It may be similarly to the first embodiment for other gate electrodes 6b to 6e and 6g to 6j.

M1 electrode layers 13a to 13n are provided on the interlayer insulator 9, the contact plugs 8a to 8j, and the contact plugs 12a to 12j.

The M1 electrode layer 13a connects the gate electrodes 6b and 6c. As a result, the gate electrode G1 of the driver transistor TR3 is connected with the gate electrodes G1 and G2 of the load transistor TR1.

The M1 electrode layer 13m connects the gate electrodes 6g and 6h. As a result, the gate electrodes G1 and G2 of the load transistor TR2 are connected with the gate electrode G1 of the driver transistor TR4.

The M1 electrode layer 13b connects the gate electrodes 6d and 6e. As a result, the gate electrodes G1 and G2 of the load transistor TR6 are connected.

The M1 electrode layer 13k connects the gate electrodes 6i and 6j. As a result, the gate electrodes G1 and G2 of the transfer transistor TR5 are connected.

On the other hand, neither gate electrodes 6a nor 6b are connected by the M1 electrode layers. As a result, both of the gate electrodes G1 and G2 of the driver transistor TR3 are not connected, and the driver transistor TR3 is separated-gate type double-gate FET. Similarly, since neither gate electrodes 6g nor 6f are connected, neither the gate electrodes G1 nor G2 of the driver transistor TR4 are connected. Therefore, the driver transistor TR4 is separated-gate type double-gate FET.

The word line WL and the M2 electrode layers 17b to 17g, 17i and 17j are provided on the interlayer insulator 14 and the VIA1 plugs 16a to 16j. The word line WL is connected with the gate electrodes 6d and 6e through the VIA1 plug 16a, the M1 electrode layer 13b, and the contact plugs 12d and 12e. As a result, the gate electrodes G1 and G2 of the transfer transistor TR6 are connected with the word line WL.

Moreover, the word line WL is connected with the gate electrodes 6i and 6j through the VIA1 plug 16h, the M1 electrode layer 13k, and the contact plugs 12l and 12j. As a result, the gate electrodes G1 and G2 of the transfer transistor TR5 are connected with the word line WL.

The threshold voltage control lines VtC, the bit lines BLT and BLC, the ground lines VSS1 and VSS2 for the ground level, and the power supply voltage VDD are provided on the interlayer insulator 18 and the VIA2 plugs 19a to 19h. The threshold voltage control line VtC is connected with the gate electrode 6a through the VIA2 plug 19a, the M2 electrode layer 17e, the VIA1 plug 16e, the M1 electrode layer 13c, and the contact plug 12a.

As a result, the gate electrode G2 of the driver transistor TR3 is connected with the threshold voltage control line VtC. Moreover, the threshold voltage control line VtC is connected with the gate electrode 6f through the VIA2 plug 19h, the M2 electrode layer 17f, the VIA1 plug 16f, the M1 electrode layer 13i, and the contact plug 12f. As a result, the gate electrode G2 of the driver transistor TR4 is connected with the threshold voltage control line VtC.

In the SRAM Cell, all of the transistors TR1 to TR6 have the first gate electrode G1 and the second gate electrode G2. As for the transistors TR1, TR2, TR5 and TR6, the first gate electrode G1 and the second gate electrode G2 are connected through the M1 electrode layer. As for the driver transistors TR3 and TR4, the electrode layer is provided for a different voltage to be given to the first gate electrode G1 and the second gate electrode G2.

In the SRAM Cell of the semiconductor memory according to the second embodiment, the driver transistors TR3 and TR4 that has back-gate type, so-called separated-gate type structure, and the transistors TR1, TR2, TR5 and TR6 that has common-gate type structure are embedded.

Moreover, until the fabrication process of the gate electrodes G1 and G2, the SRAM Cell can be configured with the double-gate type Fin transistor of the same structure. As a result, a plurality of gate electrodes of the same structure and a plurality of Fins of the same structure are only formed during the course of the processing of a plurality of Fin FETs. Therefore, an enough process margins can be allowed for the lithography processing.

If the structure of the gate electrode and the Fin are various, the fabrication processing becomes complex. Moreover, the number of control parameters in the fabrication processing increases, and then the process margins become small and the fabrication processing steps become difficult.

In the SRAM Cell, the threshold voltage control line VtC that provides the voltage to the second gate electrode G2 is located orthogonal to the word line WL. The SRAM Cell according to the second embodiment can be configured as well as the first embodiment, while following the layout of the conventional type since the threshold voltage control line VtC intersects with the word line WL. If the threshold voltage control line VtC is located in parallel to the word line WL, it is necessary to increase the number of metal layers or it is necessary to bend the word line WL. Therefore, it is disadvantageous in the processing yield of the semiconductor memory.

In the SRAM Cell, the threshold voltage control line VtC that provides the voltage to the second gate electrode G2 of the driver transistors TR3 and TR4 is shared with an adjacent cell. That is, the semiconductor memory has a plurality of adjacent SRAM Cells mutually sharing the threshold voltage control line VtC.

The threshold voltage control line VtC that provides the voltage to the second gate electrode G2 of the driver transistor TR3/TR4 of a certain SRAM Cell is shared with the threshold voltage control line VtC that provides the voltage to the second gate electrode G2 of the driver transistor TR3/TR4 of an adjacent SRAM Cell in the direction elongating with the word line WL.

The minimization of the area can be achieved by sharing the threshold voltage control line VtC with an adjacent SRAM Cell. Although the VSS line was shared in the conventional type, two VSS lines are provided in the cell in the layout of the second embodiment.

(Fabrication Method)

Next, the fabrication method for the semiconductor memory according to the second embodiment of the present invention will be explained.

Basically, the fabrication method of the semiconductor memory according to the second embodiment is similar to the fabrication method of the semiconductor memory according to the first embodiment. A different point is the shape of the mask for forming the pattern of the silicon Fins 6a to 6j. Different other respects in the first embodiment and the second embodiment are: the shape of the mask of the contact layer for forming the pattern of the contact plugs 12a to 12; the shape of mask of the M1 layer for forming the pattern of the M1 electrode layers 13a to 13n; the shape of mask of the VIA1 layer for forming the pattern of the VIA1 plugs 16a to 16j; the shape of mask of the M2 layer for forming the pattern of the word line WL and the M2 electrode layers 17b to 17g, 17i and 17j; and the shape of the mask of the VIA2 layer for forming the pattern of plugs 19a to 19h.

Figure 35:
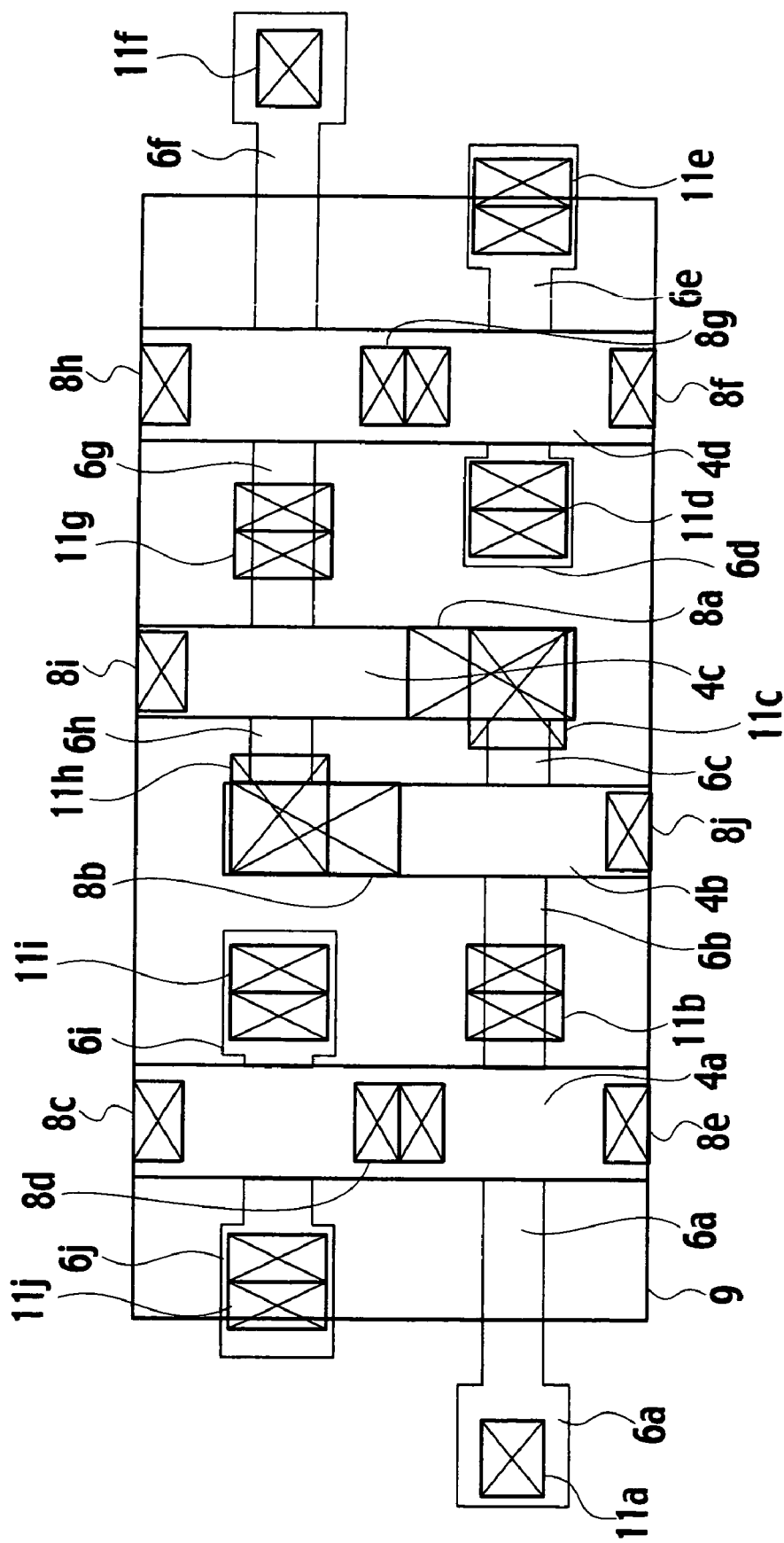
FIG. 35 is a plan view pattern in the fabrication process of the semiconductor memory (No. 1) according to the second embodiment of the present invention.

More specifically, the comparison of the semiconductor memory of the second embodiment shown in FIG. 35 and the semiconductor memory of the first embodiment in FIG. 19 is tried after the contact holes 11a to 11j are formed, respectively. The shape of the pattern of the silicon Fins 6a and 6f and the shape of pattern of the contact holes 11a and 11f are different in the first embodiment and the second embodiment.

Figure 36:
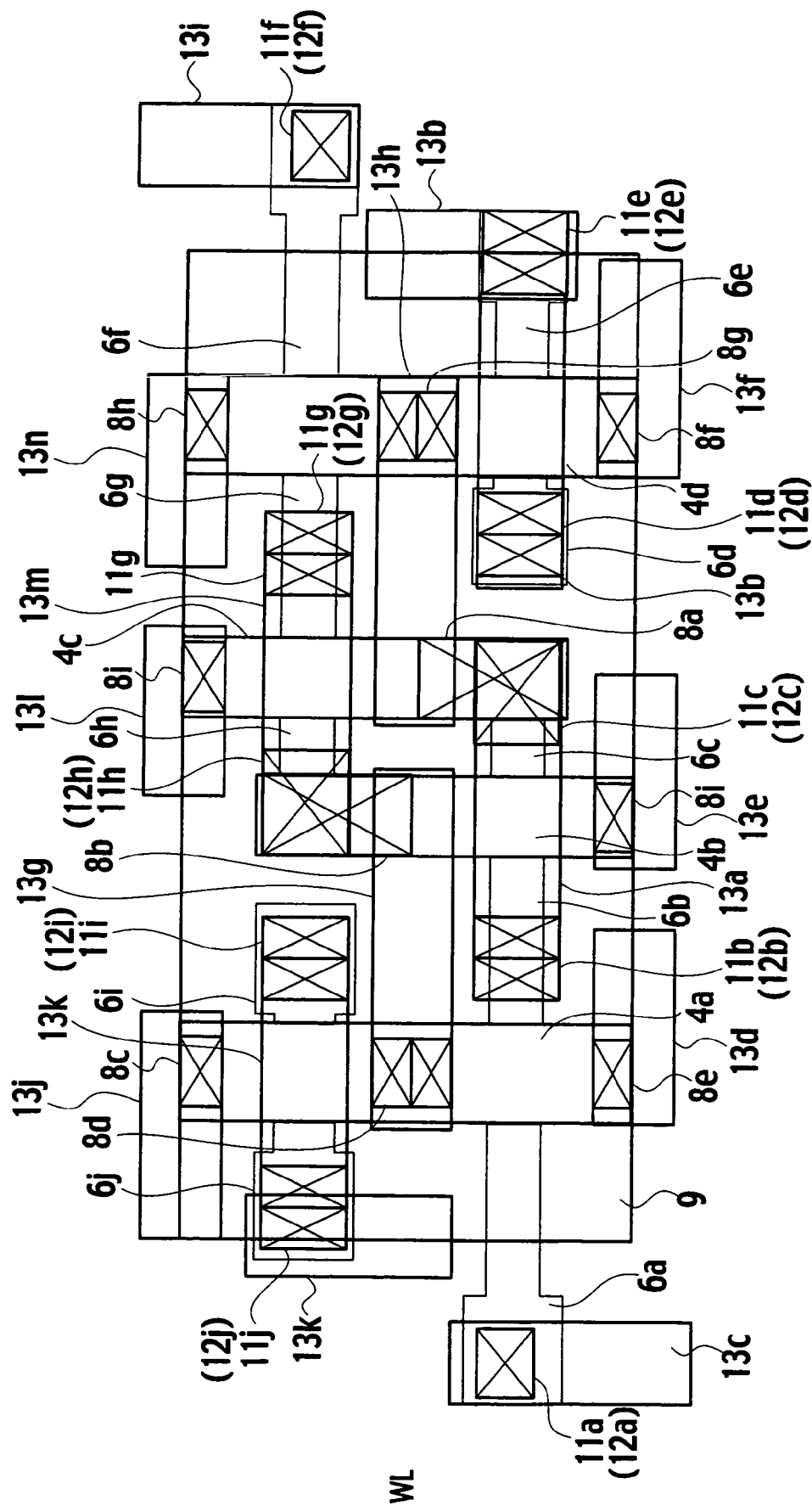
FIG. 36 is a plan view pattern in the fabrication process of the semiconductor memory (No. 2) according to the second embodiment of the present invention.

Moreover, comparing of the semiconductor memory of the second embodiment shown in FIG. 36 and the semiconductor memory of the first embodiment shown in FIG. 22 is tried after the M1 electrode layers 13a to 13n are formed in each memory. About M1 electrode layer 13a, although neither gate electrodes 6a nor 6b are connected in the second embodiment, the gate electrode 6a and 6b are connected in the first of the driver transistor TR3 are connected in the second embodiment.

About the M1 electrode layer 13m, although neither gate electrodes 6g nor 6f are connected in the second embodiment, the gate electrodes 6g and 6f are connected in the first embodiment. As a result, neither gate electrodes G1 nor G2 of the driver transistor TR4 are connected in the second embodiment.

On the other hand, although the gate electrodes 6i and 6j of the M1 electrode layer 13k are connected in the second embodiment, neither gate electrodes 6i nor 6j are connected in the first embodiment. As a result, the gate electrodes G1 and G2 of the transfer transistor TR5 are connected in the second embodiment.

About M1 electrode layer 13b, although the gate electrodes 6d and 6e are connected in the second embodiment, neither gate electrodes 6d nor 6e are connected in the first embodiment. As a result, the gate electrode G1 and G2 of the transfer transistor TR6 are connected in the second embodiment.

Figure 37:
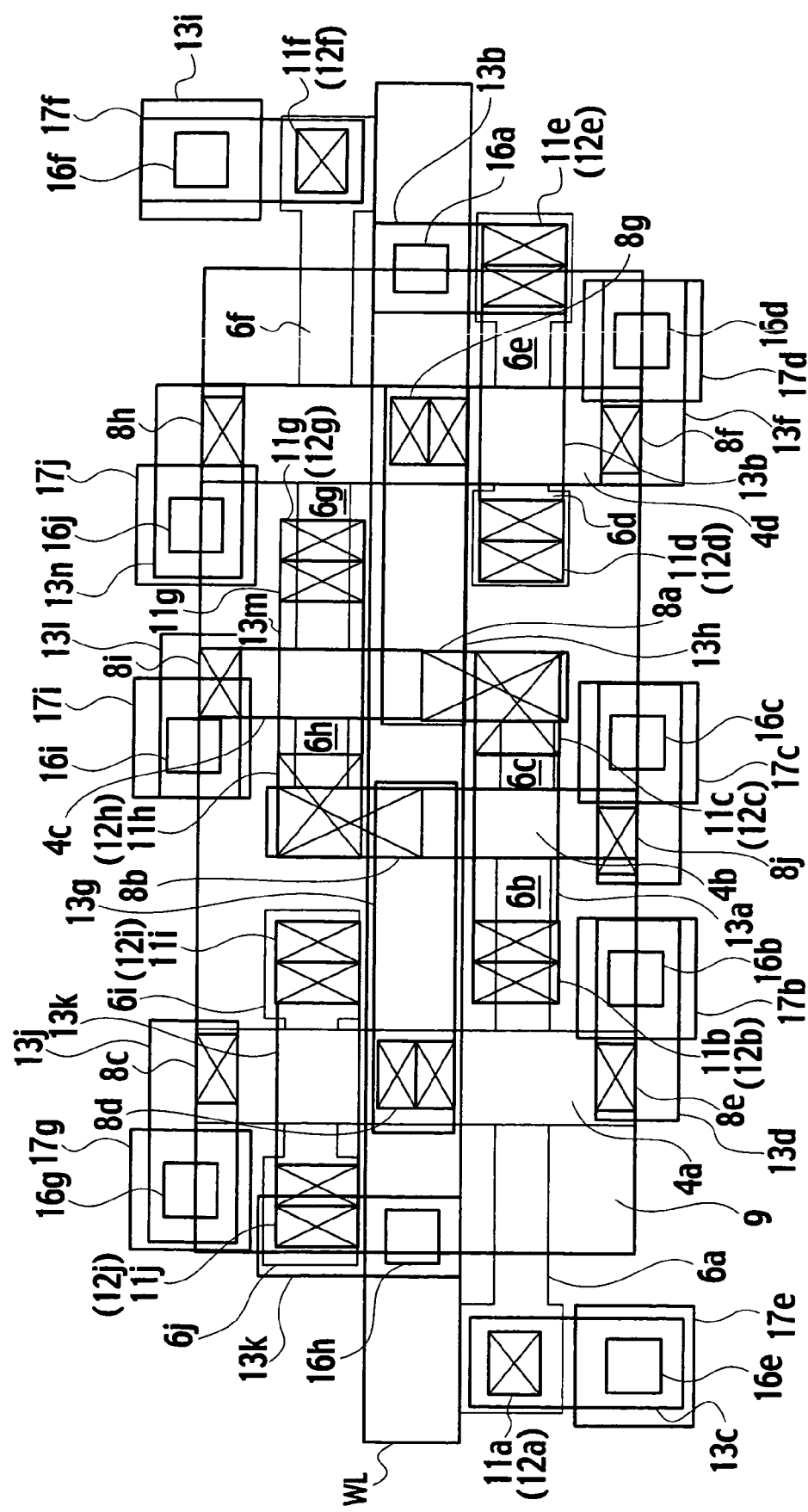
FIG. 37 is a plan view pattern in the fabrication process of the semiconductor memory (No. 3) according to the second embodiment of the present invention.

Moreover, the comparison of the semiconductor memory of the second embodiment shown in FIG. 37 and the semiconductor memory of the first embodiment shown in FIG. 27 is tried after the word line WL and the M2 electrode layers 17b to 17g, 17i and 17j are formed, respectively.

Although the word line WL is connected with the gate electrodes 6i and 6j through the VIA1 plug 16h and the M1 electrode layer 13k in the second embodiment, the word line WL does not connect with gate electrode 6j although the word line WL is connected with the gate electrode 6i in the first embodiment. As a result, the gate electrodes G1 and G2 of the transfer transistor TR5 are connected with the word line WL in the second embodiment.

Moreover, although the word line WL is connected with the gate electrodes 6d and 6e through the VIA1 plug 16a and the M1 electrode layer 13b in the second embodiment, the word line WL does not connect with the gate electrode 6e although the word line WL is connected with the gate electrode 6d in the first embodiment. As a result, the gate electrodes G1 and G2 of the transfer transistor TR6 are connected with the word line WL in the second embodiment.

Moreover, comparing of the semiconductor memory according to the second embodiment shown in FIG. 33 and the semiconductor memory according to the first embodiment is tried after the threshold voltage control line VtC, the bit lines BLT and BLC, the ground lines VSS1 and VSS2 at the ground level, and the power supply voltage line VDD are formed, respectively.

About the threshold voltage control line VtC, although it connects with the gate electrode 6a through the VIA2 plug 19a, the M2 electrode layer 17e, the VIA1 plug 16e, the M1 electrode layer 13c, and the contact plug 12a in the second embodiment, it connects with the gate electrode 6j through the VIA2 plug 19a, the M2 electrode layer 17f the VIA1 plug 16f, the M1 electrode layer 13i, and the contact plug 12j in the first embodiment.

Moreover, about the threshold voltage control line VtC, although it connects with the gate electrode 6f through the VIA2 plug 19h, the M2 electrode layer 17f, the VIA1 plug 16f, the M1 electrode layer 13i, and the contact plug 12f in the second embodiment, it connects with the gate electrode 6e through the VIA2 plug 19h, the M2 electrode layer 17e, the VIA1 plug 16e, the M1 electrode layer 13c, and the electric contact plug 12e in the first embodiment.

As well as the first embodiment, until the fabrication process of the gates electrode G1 and G2, all of the transistors TR1 to TR6 can be configured with the back-gate Fin FETs of the same structure. Therefore, a plurality of gate electrodes of the same structure and a plurality of Fins of the same structure are only formed during the course of the processing of a plurality of Fin FETs. Therefore, enough process margins can be allowed for the lithography processing.

If the structure of the gate electrode and the Fin are various, the fabrication processing becomes complex. Moreover, the number of control parameters in the fabrication processing increases, and then the process margins become small and the improvement of the fabrication processing yield of the semiconductor memory becomes difficult.

And then, the transistors TR1, TR2, TR5 and TR6 used as the usual (narrowly-defined) double-gate MOSFET can be used by connecting both electrodes of the first gate electrode G1 that is top gate and the second gate electrode G2 that is back gate, at the M1 metal electrode layers 13a, 13m, 13k and 13b applying the same voltage.

As for the driver transistors TR3 and TR4 used as the back-gate type MOSFET, the gate electrode G1 is connected by the silicon Fins 3b and 3c, and the gate electrode G2 is connected by the threshold voltage control line VtC, by the separated M1 electrode layer.

Thus, the back-gate type Fin FET and usual double-gate Fin FET is fabricated to be divided in one SRAM Cell. That is, all transistors TR1 to TR6 are firstly formed as the back-gate type Fin FET, and then the double-gate Fin FET can be configured by connecting the gate electrodes G1 and G2 by the M1 electrode layer if necessary. In one SRAM Cell, the back-gate type Fin FET and the double-gate Fin FET are consolidated to form the SRAM Cell in the direction elongating with the word line WL.

And then, the threshold voltage control line VtC is formed orthogonal to the word line WL. As compared with the conventional type, the area of the added part of the SRAM Cell can be minimized by sharing the threshold voltage control line VtC with the adjacent SRAM Cell.

In the layout of the second embodiment, the threshold voltage control line VtC is added to the most circumference part of the SRAM Cell as well as the first embodiment basically, and the threshold voltage control line VtC is shared with the adjacent SRAM Cell.

Moreover, since the electrode wiring of the word line WL is configured only by the straight line, the structure of the SRAM Cell becomes simple. Furthermore, all of the transistors TR1 to TR6 can be still configured by the back-gate type Fin FETs. And each top gate is connected with the M1 electrode layer as for the common-connected gate type transistors TR1, TR2, TR5 and TR6 that should not be configured by the back-gate type Fin FETs.

It is configured as the narrowly-defined double-gate Fin FET by connecting the gate electrode G1 and the gate electrode G2 that is back-gate.

Third Embodiment

Figure 38:
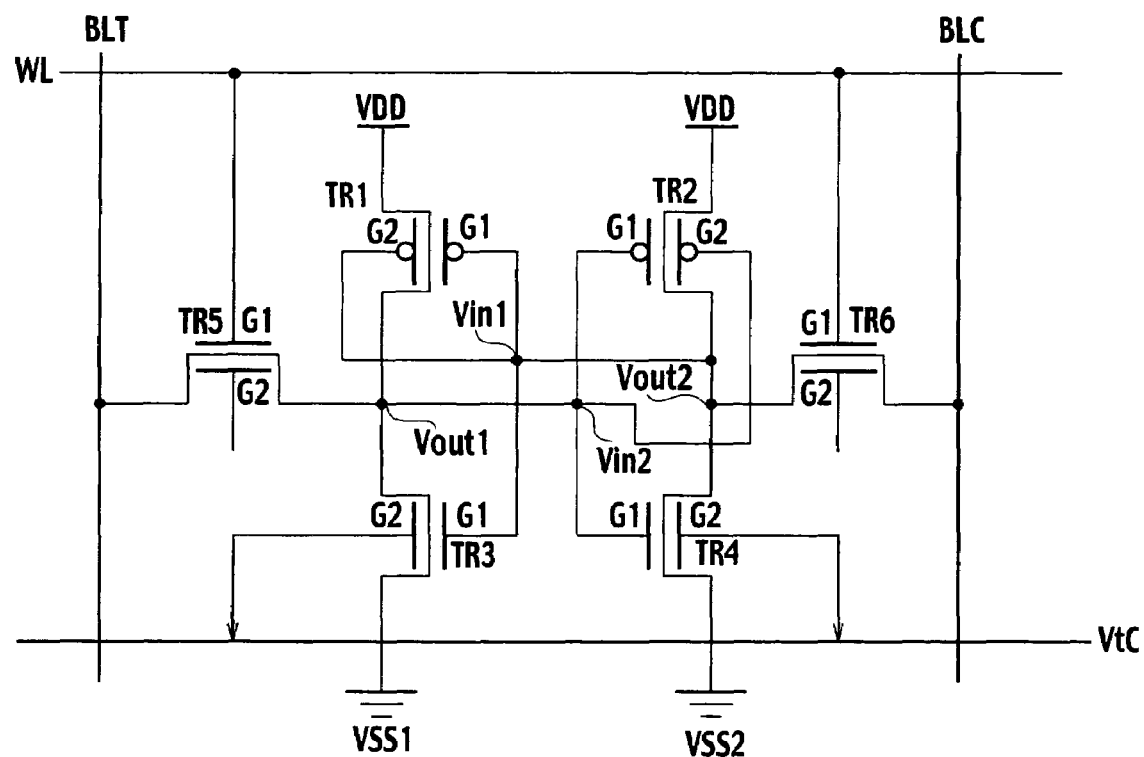
FIG. 38 is a circuit diagram of a semiconductor memory according to a third embodiment of the present invention.

A semiconductor memory according to the third embodiment of the present invention includes a SRAM Cell as shown in FIG. 38. The SRAM Cell includes six transistors TR1 to TR6 similar to the SRAM Cell shown in FIG. 31 of the second embodiment. However, in the third embodiment, the connecting destination of the gate electrode G2 of the transfer transistors TR5 and TR6 is different from the second embodiment.

In the third embodiment, the gate electrode G2 of the transfer transistors TR5 and TR6 are not connected and are made floating states.

In the semiconductor memory according to the third embodiment, it also proposes to use the back-gate type, so-called the separated-gate type Fin FETs (TR3, TR4) of the double-gate, as shown in FIG. 38 as a method of configuring the SRAM Cell by using the Fin FET.

In FIG. 38, the threshold voltage control lines VtC is connected with the gate electrode G2 that is the back-gate of the driver transistor TR3 and is connected with the gate electrode G2 that is the back-gate of the driver transistor TR4.

Respectively, the gate electrodes G1 and G2 of the load transistor TR1, and the gate electrodes G1 and G2 of the load transistor TR2 connect with the gate electrode G1 that is a top gate of the driver transistor TR3, and the gate electrode G1 that is a top gate of the driver transistor TR4.

Thus, a different voltage is applied in the gate electrodes G1 and G2 of the driver transistor TR3. A different voltage is also applied in the gate electrodes G1 and G2 of the driver transistor TR4.

In the third embodiment, the signal voltage applied to the threshold voltage control line VtC also changes synchronizing with the write enable signal WR of the SRAM Cell as well as the second embodiment shown in FIG. 32. The device characteristic of the driver transistor TR3 and the driver transistor TR4 can be changed at the time of writing mode and at the time of data storing mode, by changing the applied signal voltage to threshold voltage control line VtC synchronizing with the write enable signal WR.

Furthermore, although the gate electrode G2 of the transfer transistors TR5 and TR6 is connected with the word line WL in the second embodiment, the gate electrode G2 of the transfer transistors TR5 and TR6 is made floating in the third embodiment.

As a result, in the third embodiment, the current drive of the transfer transistor can be decreased as compared with the second embodiment. And then, in the third embodiment, the beta ratio of the current drive of the driver transistor to the current drive of the transfer transistor can be increased more than the value of the beta ratio in the second embodiment. As a result, the SNM can be increased.

Figure 39:
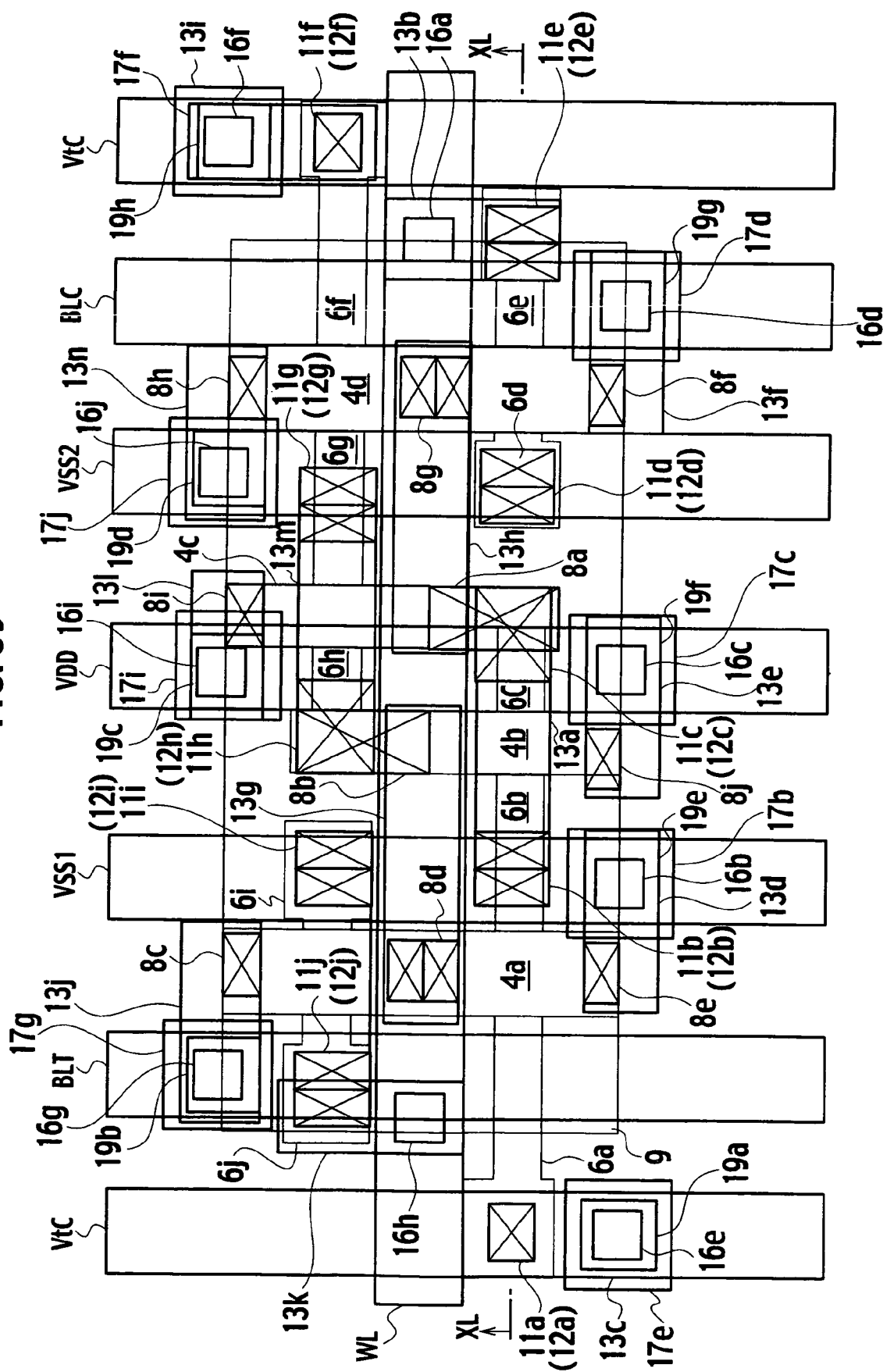
FIG. 39 is a plan view of the semiconductor memory according to the third embodiment of the present invention.

As for the semiconductor memory according to the third embodiment shown in FIG. 38, the silicon Fins 3a to 3d are provided on the silicon oxide layer 2 as shown in FIG. 39 and FIG. 40. It may be similar to the first embodiment for the silicon Fins 3a to 3d and the gate electrodes 6a to 6j. It only has to make the gate electrode 6d floating without any connecting.

Alternatively, even if the contact plug 12d is connected with the gate electrode 6d, it only has to make the gate electrode 6d and contact plug 12d floating with another.

Moreover, the gate electrode 6i is also made floating without any connecting. Alternatively, even if the electric contact plug 12i is connected with the gate electrode 6i, it only has to make the gate electrode 6i and the electric contact plug 12i floating with another.

As well as the first embodiment and the second embodiment, until the fabrication process of the gate electrode, all of the transistors TR1 to TR6 can be configured by the back-gate Fin FETs of the same structure. As a result, a plurality of gate electrodes of the same structure and a plurality of Fins of the same structure are only formed during the course of the processing of a plurality of Fin FETs. Therefore, enough process margins can be allowed for the lithography processing.

Other Embodiments

As described above, the present invention is described according to the first through the third embodiment; however, it should not be perceived that descriptions and drawings forming a part of this disclosure are intended to limit the spirit and scope of the present invention. Various alternative embodiments, working examples, and operational techniques will become apparent from this disclosure for those skills in the art.

For example, all the double-gate type transistor and back-gate type transistors in the SRAM Cell are not limited to the Fin FETs, and the part of the six transistors configuring the SRAM Cell can be realized by the planar-type double-gate MOSFETs.

The basic circuit operation of the SRAM Cell can be realized and a large amount of SNM can be achieved by using the double-gate MOSFETs for the transistor layout pattern and the circuit representation of the SRAM Cell similar to the first embodiment to the third embodiment.

Moreover, the layout pattern of the SRAM Cell of the semiconductor memory of the present invention is not limited to the layout pattern of the first embodiment to the third embodiment. Being possible to configure is needless to say even if another layout pattern is used.

As such, the present invention naturally includes various embodiments not described herein. Accordingly, the technical scope of the present invention is determined only by specified features of the invention according to the following claims that can be regarded appropriate from the above-mentioned descriptions.

What is claimed is:

1. A semiconductor device manufacturing system, a semiconductor memory having a plurality of static random access memory cells, a plurality of word lines, and a plurality of first and second bit lines substantially orthogonal to the word lines, each of the static random access memory cell, comprising:

a first inverter having a first driver transistor and a first load transistor connected in series between a power supply voltage line and a ground line;

a second inverter having a second driver transistor and a second load transistor connected in series between the power supply voltage line and a ground line;

a first transfer transistor connected in series between a first bit line and an output of the first inverter; and a second transfer transistor connected in series between a second bit line and an output of the second inverter, the output of the first inverter being connected to an input of the second inverter and an input of the first inverter being connected to the output of the second inverter, wherein at least one of the first and the second driver transistors, the first and the second load transistors, and the first and the second transfer transistors is configured by a plurality of Fin field effect transistor, and the Fin effect transistor is configured by a separate-gate type double-gate field effect transistor comprising a first gate electrode and a second gate electrode, controlling a voltage for the first gate electrode to form a channel, and controlling a voltage for the second gate electrode to decrease a threshold voltage at the time of writing data, wherein the applied voltage for the second gate electrode changes synchronizing with a write enable signal of the static random access memory cell, and the threshold voltage of the double-gate field effect transistor lowers synchronizing with the write enable signal.

2. The semiconductor memory of claim 1, wherein the applied voltage for the second gate electrode synchronizing with the write enable signal changes from a time earlier than a timing of rising of the write enable signal, and changes until a time later than a timing of falling of the write enable signal.

3. A semiconductor memory having a plurality of static random access memory cells, a plurality of word lines, and a plurality of first and second bit lines substantially orthogonal to the word lines, each of the static random access memory cell, comprising:

a first inverter having a first driver transistor and a first load transistor connected in series between a power supply voltage line and a ground line;

a second inverter having a second driver transistor and a second load transistor connected in series between the power supply voltage line and a ground line;

a first transfer transistor connected in series between a first bit line and an output of the first inverter; and a second transfer transistor connected in series between a second bit line and an output of the second inverter, the output of the first inverter being connected to an input of the second inverter and an input of the first inverter being connected to the output of the second inverter, wherein the first and the second driver transistors, the first and the second load transistors, and the first and the second transfer transistors are configured by a plurality of Fin field effect transistors, and both the first transfer transistor and the second transfer transistor are configured by a separated-gate type double-gate field effect transistor comprising a first gate electrode and a second gate electrode, controlling a voltage for the first gate electrode to form a channel, and controlling a voltage for the second gate electrode to decrease a threshold voltage at the time of writing data, wherein the applied voltage for the second gate electrode changes synchronizing with a write enable signal of the static random access memory cell, and the threshold voltage of the double-gate field effect transistor lowers synchronizing with the write enable signal.

4. The semiconductor memory of claim 3, wherein the applied voltage for the second gate electrode synchronizing with the write enable signal changes from a time earlier than a timing of rising of the write enable signal, and changes until a time later than a timing of falling of the write enable signal.

5. The semiconductor memory of claim 3, wherein the first load transistor is configured to have a first gate electrode and a second gate electrode commonly connected to the input of the first inverter; and the second load transistor is configured to have a first gate electrode and a second gate electrode commonly connected to the input of the second inverter.

6. The semiconductor memory of claim 3, wherein the first driver transistor is configured to have a first gate electrode and a second gate electrode commonly connected to the input of the first inverter; and the second driver transistor is configured to have a first gate electrode and a second gate electrode commonly connected to the input of the second inverter.

7. The semiconductor memory of claim 3, wherein the first gate electrodes of the first transfer transistor and the second transfer transistor are connected to the word line, respectively; and the second gate electrodes of the first transfer transistor and the second transfer transistor are connected to threshold voltage control lines, respectively.

8. The semiconductor memory of claim 7, wherein the threshold voltage control lines are located substantially orthogonal to the word line.

9. The semiconductor memory of claim 8, wherein the threshold voltage control lines are mutually shared with static random access memory cells adjacently disposed in the direction elongating with the word lines.

10. A semiconductor memory having a plurality of static random access memory cells, a plurality of word lines, and a plurality of first and second bit lines substantially orthogonal to the word lines, each of the static random access memory cell comprising:

a first inverter having a first driver transistor and a first load transistor connected in series between a power supply voltage line and a ground line;

a second inverter having a second driver transistor and a second load transistor connected in series between the power supply voltage line and a ground line;

a first transfer transistor connected in series between a first bit line and an output of the first inverter; and a second transfer transistor connected in series between a second bit line and an output of the second inverter, the output of the first inverter being connected to an input of the second inverter and an input of the first inverter being connected to the output of the second inverter, wherein the first and the second driver transistors, the first and the second load transistors, and the first and the second transfer transistors are configured by a plurality of Fin field effect transistors, and both the first driver transistor and the second driver transistor are configured by a separated-gate type double-gate field effect transistor comprising a first gate electrode and a second gate electrode, controlling a voltage for the first gate electrode to form a channel, and controlling a voltage for the second gate electrode to decrease a threshold voltage at the time of writing data, wherein the voltage for the second gate electrode changes synchronizing with a write enable signal of the static random access memory cell, and the threshold voltage of the double-gate field effect transistor lowers synchronizing with the write enable signal.

11. The semiconductor memory of claim 10, wherein the voltage for the second gate electrode synchronizing with the write enable signal changes from a time earlier than a timing of rising of the write enable signal, and changes until a time later than a timing of falling of the write enable signal.

12. The semiconductor memory of claim 10, wherein the first load transistor is configured to have a first gate electrode and a second gate electrode commonly connected to the input of the first inverter; and the second load transistor is configured to have a first gate electrode and a second gate electrode commonly connected to the input of the second inverter.

13. The semiconductor memory of claim 10, wherein the first transfer transistor is configured to have a first gate electrode and a second gate electrode commonly connected to the word line; and the second transfer transistor is configured to have a first gate electrode and a second gate electrode commonly connected to the word line.

14. The semiconductor memory of claim 10, wherein both the first transfer transistor and the second transfer transistor are configured by a separated-gate type double-gate field effect transistor comprising a first gate electrode and a second gate electrode, controlling a voltage for the first gate electrode to form a channel, and making the second gate electrode electrically floating.

15. The semiconductor memory claim 10, wherein the first gate electrode of the first driver transistor is connected to the input of the first inverter and the second gate electrode of the first driver transistor is connected to a first threshold voltage control line; and the first gate electrode of the second driver transistor is connected to the input of the second inverter and the second gate electrode of the second driver transistor is connected to a second threshold voltage control line.

16. The semiconductor memory of claim 15, wherein the first and the second threshold voltage control lines are located substantially orthogonal to the word line.

17. The semiconductor memory of claim 16, wherein the first and the second threshold voltage control lines are usually shared with static random access memory cells adjacently disposed in the direction elongating with the word line.

* * * * *